US010236295B2

(12) United States Patent
Lee et al.

(10) Patent No.: US 10,236,295 B2
(45) Date of Patent: Mar. 19, 2019

(54) METHOD OF FABRICATING SEMICONDUCTOR DEVICE USING DRY ETCHING

(71) Applicant: Samsung Electronics Co., Ltd., Suwon-si, Gyeonggi-do (KR)

(72) Inventors: Chanmin Lee, Hwaseong-si (KR); Youngjae Kim, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/486,861

(22) Filed: Apr. 13, 2017

(65) Prior Publication Data

US 2017/0301569 A1    Oct. 19, 2017

(30) Foreign Application Priority Data

Apr. 15, 2016   (KR) .................. 10-2016-0046488

(51) Int. Cl.
*H01L 27/108* (2006.01)
*H01L 21/762* (2006.01)
(Continued)

(52) U.S. Cl.
CPC .... *H01L 27/10888* (2013.01); *H01L 21/6831* (2013.01); *H01L 21/76224* (2013.01); *H01L 21/76883* (2013.01); *H01L 27/10814* (2013.01); *H01L 27/10885* (2013.01); *H01L 27/10891* (2013.01)

(58) Field of Classification Search
CPC .......... H01L 21/31116; H01L 21/3065; H01L 21/0337; H01L 21/67069; H01L 29/7869; H01L 2924/00014; H01L 21/31138; H01L 21/31144
See application file for complete search history.

(56) References Cited

U.S. PATENT DOCUMENTS 7,754,592 B2    7/2010   Jung
8,071,441 B2   12/2011   Keller
(Continued)

FOREIGN PATENT DOCUMENTS

JP    2015-053447    3/2015
KR    10-0919675     9/2009
(Continued)

*Primary Examiner* — Tony Tran
(74) *Attorney, Agent, or Firm* — F. Chau & Associates, LLC

(57) ABSTRACT

A method of fabricating a semiconductor device includes forming a material layer and a mask pattern on a substrate, mounting the substrate onto an electrostatic chuck, loading the substrate, including the material layer and the mask pattern, mounted on the electrostatic chuck, into an etching chamber, and forming a material pattern by dry etching the material layer using the mask pattern as an etching mask. The dry etching of the material layer includes adjusting a pressure of the etching chamber to adjust a lateral over-etch of the material pattern in a first direction, wherein the first direction is parallel to a surface of the substrate facing the material pattern, and adjusting a temperature of the electrostatic chuck to adjust an etching of the material pattern in a second direction, wherein the second direction crosses the first direction.

11 Claims, 80 Drawing Sheets

(51) Int. Cl.
*H01L 21/768* (2006.01)
*H01L 21/683* (2006.01)

(56) References Cited

U.S. PATENT DOCUMENTS

| | | | |
|---|---|---|---|
| 8,319,264 B2 | 11/2012 | Kim | |
| 9,048,182 B2 | 6/2015 | Nishizuka et al. | |
| 9,082,827 B2 | 7/2015 | Yu et al. | |
| 9,159,730 B2 * | 10/2015 | Kim | H01L 27/10855 |
| 2014/0353744 A1 | 12/2014 | Jung et al. | |
| 2015/0140828 A1 | 5/2015 | Urakawa | |
| 2015/0221548 A1 | 8/2015 | Yu et al. | |
| 2016/0190140 A1 * | 6/2016 | Basker | H01L 27/10829 |
| | | | 257/532 |
| 2016/0225903 A1 * | 8/2016 | Li | H01L 29/7848 |

FOREIGN PATENT DOCUMENTS

| | | |
|---|---|---|
| KR | 10-2009-0106159 | 10/2009 |
| KR | 10-1140093 | 4/2012 |
| KR | 10-2014-0028910 | 3/2014 |
| KR | 10-2014-0141344 | 12/2014 |
| KR | 10-2015-0024307 | 3/2015 |

\* cited by examiner

METHOD OF FABRICATING SEMICONDUCTOR DEVICE USING DRY ETCHING

CROSS-REFERENCE TO RELATED APPLICATION

This application claims priority under 35 U.S.C. § 119 to Korean Patent Application No. 10-2016-0046488, filed on Apr. 15, 2016, in the Korean Intellectual Property Office, the disclosure of which is incorporated by reference herein in its entirety.

TECHNICAL FIELD

The inventive concept relates to a semiconductor device, and more particularly, to a method of fabricating a semiconductor device using dry etching.

DISCUSSION OF THE RELATED ART

Recently, sizes of semiconductor devices and the patterns included therein have been decreasing. These patterns are generally formed using photolithography processes.

SUMMARY

The inventive concept relates to a method of fabricating a semiconductor device, the method allowing a fine material pattern to be formed even though a photolithography process margin is low.

According to an exemplary embodiment of the inventive concept, a method of fabricating a semiconductor device includes forming a material layer and a mask pattern on a substrate, mounting the substrate onto an electrostatic chuck, loading the substrate, including the material layer and the mask pattern, mounted on the electrostatic chuck, into an etching chamber, and forming a material pattern by dry etching the material layer using the mask pattern as an etching mask. The dry etching of the material layer includes adjusting a pressure of the etching chamber to adjust a lateral over-etch of the material pattern in a first direction, wherein the first direction is parallel to a surface of the substrate facing the material pattern, and adjusting a temperature of the electrostatic chuck to adjust an etching of the material pattern in a second direction, wherein the second direction crosses the first direction.

According to an exemplary embodiment of the inventive concept, a method of fabricating a semiconductor device includes forming a plurality of word lines on a substrate, wherein the plurality of word lines extend in a first direction and the plurality of word lines are spaced apart from each other in a second direction that crosses the first direction, forming a plurality of direct contact holes in the substrate, wherein at least one of the plurality of direct contact holes is disposed between two neighboring word lines of the plurality of word lines, wherein each of the plurality of direct contact holes are spaced apart from each other, wherein a first direct contact hole and a second direct contact hole of the plurality of direct contact holes are disposed along the first direction, and the first direct contact hole and a third direct contact hole of the plurality of direct contact holes are disposed along the second direction, forming a polysilicon layer filling the direct contact holes, forming a wiring layer and a mask pattern on the polysilicon layer, loading the substrate including the polysilicon layer and the mask pattern onto an electrostatic chuck in an etching chamber, and forming a plurality of direct contacts and a plurality of bit lines by dry etching the wiring layer and the polysilicon layer by using the mask pattern as an etching mask, wherein each the plurality of direct contacts fills one direct contact hole of the plurality of direct contact holes, and wherein at least one of the plurality of bit lines has a width along the first direction and a length along the second direction, the width being shorter than the length. The dry-etching of the wiring layer and the polysilicon layer includes adjusting a pressure of the etching chamber to adjust an over-etch of each of the plurality of direct contacts in the first and second directions, wherein the first and second directions are parallel to a surface of the substrate that faces the plurality of word lines, and adjusting a temperature of the electrostatic chuck to adjust an etching of each of the plurality of direct contacts in a third direction that crosses of the first and second directions.

According to an exemplary embodiment of the inventive concept, a method of fabricating a semiconductor device includes forming a mask pattern and material layer on a substrate, wherein the material layer is disposed between the mask pattern and the substrate, loading the substrate onto an electrostatic chuck in an etching chamber, and forming a first material pattern and a second material pattern by dry etching the material layer using the mask pattern as an etching mask. The dry etching of the material layer includes inserting at least two different types of gases in the etching chamber and setting a temperature of the electrostatic chuck to a first temperature, and setting a pressure of the etching chamber to a first pressure, the etching chamber including the at least two different types of gases. The first pressure and the first temperature are set such that the first material pattern has a substantially constant width along a first direction, the first direction being substantially parallel to a surface of the substrate facing the first material pattern. The first material pattern is separated from the second material pattern along the first direction.

BRIEF DESCRIPTION OF THE DRAWINGS

The above and other features of the inventive concept will become more apparent by describing in detail exemplary embodiments thereof in conjunction to the accompanying drawings, in which.

DETAILED DESCRIPTION OF THE EMBODIMENTS

Figure 1:
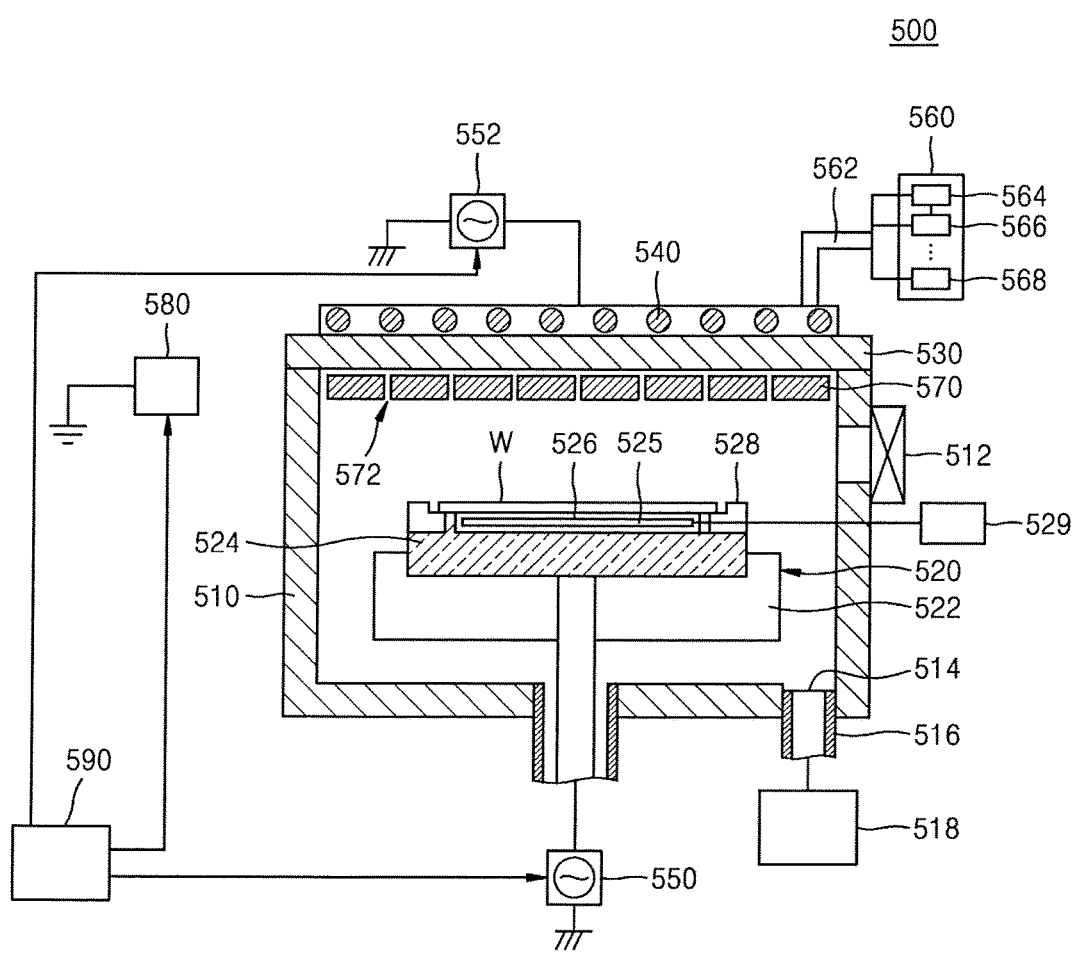
FIG. 1 is a diagram of an etching apparatus used to manufacture a semiconductor device, according to an exemplary embodiment of the inventive concept.

Like reference numerals may refer to like elements throughout the specification. In the drawings, the sizes and/or proportions of elements, layers, and/or regions may be exaggerated for clarity. When referring to an element the singular form, the referral in the singular form may also encompass the plural form of the element.

When an exemplary embodiment of the inventive concept may be implemented differently, a process order may be performed differently from the described order. For example, two consecutively described processes may be performed substantially at the same time or performed in an order opposite to the described order.

FIG. 1 is a diagram of an etching apparatus used to manufacture a semiconductor device, according to an exemplary embodiment of the inventive concept.

According to an exemplary embodiment of the inventive concept, an etching apparatus 500 may be a dry etching apparatus. The etching apparatus 500 may use dry etching processes to fabricate a semiconductor device. The etching apparatus 500 may be a plasma etching apparatus that uses plasma to perform the etching. For example, the etching apparatus 500 may be an inductively coupled plasma (ICP) etching apparatus. An ICP etching apparatus 500 will be described below in detail. The ICP etching apparatus 500 may perform an etching process by generating plasma from an etching gas by using an electromagnetic field induced by a coil-type antenna, the etching gas being jetted from a gas nozzle. Radio frequency (RF) power, applied to the coil-type antenna, may be delivered to the etching gas through a dielectric plate.

Although an ICP etching apparatus may be described in detail hereinafter, the inventive concept may be applied to other types of etching apparatuses, for example, to a capacitively coupled plasma (CCP) etching apparatus. A CCP etching apparatus may perform an etching process by generating plasma from an etching gas by using an RF electric field formed between two chucks that face each other, and the etching gas may be jetted from a dielectric window. The RF electric field may be generated by applying RF power to the chucks.

The etching apparatus 500 may include an etching chamber 510, a substrate stage 520 including a bottom electrode 524 disposed thereon, a top electrode 540, a conductive shield member 570, and a shield power supply 580. The etching chamber 510 may include a sealed space for performing a plasma treatment process on a substrate W. The substrate W may include, for example, a wafer. The substrate W may be a semiconductor substrate, for example, a silicon substrate. The substrate W may be referred to below as a substrate 602 (W), a substrate 10 and a substrate 110.

The substrate stage 520, supporting the substrate W, may be disposed in the etching chamber 510. For example, the substrate stage 520 may include the bottom electrode 524, as a susceptor, for supporting the substrate W. The bottom electrode 524 may have a circular plate shape. The bottom electrode 524 may be moved up and down by a support member 522.

An exhaust port 514 may be disposed on a lower portion of the etching chamber 510, and an exhaust unit 518 may be connected to the exhaust port 514 through an exhaust pipe 516. The exhaust unit 518 may include a vacuum pump such as a turbo-molecular pump to adjust (e.g., change or set) the pressure in the etching chamber 510 to a desired pressure level (e.g., to a desired vacuum level). For example, the exhaust unit 518 may adjust a pressure of the etching chamber 510. A gate 512 for the entry and exit of the substrate W may be disposed in a sidewall of the etching chamber 510.

An electrostatic chuck 526 for sucking the substrate W may be mounted on an upper surface of the bottom electrode 524. The electrostatic chuck 526 may include a sheet-shaped or mesh-shaped conductor inside of a dielectric layer. The conductor may suck and hold the substrate W by using a direct current (DC) voltage supplied by a DC power supply. A heater 525 for heating the substrate W may be mounted inside of the electrostatic chuck 526. The heater 525 may be connected to a heater adjusting unit 529. A temperature of the substrate W on the electrostatic chuck 526 may be adjusted by adjusting the heat generated from the heater 525 through the heater adjusting unit 529. The substrate W may be loaded onto the upper surface of the bottom electrode 524, and a focus ring 528 may be mounted around the substrate W. The bottom electrode 524 may have a diameter that is greater than a diameter of the substrate W. The bottom electrode 524 may have a circulation channel therein for cooling the bottom electrode 524. For a precise regulation of the temperature of the substrate W, a cooling gas such as helium (He) gas may be supplied and/or circulated between the electrostatic chuck 526 and the substrate W.

A window 530 may be disposed in an upper portion of the etching chamber 510. The window 530 may fully or partially constitute the upper portion of the etching chamber 510. The window 530 may include an insulating material such as alumina ($Al_2O_3$). The etching apparatus 500 may further include a gas supplying unit 560. A process gas may be supplied from the gas supplying unit 560 into the etching chamber 510 through a gas supplying pipe 562.

The gas supplying unit 560 may include a main etching gas supplying unit 564 supplying a main etching gas that is used for etching a material layer on the substrate W, an auxiliary etching gas supplying unit 566 supplying an auxiliary etching gas for etching the material layer on the substrate W, and an inert gas supplying unit 568 for adjusting concentrations of the main etching gas and the auxiliary etching gas in the etching chamber 510. The gas supplying unit 560 may adjust the concentrations of the main etching gas and the auxiliary etching gas with respect to the inert gas.

The top electrode 540 may be disposed outside of the etching chamber 510 and may face the bottom electrode 524, with the window 530 being disposed between the top electrode 540 and the bottom electrode 524. The top electrode 540 may include an RF antenna. The RF antenna may be an inductively coupled antenna. The etching apparatus 500 may further include a first RF power supply 550 applying a first RF signal to the bottom electrode 524, and a second RF power supply 552 applying a second RF signal to the top electrode 540.

The first RF power supply 550 may include a first RF power source and a first matcher. The second RF power supply 552 may include a second RF power source and a second matcher. The etching apparatus 500 may include a controller 590 for controlling the first and second RF power supplies 550 and 552. The controller 590 may include a microcomputer and various interfaces, and may control operations of a plasma processing apparatus according to programs and information stored in an external or internal memory accessible by the microcomputer.

The first RF power supply 550 may apply the first RF signal to the bottom electrode 524. The second RF power supply 552 may apply the second RF signal to the top electrode 540. The first and second RF signals may have a predetermined frequency (for example, 13.56 MHz).

The conductive shield member 570 may be mounted inside the etching chamber 510 to cover the window 530. The conductive shield member 570 may have a shape corresponding to a shape of the window 530. For example, when the window 530 has a circular plate shape, the conductive shield member 570 may have a circular plate shape.

The shield power supply 580 may apply a shield signal to the conductive shield member 570. The shield signal may include an alternative current (AC) power or a DC power. If the AC power or the DC power is applied to the conductive shield member 570, an electric field may be generated in the conductive shield member 570. The conductive shield member 570 may include a plurality of slits 572 for passing a magnetic field generated by the top electrode 540. The conductive shield member 570 may include a metal such as aluminum.

Figure 2:
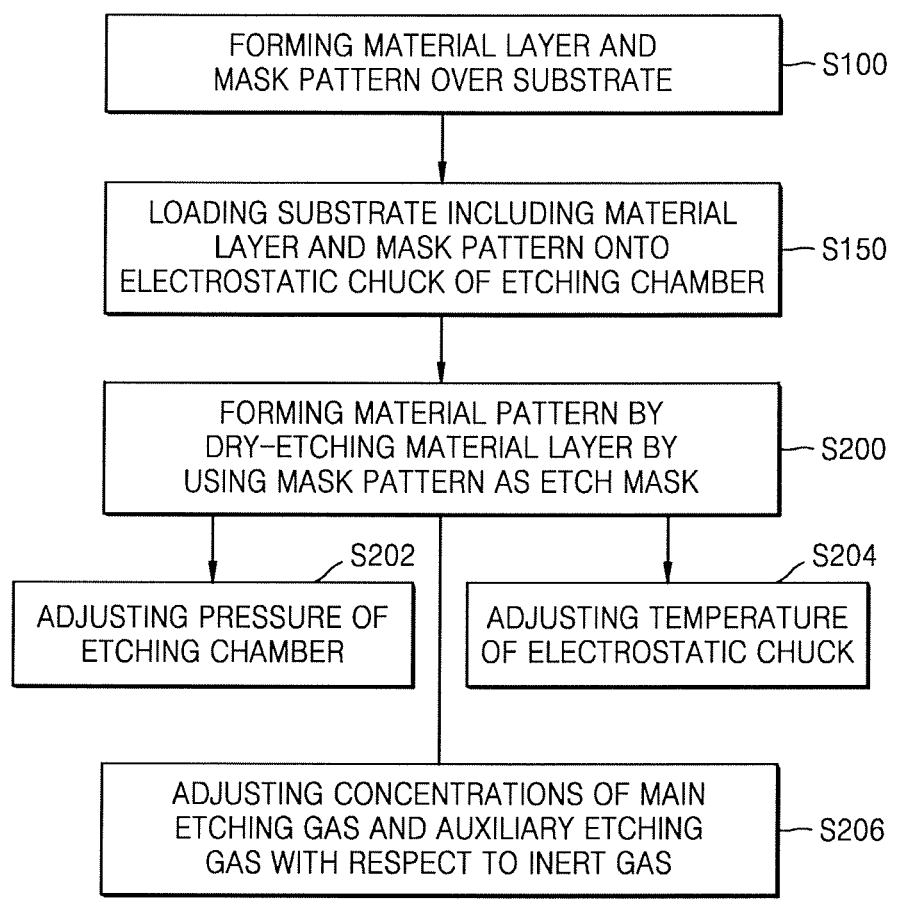
FIG. 2 is a flowchart of a method of fabricating a semiconductor device using the etching apparatus of FIG. 1, according to an exemplary embodiment of the inventive concept.
Figure 3A:
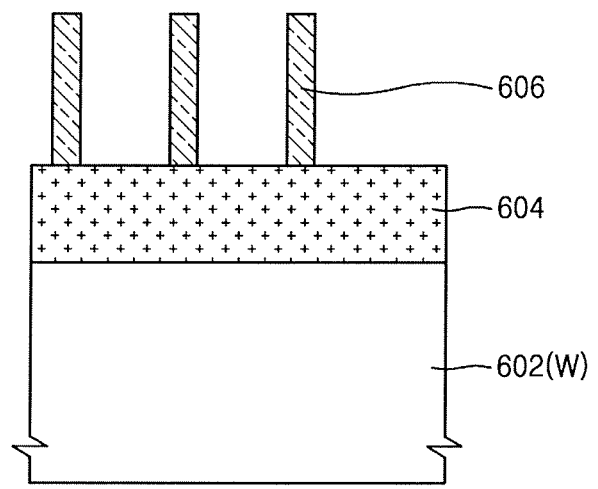
FIGS. 3A and 3B are cross-sectional views illustrating the method of FIG. 2, according to an exemplary embodiment of the inventive concept.
Figure 3B:
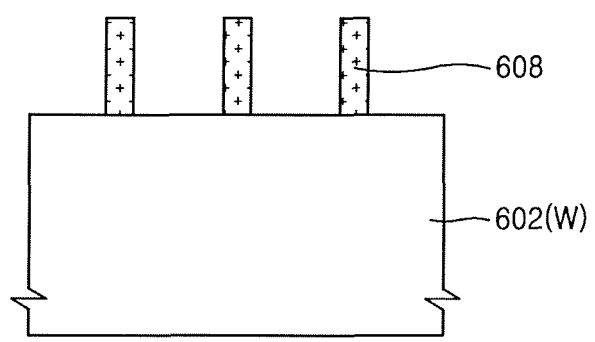

FIG. 2 is a flowchart of a method of fabricating a semiconductor device using the etching apparatus of FIG. 1, according to an exemplary embodiment of the inventive concept. FIGS. 3A and 3B are cross-sectional views illustrating the method of FIG. 2, according to an exemplary embodiment of the inventive concept.

Referring to FIGS. 2, 3A and 3B, a method of fabricating a semiconductor device includes forming a material layer 604 and a mask pattern 606 on a substrate 602 (W) (S100). As shown in FIG. 3A, the material layer 604 is formed over the substrate 602 (W) (e.g., the substrate W of FIG. 1), followed by forming the mask pattern 606 on the material layer 604. The substrate 602 (W) may be a wafer. The substrate 602 (W) may be a semiconductor substrate, for example, a silicon substrate.

The material layer 604 may be a metal layer, a polysilicon layer, or an insulating layer, which is used for a semiconductor layer. Although the material layer 604 is shown as being directly formed on the substrate 602 (W) in FIG. 3A, another layer, for example, an insulating layer may be formed between the substrate 602 (W) and the material layer 604. The mask pattern 606 may be a photoresist pattern or an insulating pattern.

The method of fabricating a semiconductor device includes loading the substrate 602 (W), including the material layer 604 and the mask pattern 606, onto the electrostatic chuck 526 of the etching chamber 510 of FIG. 1 (S150). For example, the substrate 602, including the material layer 604 and the mask pattern 606, may be disposed on the electrostatic chuck 526 in the etching chamber 510 of FIG. 1.

The method of fabricating a semiconductor device includes forming a material pattern 608 by dry-etching the material layer 604, using the mask pattern 606 as an etch mask (S200). As shown in FIGS. 3A and 3B, the material layer 604 is dry-etched by using the mask pattern 606 as an etch mask to form the material pattern 608 on the substrate 602 (W). The material pattern 608 may be an insulating pattern, a metal pattern, or a polysilicon pattern. When the material pattern 608 is a metal pattern or a polysilicon pattern, the material pattern 608 may be a conductive layer used as, for example, a gate electrode.

Referring to FIG. 2, the dry-etching of the material layer 604 by using the mask pattern 606 as an etch mask may include adjusting the pressure of the etching chamber 510 of FIG. 1 (S202), and adjusting the temperature of the electrostatic chuck 526 of FIG. 1 (S204). The adjustment of the pressure of the etching chamber 510 of FIG. 1 may be performed for adjusting the lateral over-etch of the material pattern 608 in horizontal directions, for example, in X-axis and Y-axis directions, with respect to the substrate 602 (W). The adjustment of the pressure of the etching chamber 510 of FIG. 1 may be performed by using the exhaust unit 518 of FIG. 1, as described above. When the material layer 604 is dry-etched, the pressure of the etching chamber 510 of FIG. 1 may be set (e.g., adjusted) to about 30 mTorr to about 100 mTorr to adjust the lateral over-etch. The lateral over-etch will be further described below. For example, the adjustment of the pressure of the etching chamber 510 may include setting the pressure of the etching chamber 510 to a pressure of about 30 mTorr to about 100 mTorr.

The adjustment of the temperature of the electrostatic chuck 526 of FIG. 1 may be performed for adjusting the etching of the material pattern 608 in a vertical direction with respect to the substrate 602 (W), for example, in a Z-axis direction. The Z-axis direction may be perpendicular to the X-axis direction and the Y-axis direction. The adjustment of the temperature of the electrostatic chuck 526 of FIG. 1 may be performed by using the heater 525 and the heater adjusting unit 529, as described above. When the material layer 604 is dry-etched, the temperature of the electrostatic chuck 526 of FIG. 1 may be adjusted to about 40° C. to about 90° C. to adjust the etching of the of the material pattern 608. The adjustment of the etching of the material pattern 608 will be further described below. The adjustment of the temperature of the electrostatic chuck 526 may include setting the temperature of the electrostatic chuck 526 from about 40° C. to about 90° C.

When the pressure of the etching chamber 510 of FIG. 1 is adjusted and the temperature of the electrostatic chuck 526 of FIG. 1 is adjusted, as described above, the material pattern 608 may be formed to have a constant width, as shown in FIG. 3B. For example, the material pattern 608 of FIG. 3B may have a uniform critical dimension (CD) in upper and lower portions thereof.

An etching gas used for the dry-etching of the material layer 604 may include a main etching gas, an auxiliary etching gas, and an inert gas. The main etching gas may be used for etching the material layer 604 on the substrate 602 (W). The main etching gas may be a gas reacting with the material layer 604, for example, with a polysilicon layer.

The auxiliary etching gas may also be used for etching the material layer 604 on the substrate 602 (W). The auxiliary etching gas may be a gas for protecting a side surface of a pattern formed by the etching of the material layer 604, for example, a gas for protecting a side surface of a polysilicon pattern formed by etching a polysilicon layer. The inert gas may be used for adjusting concentrations of the main etching gas and the auxiliary etching gas in the etching chamber 510.

When the material layer 604 is a nitride layer, which may be used as an insulating layer, the main etching gas may include carbon fluoride ($CF_4$), fluoromethane ($CHF_3$), and/or combinations thereof. When the material layer 604 is a metal layer, for example, a tungsten layer, the main etching gas may include nitrogen fluoride ($NF_3$), chlorine ($Cl_2$), and/or combinations thereof. When the material layer 604 is a polysilicon layer, the main etching gas may include hydrogen bromide (HBr), chlorine ($Cl_2$), and/or combinations thereof.

The auxiliary etching gas used for etching a nitride layer, a metal layer, and a polysilicon layer may include nitrogen ($N_2$), oxygen ($O_2$), and/or combinations thereof. The inert gas may include helium (He) or argon (Ar).

As shown in FIG. 2, the dry-etching of the material layer 604, by using the mask pattern 606 as an etch mask, may include adjusting the concentrations of the main etching gas and the auxiliary etching gas with respect to the inert gas flowing in the etching chamber 510 of FIG. 1 (S206).

For example, when the material layer 604 is dry-etched, a flow rate of the inert gas may range from about 350 standard cubic centimeters per minute (sccm) to about 600 sccm, and a flow rate of the main etching gas may range from about 175 sccm to about 660 sccm. Thus, when the material layer 604 is dry-etched, a ratio of the main etching gas to the inert gas may be adjusted to be about 0.5 to about 1.1.

As described above, the gas supplying unit 560 may adjust the concentrations of the main etching gas and the auxiliary etching gas with respect to the inert gas. When the concentrations of the main etching gas and the auxiliary etching gas, with respect to the inert gas, flowing in the etching chamber 510 of FIG. 1 are adjusted as described above, the material pattern 608 having a width that is more constant, for example, a width that varies little along the Z-axis direction, (for example, a more constant critical dimension) may be formed.

Figure 4A:
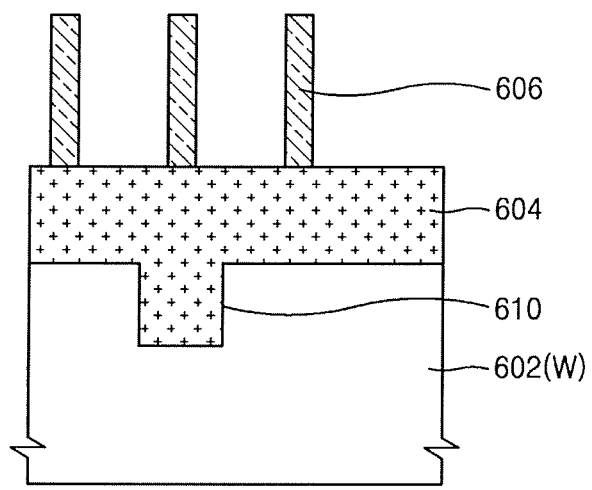
FIGS. 4A and 4B are cross-sectional views illustrating a method of fabricating a semiconductor device, according to an exemplary embodiment of the inventive concept.
Figure 4A:
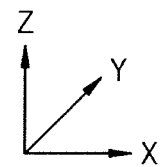
Figure 4B:
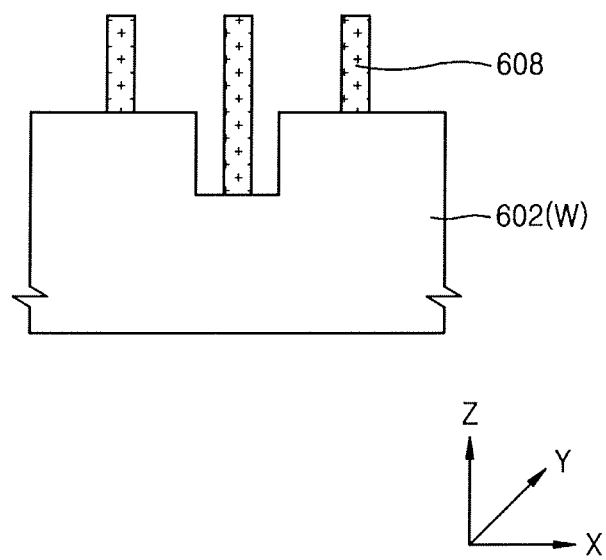

FIGS. 4A and 4B are cross-sectional views illustrating a method of fabricating a semiconductor device, according to an exemplary embodiment of the inventive concept.

The method of FIGS. 4A and 4B may be similar to the method of fabricating the semiconductor device according to FIGS. 2, 3A, and 3B, except that the method of FIGS. 4A and 4B includes forming a contact hole 610 in the substrate 602 (W) and filling the contact hole 610 with the material layer 604.

As shown in FIG. 4A, the contact hole 610 may be formed in the substrate 602 (W). The contact hole 610 may be formed by partially etching a portion of a surface of the substrate 602 (W). Then, the material layer 604 may be formed on the substrate 602 (W), and the material layer 604 may fill the contact hole 610. The material layer 604 may be formed in the contact hole 610. Then, the mask pattern 606 may be formed on the material layer 604.

Then, the substrate 602 (W), including the material layer 604 and the mask pattern 606, may be loaded onto the electrostatic chuck 526 of the etching chamber 510 of FIG. 1. As shown in FIGS. 4A and 4B, the material layer 604, filling the contact hole 610, may be dry-etched by using the mask pattern 606 as an etch mask. Accordingly, the material pattern 608 may be formed. As shown in FIG. 4B, the material pattern 608 may be formed on the substrate 602 (W). The material pattern 608 may be formed to contact a bottom of the contact hole 610 and to be spaced apart from a sidewall of the contact hole 610. The material pattern 608 may be an insulating pattern, a metal pattern, or a polysilicon pattern. The material pattern 608 may be a conductive layer used, for example, as a bit line.

As shown in FIG. 2, the dry-etching of the material layer 604, by using the mask pattern 606 as an etch mask, may include adjusting the pressure of the etching chamber 510 of FIG. 1 (S202), and adjusting the temperature of the electrostatic chuck 526 of FIG. 1 (S204).

As shown in FIG. 2, the dry-etching of the material layer 604, by using the mask pattern 606 as an etch mask, may further include adjusting the concentrations of the main etching gas and the auxiliary etching gas with respect to the inert gas flowing in the etching chamber 510 of FIG. 1 (S206). Through the processes described above, the material pattern 608 having a constant width (e.g., a critical dimension) may be formed in the contact hole 610 and on the substrate 602.

Figure 5A:
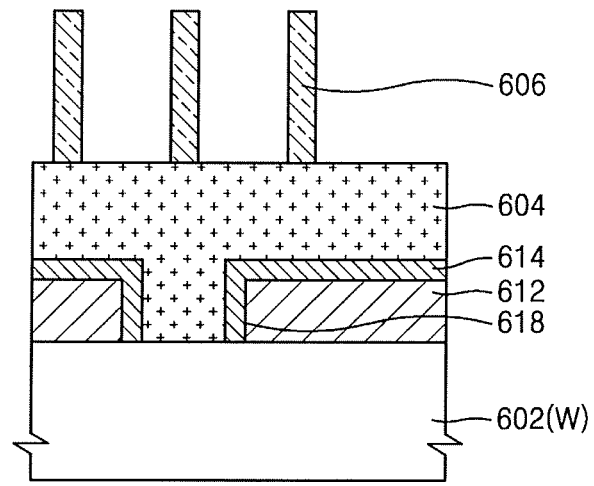
FIGS. 5A and 5B are cross-sectional views illustrating a method of fabricating a semiconductor device, according to an exemplary embodiment of the inventive concept.
Figure 5A:
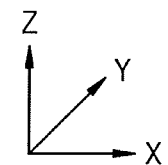
Figure 5B:
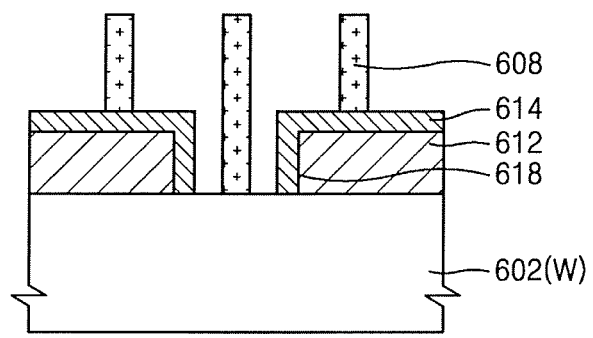
Figure 5B:
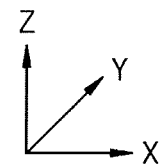

FIGS. 5A and 5B are cross-sectional views illustrating a method of fabricating a semiconductor device, according to an exemplary embodiment of the inventive concept.

The method of FIGS. 5A and 5B may be similar to the method of fabricating the semiconductor device according to FIGS. 2, 3A, and 3B, except that the method of FIGS. 5A and 5B includes forming isolation trench(es) 618 in the substrate 602 (W), forming active patterns 612, forming an isolation insulating layer 614 in the isolation trench(es) 618, the boundaries of the active patterns 612 corresponding to the isolation insulating layer 614 in the isolation trench(es) 618, and filling the isolation trench(es) 618 with the material layer 604.

As shown in FIG. 5A, the isolation trench 618 may be formed in the substrate 602 (W). The isolation trench 618 may be formed by partially etching a portion of a surface of the substrate 602 (W). Then, the isolation insulating layer 614 may be formed in the isolation trench 618 and on the substrate 602 (W). Accordingly, the active patterns 612 may be formed. The boundaries of the active patterns 612 correspond to the isolation insulating layer 614 in the isolation the trenches 618. Then, the material layer 604 may be formed on the isolation insulating layer 614, and the material layer 604 may fill the isolation trenches 618. The material layer 604 may be formed in the isolation trenches 618 and on the isolation insulating layer 614. Then, the mask pattern 606 may be formed on the material layer 604.

Then, the substrate 602 (W), including the material layer 604 and the mask pattern 606, may be loaded onto the electrostatic chuck 526 of the etching chamber 510 of FIG. 1. As shown in FIGS. 5A and 5B, the material layer 604, filling the isolation trench 618, is dry-etched by using the mask pattern 606 as an etch mask. Accordingly, the material pattern 608 may be formed.

As shown in FIG. 5B, the material pattern 608 may be formed on the isolation insulating layer 614 and may be formed to contact a bottom of the isolation trench 618 and to be spaced apart from a sidewall of the isolation trench 618. The material pattern 608 may be an insulating pattern, a metal pattern, or a polysilicon pattern.

As shown in FIG. 2, the dry-etching of the material layer 604, by using the mask pattern 606 as an etch mask, may include adjusting the pressure of the etching chamber 510 of FIG. 1 (S202), and adjusting the temperature of the electrostatic chuck 526 of FIG. 1 (S204).

As shown in FIG. 2, the dry-etching of the material layer 604, by using the mask pattern 606 as an etch mask, may further include adjusting the concentrations of the main etching gas and the auxiliary etching gas with respect to the inert gas flowing in the etching chamber 510 of FIG. 1 (S206). Through the processes described above, the material pattern 608 having a constant width may be formed in the isolation trench 618 and on the isolation insulating layer 614.

Figure 6A:
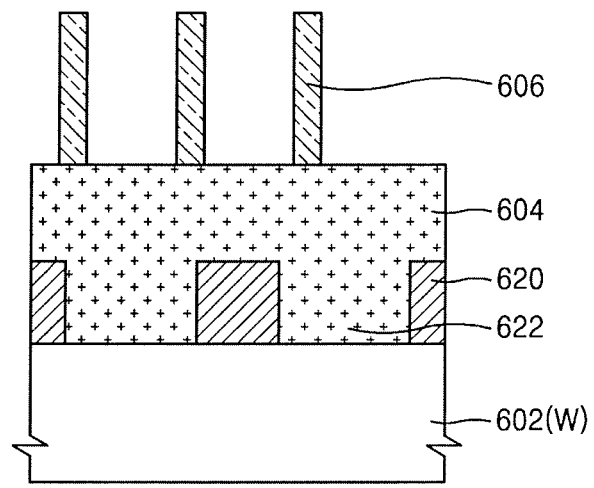
FIGS. 6A and 6B are cross-sectional views illustrating a method of fabricating a semiconductor device, according to an exemplary embodiment of the inventive concept.
Figure 6B:
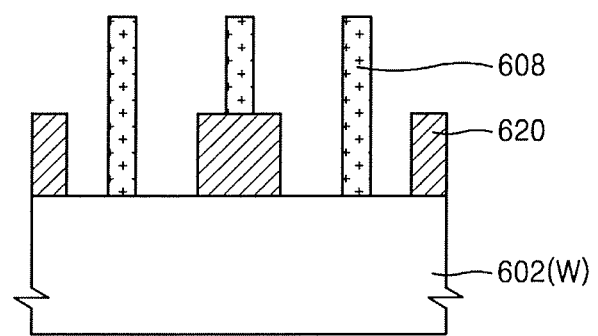

FIGS. 6A and 6B are cross-sectional views illustrating a method of fabricating a semiconductor device, according to an exemplary embodiment of the inventive concept.

The method of FIGS. 6A and 6B may be similar to the method of fabricating the semiconductor device according to FIGS. 2, 3A, and 3B, except that the method of FIGS. 6A and 6B includes forming a plurality of patterns 620 on the substrate 602 (W), forming pattern holes 622 between the patterns 620, and filling the pattern holes 622 with the material layer 604.

As shown in FIG. 6A, the plurality of patterns 620 may be formed on the substrate 602, and the pattern holes 622 may be formed between the patterns 620. Each of the pattern holes 622 may be disposed, for example, between two neighboring patterns 620. The patterns 620 may be various patterns used for fabricating a semiconductor device, for example, insulating patterns or conductive patterns. Then, the material layer 604 may be formed on the substrate 602 (W) and may fill the pattern holes 622. Then, the mask pattern 606 may be formed on the material layer 604.

Then, the substrate 602 (W), including the material layer 604 and the mask pattern 606, may be loaded onto the electrostatic chuck 526 of the etching chamber 510 of FIG. 1. As shown in FIGS. 6A and 6B, the material layer 604, filling the pattern holes 622, is dry-etched by using the mask pattern 606 as an etch mask. Accordingly, the material pattern 608 may be formed.

As shown in FIG. 6B, the material patterns 608 may be formed on the substrate 602 (W) and each of the material patterns 608 may be formed to contact a bottom of a corresponding pattern hole 622. In addition, each of the material patterns 608 may be spaced apart from a sidewall of a corresponding pattern hole 622. The material pattern 608 may be an insulating pattern, a metal pattern, or a polysilicon pattern.

As shown in FIG. 2, the dry-etching of the material layer 604, by using the mask pattern 606 as an etch mask, may include adjusting the pressure of the etching chamber 510 of FIG. 1 (S202), and adjusting the temperature of the electrostatic chuck 526 of FIG. 1 (S204).

As shown in FIG. 2, the dry-etching of the material layer 604, by using the mask pattern 606 as an etch mask, may further include adjusting the concentrations of the main etching gas and the auxiliary etching gas with respect to the inert gas flowing in the etching chamber 510 of FIG. 1 (S206). Through the processes described above, the material pattern 608 having a constant width may be formed in the pattern holes 622 and on the substrate 602 (W).

Figure 7:
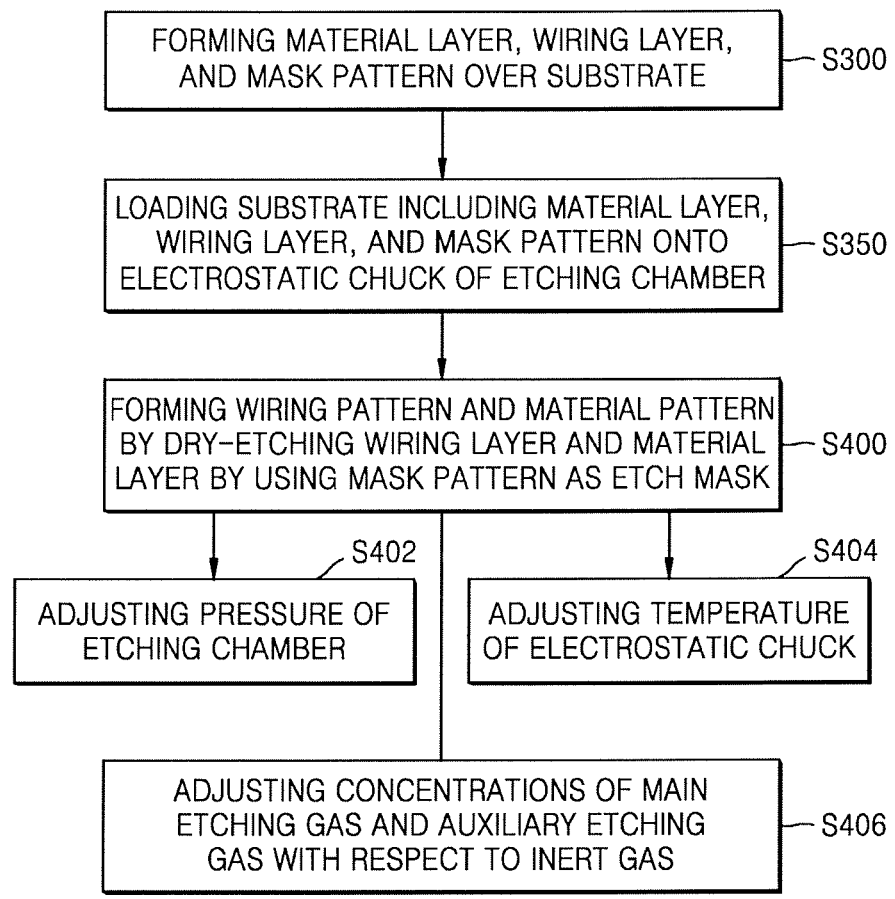
FIG. 7 is a flowchart illustrating a method of fabricating a semiconductor device by using the etching apparatus of FIG. 1, according to an exemplary embodiment of the inventive concept.
Figure 8A:
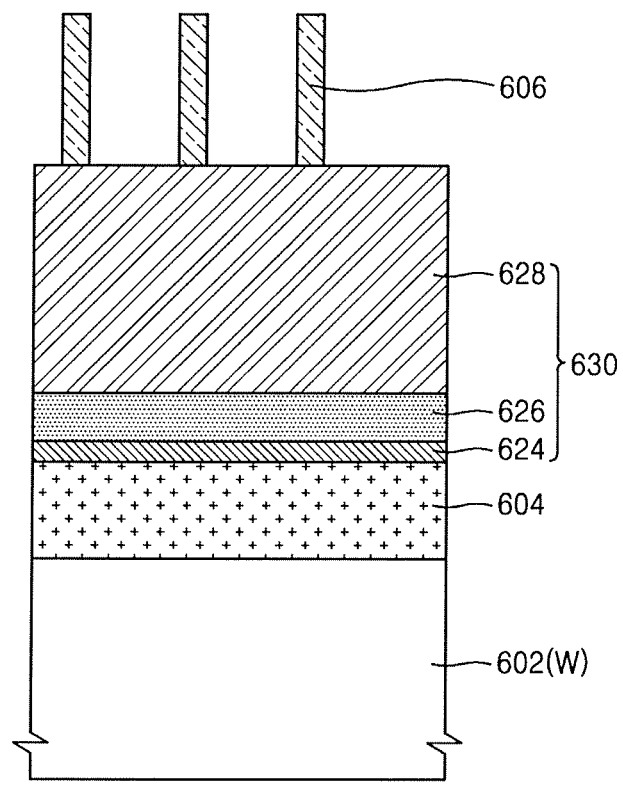
FIGS. 8A and 8B are cross-sectional views illustrating the method of FIG. 7, according to an exemplary embodiment of the inventive concept.
Figure 8B:
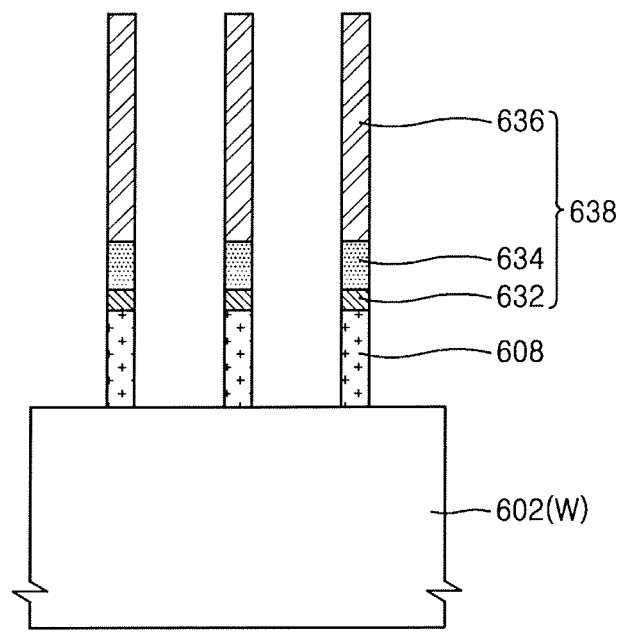

FIG. 7 is a flowchart illustrating a method of fabricating a semiconductor device by using the etching apparatus of FIG. 1, according to an exemplary embodiment of the inventive concept. FIGS. 8A and 8B are cross-sectional views illustrating the method of FIG. 7, according to an exemplary embodiment of the inventive concept.

The method of FIGS. 8A and 8B may be similar to the method of fabricating the semiconductor device according to FIGS. 2, 3A, and 3B, except that the method of FIGS. 8A and 8B includes forming a wiring layer 630 on the substrate 602 (W).

The method of FIGS. 8A and 8B may include forming the material layer 604, a wiring layer 630, and the mask pattern 606 over the substrate 602 (W) (S300). As shown in FIG. 8A, the material layer 604 and the wiring layer 630 are formed on the substrate 602, followed by forming the mask pattern 606 on the wiring layer 630. Although the material layer 604 is shown as being directly formed on the substrate 602 (W) in FIG. 8A, another layer, for example, an insulating layer may be formed between the substrate 602 (W) and the material layer 604.

The wiring layer 630 may include a barrier metal layer 624, a metal layer 626, and a capping layer 628. The barrier metal layer 624 and the capping layer 628, for example, might be omitted. The barrier metal layer 624 may include a titanium nitride layer or a tungsten nitride layer. The metal layer 626 may include a tungsten layer. The capping layer 628 may include a nitride layer.

The method of FIGS. 8A and 8B may include loading the substrate 602 (W), including the material layer 604, the wiring layer 630, and the mask pattern 606 onto the electrostatic chuck 526 of the etching chamber 510 of FIG. 1 (S350). For example, the substrate 602 including the material layer 604, the wiring layer 630, and the mask pattern 606 may be disposed on the electrostatic chuck 526 of FIG. 1 in the etching chamber 510 of FIG. 1.

The method of FIGS. 8A and 8B may include forming a wiring pattern 638 and the material pattern 608 by dry-etching the wiring layer 630 and the material layer 604 by using the mask pattern 606 as an etch mask (S400).

As shown in FIGS. 8A and 8B, the wiring layer 630 and the material layer 604 are etched by using the mask pattern 606 as an etch mask to form the wiring pattern 638 and the material pattern 608 on the substrate 602 (W). The wiring pattern 638 may include a barrier metal pattern 632, a metal pattern 634, and a capping pattern 636. The material pattern 608 may be an insulating pattern, a metal pattern, or a polysilicon pattern.

As shown in FIG. 7, the dry-etching of the wiring layer 630 and the material layer 604 by using the mask pattern 606 as an etch mask may include adjusting the pressure of the etching chamber 510 of FIG. 1 (S402), and adjusting the temperature of the electrostatic chuck 526 of FIG. 1 (S404). The adjusting of the pressure of the etching chamber 510 of FIG. 1 (S402) may be the same as operation S202 of FIG. 2. The adjusting of the temperature of the electrostatic chuck 526 of FIG. 1 (S404) may be the same as operation S204 of FIG. 2.

When the pressure of the etching chamber 510 of FIG. 1 is adjusted and the temperature of the electrostatic chuck 526 of FIG. 1 is adjusted, the wiring pattern 638 and the material pattern 608, which have a constant width, may be formed, as shown in FIG. 8B. For example, the wiring pattern 638 and the material pattern 608 of FIG. 8B may have a uniform critical dimension in upper and lower portions thereof.

As shown in FIG. 7, the dry-etching of the wiring layer 630 and the material layer 604 by using the mask pattern 606 as an etch mask may further include adjusting the concentrations of the main etching gas and the auxiliary etching gas with respect to the inert gas flowing in the etching chamber 510 of FIG. 1 (S406).

The adjusting of the concentrations of the main etching gas and the auxiliary etching gas with respect to the inert gas (S406) may be the same as operation S206 of FIG. 2. If the concentrations of the main etching gas and the auxiliary etching gas with respect to the inert gas flowing in the etching chamber 510 of FIG. 1 are adjusted, the wiring pattern 638 and the material pattern 608, which have a more constant width (e.g., a critical dimension), may be formed.

Figure 9A:
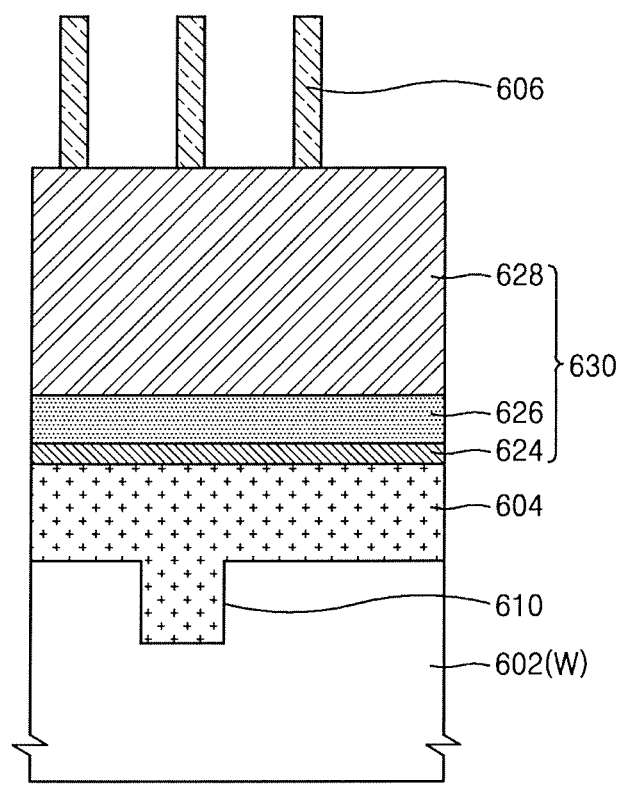
FIGS. 9A and 9B are cross-sectional views illustrating a method of fabricating a semiconductor device, according to an exemplary embodiment of the inventive concept.
Figure 9B:
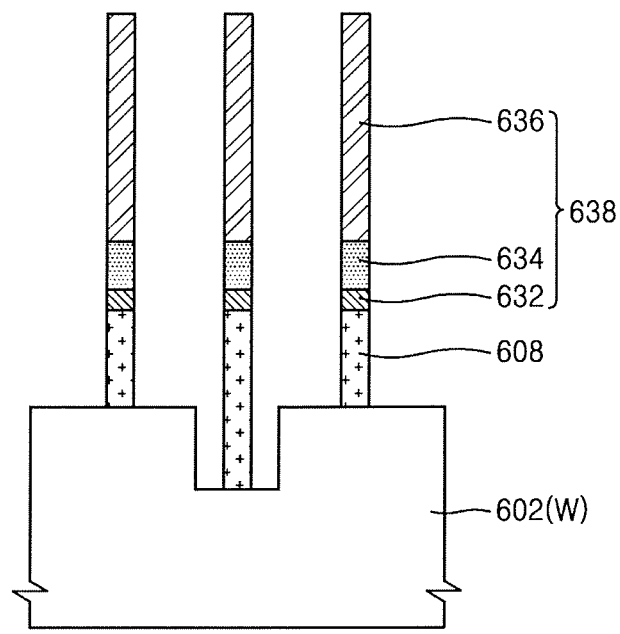

FIGS. 9A and 9B are cross-sectional views illustrating a method of fabricating a semiconductor device, according to an exemplary embodiment of the inventive concept.

The method of FIGS. 9A and 9B may be similar to the method of fabricating the semiconductor device according to FIGS. 7, 8A, and 8B, except that the method of FIGS. 9A and 9B includes forming a contact hole 610 in the substrate 602, and filling the contact hole 610 with the material layer 604.

As shown in FIG. 9A, the contact hole 610 is formed in the substrate 602. The contact hole 610 may be formed by partially etching a portion of a surface of the substrate 602 (W). Then, the material layer 604 may be formed on the substrate 602 (W), and the material layer 604 may fill the contact hole 610. The material layer 604 is formed in the contact hole 610 and on the substrate 602.

Then, the wiring layer 630 is formed on the material layer 604. The wiring layer 630 may include the barrier metal layer 624, the metal layer 626, and the capping layer 628. The mask pattern 606 is formed on the wiring layer 630.

Then, the substrate 602 (W) including the material layer 604, the wiring layer 630, and the mask pattern 606 is loaded onto the electrostatic chuck 526 of the etching chamber 510 of FIG. 1. As shown in FIGS. 9A and 9B, the wiring layer 630 and the material layer 604 filling the contact hole 610 are dry-etched by using the mask pattern 606 as an etch mask. Accordingly, the wiring pattern 638 and the material pattern 608 are formed.

As shown in FIG. 9B, the wiring pattern 638 and the material pattern 608 may be formed on the substrate 602 (W). The material pattern 608 may be formed to contact the bottom of the contact hole 610 and to be spaced apart from the sidewall of the contact hole 610.

The wiring pattern 638 may include the barrier metal pattern 632, the metal pattern 634, and the capping pattern 636. The material pattern 608 may be an insulating pattern, a metal pattern, or a polysilicon pattern.

As shown in FIG. 7, the dry-etching of the wiring layer 630 and the material layer 604 by using the mask pattern 606 as an etch mask may include adjusting the pressure of the etching chamber 510 of FIG. 1 (S402), and adjusting the temperature of the electrostatic chuck 526 of FIG. 1 (S404).

As shown in FIG. 7, the dry-etching of the wiring layer 630 and the material layer 604 by using the mask pattern 606 as an etch mask may further include adjusting the concentrations of the main etching gas and the auxiliary etching gas with respect to the inert gas flowing in the etching chamber 510 of FIG. 1 (S406). Through the processes described above, the wiring pattern 638 and the material pattern 608, which have a constant width, may be formed in the contact hole 610 and on the substrate 602.

Figure 10:
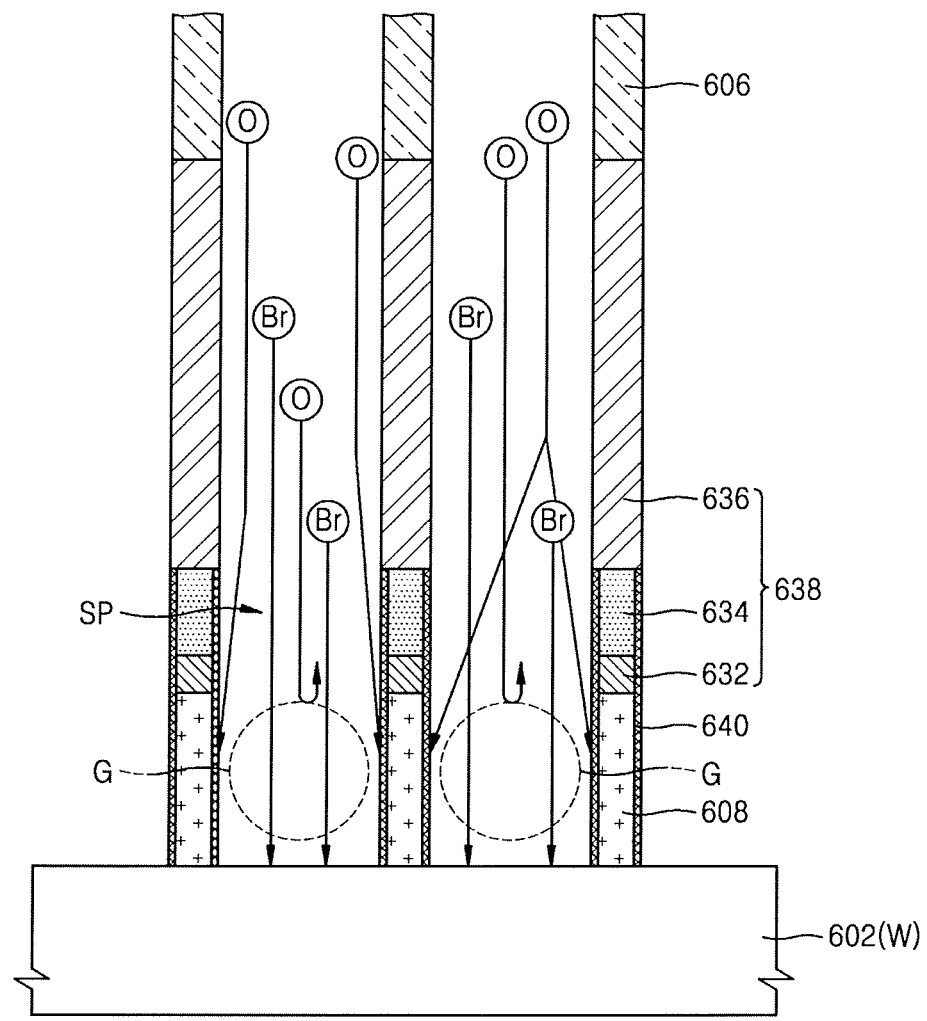
FIG. 10 is a diagram illustrating a method of forming a wiring pattern and a material pattern, according to an exemplary embodiment of the inventive concept.

FIG. 10 is a diagram illustrating a method of forming a wiring pattern and a material pattern, according to an exemplary embodiment of the inventive concept.

For example, FIG. 10 is a diagram illustrating a method of forming the wiring pattern 638 and the material pattern 608 of FIGS. 7, 8A, and 8B. The wiring layer 630 of FIG. 8A may be dry-etched by using the mask pattern 606 of FIG. 8A as an etch mask to form the wiring pattern 638. Then, the material layer 604 of FIG. 8A may be dry-etched by using the mask pattern 606 as an etch mask to form the material pattern 608. FIG. 10 illustrates an example in which the material layer 604 includes a polysilicon layer. The etching of the material layer 604 of FIG. 8A may be performed by a reaction of Formula 1.

$$Si + 4HBr \rightarrow SiBr_4 + Others \qquad \text{[Formula 1]}$$

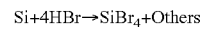

wherein the term "Others" includes H ions, H radicals, or the like.

In the dry-etching process (S400) of FIG. 7, the polysilicon layer including the material layer 604 of FIG. 8A reacts with etching elements, for example, Br ions or Br radicals, which are generated by dissociation of the main etching gas, for example, HBr gas, to etch the polysilicon layer. The circled symbol of "Br" in FIG. 10 denotes a Br ion or a Br radical. Unless the Br ions or Br radicals move in the vertical direction (Z-axis direction) with respect to the substrate 602 and reach a bottom portion of a space SP, the material pattern 608 might not be etched. The bottom portion of a space SP may be, for example, a groove or hole defined by the mask pattern 606 and formed using the mask pattern 606 as an etching mask.

In the dry-etching process (S400) of FIG. 7, a volatile gas G, for example, a gas such as $SiBr_4$, which is generated by the etching of the material layer 604 of FIG. 8A, may stay in the bottom portion of the space SP, the bottom portion of the space SP being, for example, a groove or hole defined by the mask pattern 606 and formed using the mask pattern 606 as an etching mask.

In addition, in the dry-etching process (S400) of FIG. 7, auxiliary etching elements, for example, O radicals (O*), which are generated by dissociation of the auxiliary etching gas, for example, $O_2$ gas may flow in the groove or hole defined by and formed using the mask pattern 606. The circled symbol of "O" in FIG. 10 denotes an oxygen radical.

In the dry-etching process (S400) of FIG. 7, a reaction preventive layer 640, for example, $SiBrO_x$ may be formed on a sidewall of the material pattern 608 due to a reaction of a volatile gas and the auxiliary etching gas. The reaction preventive layer 640 may prevent the lateral over-etch of the material pattern 608 in the horizontal directions (X-axis and Y-axis directions) with respect to the substrate. Thus, the reaction preventive layer 640 causes the width of the material pattern 608 in the X and/or Y-axis directions to be substantially constant along the Z-axis direction.

In the dry-etching process (S400), as described above, the pressure of the etching chamber 510 of FIG. 1 may be adjusted to adjust the lateral over-etch of the material pattern 608 in the horizontal directions with respect to the substrate 602 (W), for example, in the X-axis and Y-axis directions. The temperature of the electrostatic chuck 526 of FIG. 1 may be adjusted (e.g., changed) to adjust the etching of the material pattern 608 in the vertical direction with respect to the substrate 602 (W), for example, in the Z-axis direction.

When the pressure of the etching chamber 510 of FIG. 1 is adjusted and the temperature of the electrostatic chuck 526 of FIG. 1 is adjusted, the material pattern 608 having a constant width may be formed. For example, the material pattern 608 may have a uniform width (e.g., critical dimension) in the upper and lower portions thereof.

In addition, in the dry-etching process (S400), the concentrations of the main etching gas and the auxiliary etching gas with respect to the inert gas flowing in the etching chamber 510 of FIG. 1 may also be adjusted. In this case, the material pattern 608 having a more constant width may be formed.

Figure 11A:
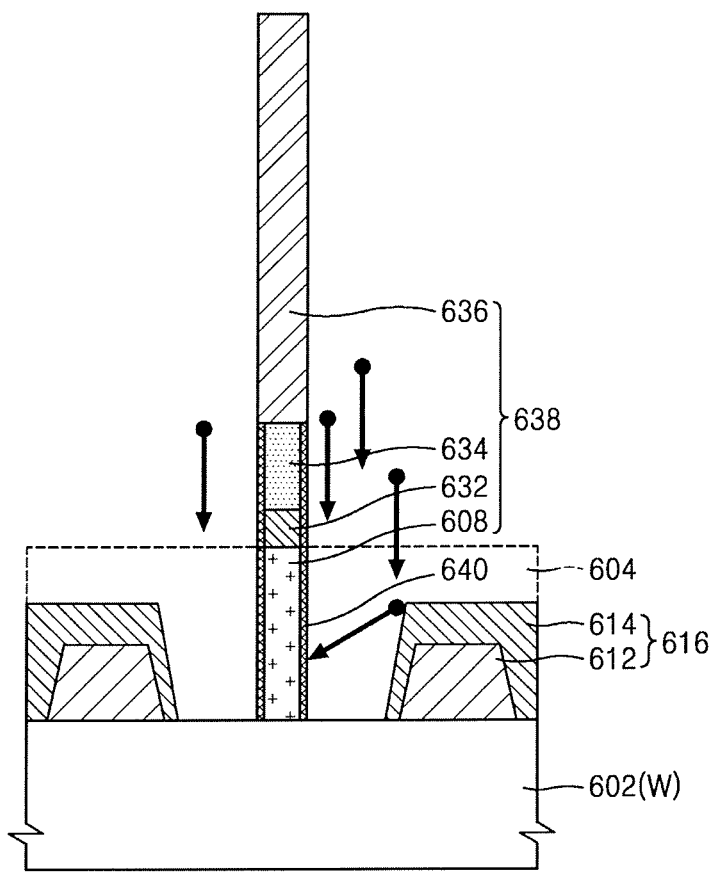
FIG. 11A is a diagram illustrating a method of forming a wiring pattern and a material pattern, according to an exemplary embodiment of the inventive concept.
Figure 11B:
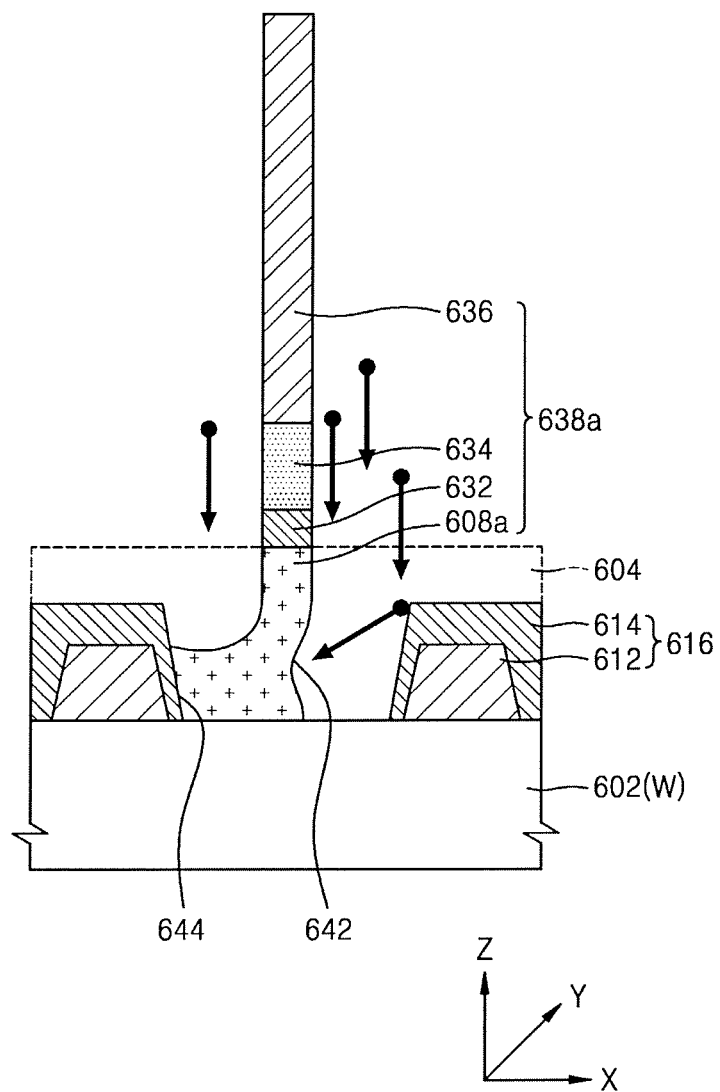
FIG. 11B is a diagram illustrating a method of forming a wiring pattern and a material pattern, according to an approach.

FIG. 11A is a diagram illustrating a method of forming a wiring pattern and a material pattern, according to an exemplary embodiment of the inventive concept. FIG. 11B is a diagram illustrating a method of forming a wiring pattern and a material pattern, according to an approach.

The method of forming the wiring pattern 638 and the material pattern 608 or 608a, may be similar to method of forming the wiring pattern and the material pattern of FIGS. 7, 8A, 8B, and 10, except that in FIGS. 11A and 11B the active patterns 612 are formed in the substrate 602 (W). The boundaries of the active patterns 612 correspond to the isolation insulating layer 614 on the isolation trenches 618.

The wiring layer 630 of FIG. 8A may be dry-etched by using the mask pattern 606 of FIG. 8A as an etch mask to form the wiring pattern 638. Then, the material layer 604 of FIG. 8A may be dry-etched by using the mask pattern 606 as an etch mask to form the material pattern 608 or 608a. The material layer 604 is formed on the isolation insulating layer 614 and fills the isolation trench 618. The material layer 604 is formed in the isolation trench 618 and on the isolation insulating layer 614. FIGS. 11A and 11B show examples in which the material layer 604 includes a polysilicon layer.

As shown in FIG. 11A, when the material layer 604 is dry-etched, the etching elements denoted by arrows, for example, Br ions, Br radicals, or oxygen radicals, flow into the isolation trench 618. Accordingly, the reaction preventive layer 640 such as $SiBrO_x$ may be formed on the sidewall of the material pattern 608.

To facilitate the formation of the reaction preventive layer 640, the pressure of the etching chamber 510 of FIG. 1 may be adjusted. For example, the pressure of the etching chamber 510 of FIG. 1 may be adjusted to be about 30 mTorr to about 100 mTorr. The reaction preventive layer 640 may prevent the lateral over-etch of the material pattern 608 in the horizontal directions (X-axis and Y-axis directions) with respect to the substrate 602 (W).

When the pressure of the etching chamber 510 of FIG. 1 is not adjusted, the reaction preventive layer 640 might not be formed or may be formed as a thin reaction preventive layer 642 which might not prevent the material pattern 608 from being etched in the X and Y-axis directions, as shown in FIG. 11B. For example, as shown in FIG. 11B, Br ions, Br radicals, or oxygen radicals, react with the material pattern 608a and over-etch of the material pattern 608a in the horizontal directions (X-axis and Y-axis directions) (e.g., lateral directions) with respect to the substrate 602 (W).

When the lateral over-etch of the material pattern 608a occurs, the widths, for example, the critical dimensions of the material pattern 608a and the wiring pattern 638 might not be equal to each other. In addition, if the lateral over-etch of the material pattern 608a occurs, since the widths, for example, the critical dimensions of the material pattern 608a and the wiring pattern 638 are decreased, connection resistance between the substrate 602 (W) and both of the material pattern 608a (for example, a polysilicon pattern) and the wiring pattern 638 may be increased.

In addition, as shown in FIG. 11A, when the material layer 604 is dry-etched, the temperature of the electrostatic chuck 526 of FIG. 1 may be adjusted. Accordingly, the etching elements denoted by the arrows, for example, Br ions, Br radicals, or oxygen radicals, may deeply penetrate into the isolation trench 618. Thus, the material pattern 608 may be fully etched in the vertical direction (Z-axis direction) with respect to the substrate 602. In this case, the substrate 602 may be exposed by the fully etched portion of the material pattern 608 at a portion of the substrate 602 where the material pattern 608 does not overlap the barrier metal pattern 632, the metal pattern 634, and the capping pattern 636, as shown in FIG. 11A.

When the temperature of the electrostatic chuck 526 of FIG. 1 is not adjusted, the etching elements denoted by the arrows, for example, Br ions, Br radicals, or oxygen radicals, might not deeply penetrate into the isolation trench 618. Thus, as shown by the reference numeral 644 of FIG. 11B, the material pattern 608a may be only partially etched in the vertical direction (Z-axis direction) with respect to the substrate 602. For example, portions of the material pattern 608a that do not overlap the wiring pattern 638a may remain unetched on the substrate 602 (W), as shown in FIG. 11B. In addition, when the material pattern 608a are not fully etched, as shown in FIG. 11B, (e.g., portions of the material pattern 608a that do not overlap the wiring pattern 638a remain unetched) a defect may occur when a process of fabricating a semiconductor device is performed. The defect may be caused by the unetched material pattern 608a contacting an adjacent wiring pattern.

Further, according to an exemplary embodiment of the inventive concept, in the dry-etching of the material layer 604, the concentrations of the main etching gas and the auxiliary etching gas with respect to the inert gas flowing in the etching chamber 510 of FIG. 1 may be adjusted. In this case, the material pattern 608 having a more constant width (for example, a more constant critical dimension) may be formed.

Figure 12:
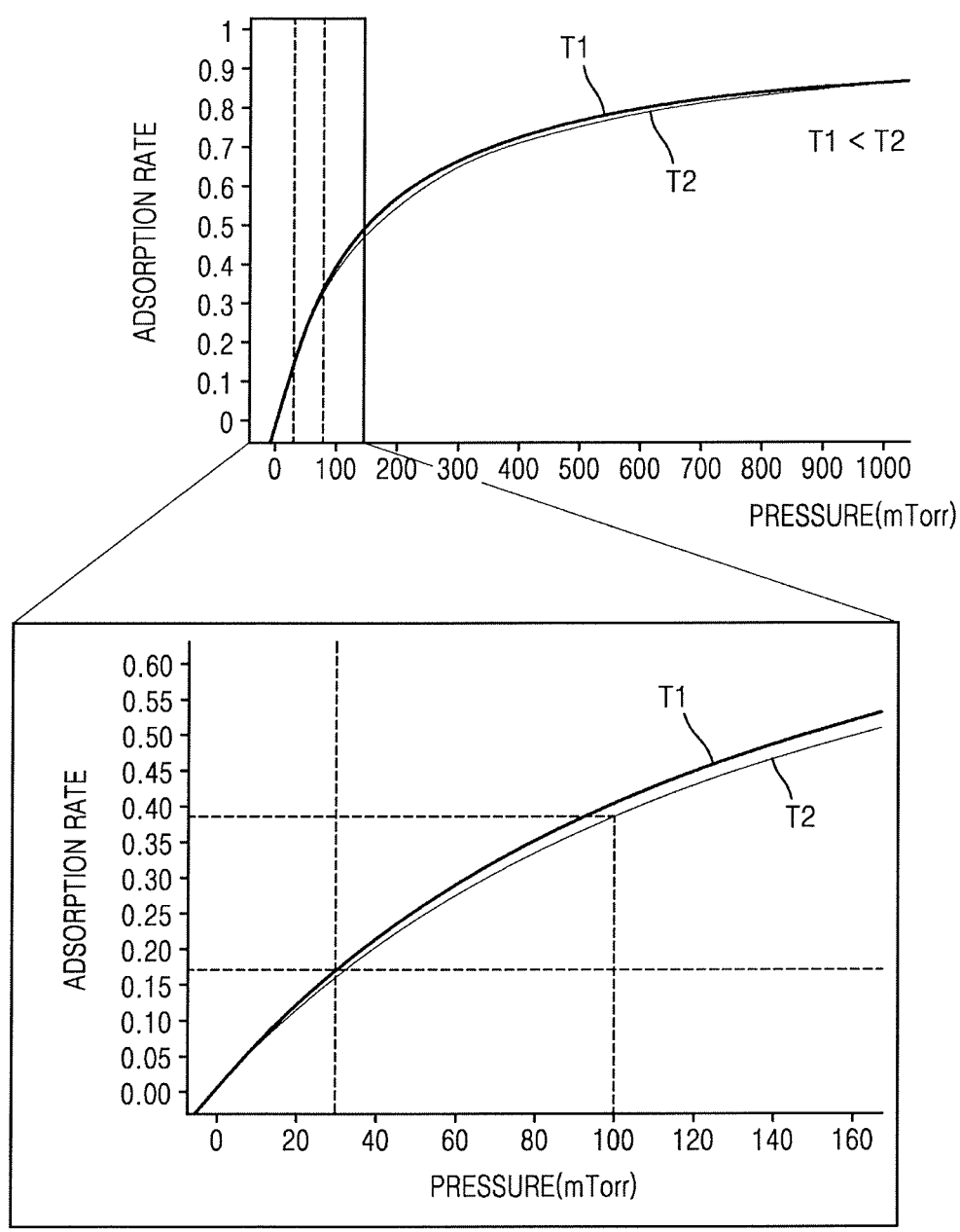
FIG. 12 is a graph depicting an adsorption rate of etching elements according to an exemplary embodiment of the inventive concept.

FIG. 12 is a graph depicting an adsorption rate of etching elements, according to an exemplary embodiment of the inventive concept.

FIG. 12 illustrates that the adsorption rate of the etching elements depends upon the pressure of the etching chamber 510 of FIG. 1 and the temperature of the electrostatic chuck 526 of FIG. 1. As shown in FIG. 12, when the pressure of the etching chamber 510 of FIG. 1 increases, the adsorption rate of the etching elements increases. When the adsorption rate is 1, the etching elements are 100% adsorbed, and when the adsorption rate is 0, the etching elements are not adsorbed at all.

From test results of a pressure of the etching chamber 510 of FIG. 1, it was observed that as the pressure of the etching chamber 510 of FIG. 1 increased from 30 mTorr to 100 mTorr, the adsorption rate of the etching elements increased from about 0.17 to about 0.38. When the adsorption rate of the etching elements increases, the reaction preventive layer 640 of FIG. 11A is formed to have a large thickness, as described above, upon the dry-etching of the material layer 604 of FIG. 11A. The material layer 604 may be, for example, a polysilicon layer. Accordingly, lateral over-etch of the material pattern 608 of FIG. 11A in the horizontal directions with respect to the substrate is reduced or substantially eliminated.

In addition, when the temperature of the electrostatic chuck 526 of FIG. 1 is increased upon the dry-etching of the material layer 604 of FIG. 11A, for example, a polysilicon layer, the material pattern 608 does not remain unetched (e.g., is etched) in the vertical direction (Z-axis direction) with respect to the substrate 602. However, it can be seen that as the temperature of the electrostatic chuck 526 of FIG. 1 increases, the adsorption rate of the etching elements decreases.

From evaluation results of the temperature of the electrostatic chuck 526 of FIG. 1, it was observed that as the temperature of the electrostatic chuck 526 of FIG. 1 increased from T1, for example, about 15° C., to T2, for example, about 40° C. to about 90° C., the adsorption rate of the etching elements decreased. When the adsorption rate decreases, since the reaction preventive layer 640 is not formed or is formed to have a small thickness, there may be a negative effect on reducing the lateral over-etch of the material pattern 608 of FIG. 11A. In this case, the negative effect may mean that the material pattern 608 may be laterally etched where it overlaps the wiring pattern 638.

When the material layer 604 of FIG. 11A, for example, a polysilicon layer, is dry-etched, the thickness of the reaction preventive layer 640 of FIG. 11A may increase since the adsorption rate increases with the increasing pressure of the etching chamber 510 of FIG. 1, and the thickness of the thickness of the reaction preventive layer 640 of FIG. 11A may decrease with the increasing temperature of the electrostatic chuck 526 of FIG. 1.

However, according to an exemplary embodiment of the inventive concept, since the increase of the adsorption rate due to the increase of the pressure of the etching chamber 510 of FIG. 1 cancels out the reduction of the adsorption rate due to the increase of the temperature of the electrostatic chuck 526 of FIG. 1, the pressure of the etching chamber 510 of FIG. 1 is increased, and the temperature of the electrostatic chuck 526 of FIG. 1 is increased. From evaluation results of the temperature of the electrostatic chuck 526 of FIG. 1, it was observed that the material pattern 608 of FIG. 11A had a uniform width (e.g., critical dimension) in the upper and lower portions thereof without having an unetched portion where the material pattern 608 does not overlap the barrier metal pattern 632, the metal pattern 634, and the capping pattern 636 even though the temperature of the electrostatic chuck 526 of FIG. 1 increased from T1 to T2 as set forth above.

In addition, in the dry etching process according to an exemplary embodiment of the inventive concept, the concentrations of the main etching gas and the auxiliary etching gas with respect to the inert gas flowing in the etching chamber 510 of FIG. 1 may also be adjusted. As described above, from evaluation results of the ratio of the main etching gas to the inert gas, it was observed that the material pattern 608 having a more constant width was formed when the ratio of the main etching gas to the inert gas was adjusted to 0.5 to 1.1.

Figure 13:
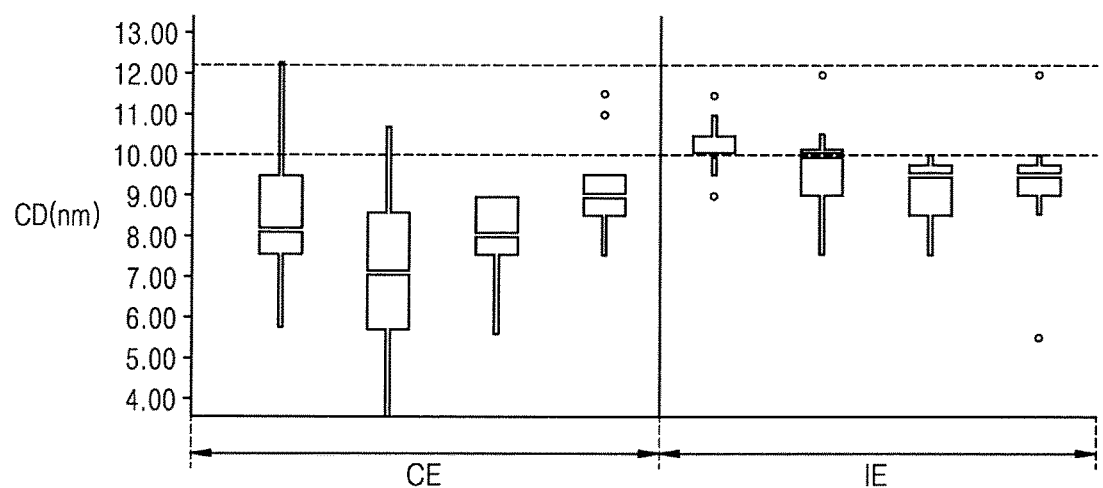
FIG. 13 is a diagram illustrating critical dimensions of a wiring pattern and a material pattern according to an exemplary embodiment of the inventive concept, and according to an approach.

FIG. 13 is a diagram illustrating critical dimensions of a wiring pattern and a material pattern according to an exemplary embodiment of the inventive concept, and according to an approach.

The critical dimensions of the material patterns 608 of FIG. 11A or the wiring patterns 638 of FIG. 11A are represented by IE, and the critical dimensions of the material patterns 608a of FIG. 11B are represented by CE. According to an exemplary embodiment of the inventive concept, as shown in FIG. 11A, when the material patterns 608 or the wiring patterns 638 are formed, the pressure of the etching chamber and the temperature of the electrostatic chuck are adjusted, or the concentrations of the main etching gas and the auxiliary etching gas with respect to the inert gas are adjusted. In the approach of FIG. 11B, the process parameters set forth above are not adjusted.

It can be seen in FIG. 13 that the critical dimensions of the material patterns 608 or the wiring patterns 638, according to an exemplary embodiment of the inventive concept, are close to a desired value, for example, 10 nm, and have small fluctuations from the desired value. Thus, the critical dimension of each material pattern 608 or each wiring pattern 638, according to an exemplary embodiment of the inventive concept, has a small fluctuation.

However, as shown in FIG. 13, it can be seen that the critical dimensions of the material patterns 608a, according to an approach, are not close to a desired value, for example, 10 nm. In addition, the material patterns 608a of FIG. 11B have large fluctuations, as illustrated in FIG. 13. Accordingly, the critical dimension of each material pattern 608a has a large fluctuation.

Hereinafter, various embodiments, to which the aforementioned method of fabricating the semiconductor device is applied, will be described. In the accompanying drawings, X-axis and Y-axis directions may be directions parallel to a substrate, and a Z-axis direction may be a direction perpendicular to the substrate.

FIGS. 14A to 17E are diagrams illustrating a method of fabricating a semiconductor device, according to an exemplary embodiment of the inventive concept.

FIGS. 14A, 15A, 16A, and 17A are respectively cross-sectional views taken along lines I-I' of FIGS. 14E, 15E, 16E, and 17E. FIGS. 14B, 15B, 16B, and 17B are respectively cross-sectional views taken along lines II-II' of FIGS. 14E, 15E, 16E, and 17E. FIGS. 14C, 15C, 16C, and 17C are respectively cross-sectional views taken along lines III-III' of FIGS. 14E, 15E, 16E, and 17E. FIGS. 14D, 15D, 16D, and 17D are respectively cross-sectional views taken along lines IV-IV' of FIGS. 14E, 15E, 16E, and 17E.

Figure 14A:
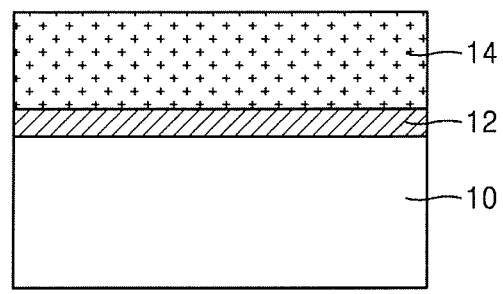
FIGS. 14A to 17E are diagrams illustrating a method of fabricating a semiconductor device, according to an exemplary embodiment of the inventive concept.
Figure 14B:
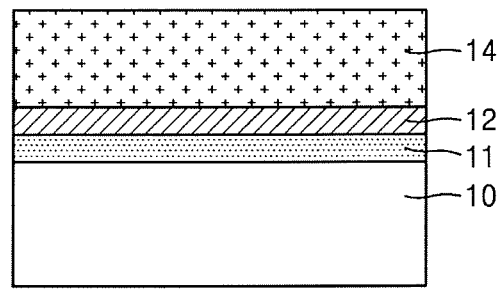
Figure 14C:
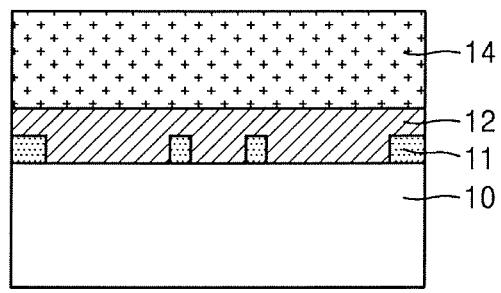
Figure 14D:
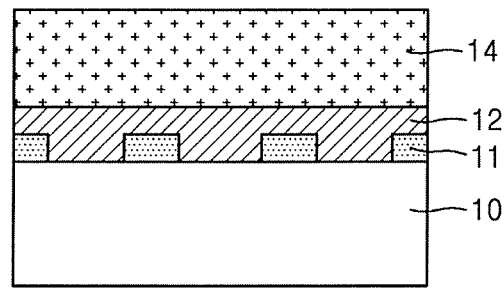
Figure 14E:
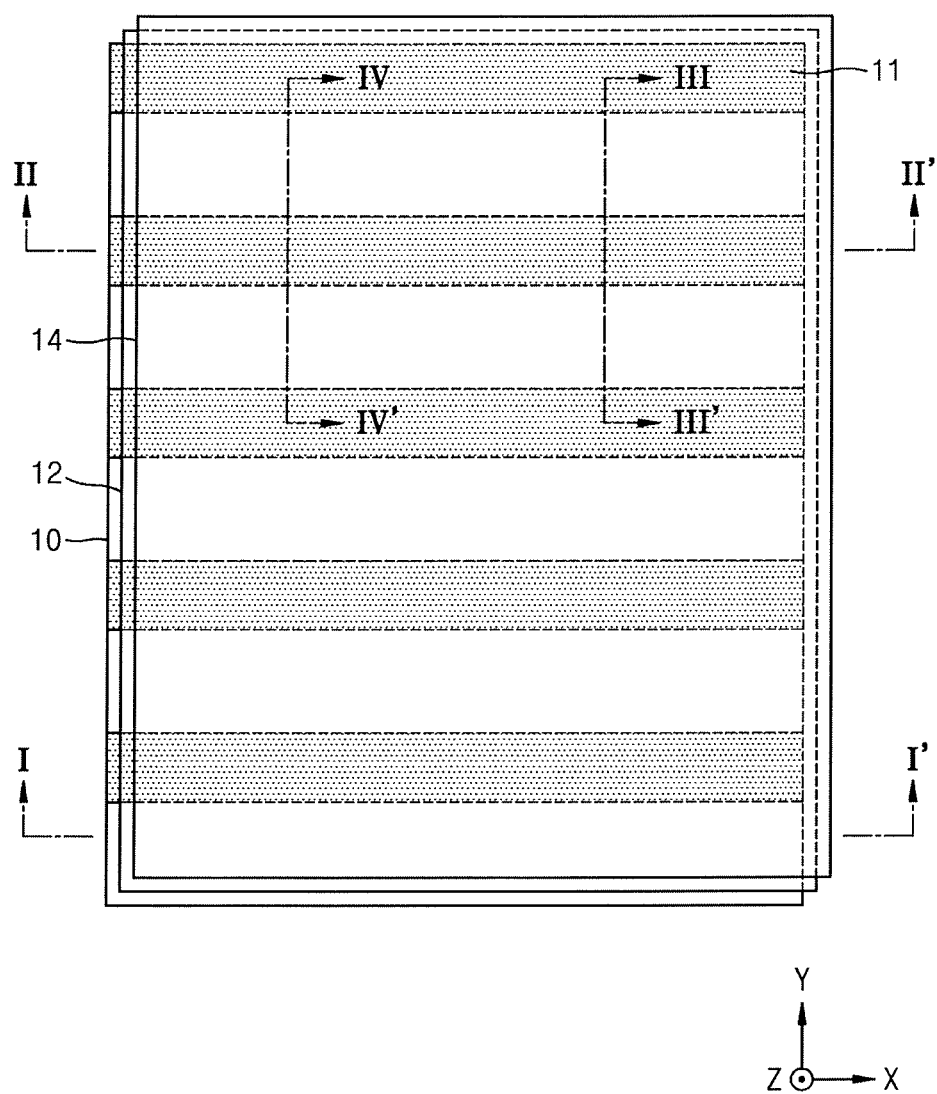

Referring to FIGS. 14A to 14E, word lines 11 are formed on a substrate 10, with an insulating layer being disposed between the word lines 11 and the substrate 10. The substrate 10 may be a silicon wafer, for example, a silicon substrate. The substrate 10 may include crystalline silicon, polycrystalline silicon, or amorphous silicon. As shown in FIG. 14E, the word lines 11 may extend in a first direction (X-axis direction) and may be spaced apart from each other in a second direction (Y-axis direction) that is perpendicular to the first direction.

An interlayer dielectric layer 12, which may be referred to as "interlayer dielectric 12", may be formed on the word lines 11. The interlayer dielectric 12 may be formed on the substrate 10, on the word lines 11, and between the word lines 11. The interlayer dielectric 12 may include an oxide layer. The interlayer dielectric 12 is formed for insulating the word lines 11 from bit lines which will be formed in a subsequent process.

A first polysilicon layer 14 doped with impurities may be formed on the interlayer dielectric 12. The first polysilicon layer 14 may be formed on the entire substrate 10.

Referring to FIGS. 15A to 15E, a mask pattern 16 may be formed on the first polysilicon layer 14. The mask pattern 16 may be a photoresist pattern formed by a photolithography process. For example, the mask pattern 16 may be formed by forming a photoresist layer on the first polysilicon layer 14, followed by exposing and developing the photoresist layer.

The first polysilicon layer 14, the interlayer dielectric 12, and the substrate 10 are sequentially etched by using the mask pattern 16 as an etch mask to form a plurality of contact holes 18. The contact holes 18 may be direct contact holes, which contact bit lines in a subsequent process. The contact holes 18 may expose surfaces of the substrate 10 or the interlayer dielectric 12.

Figure 15A:
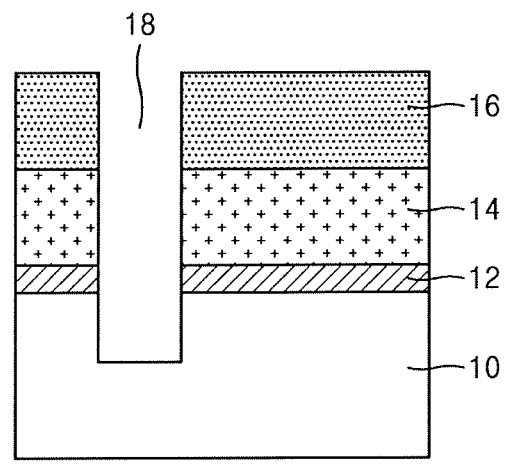
Figure 15B:
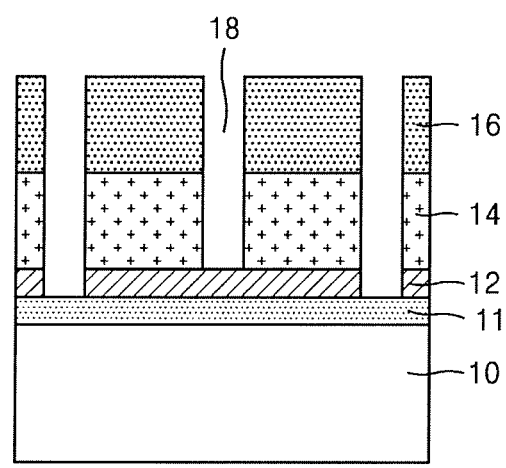
Figure 15C:
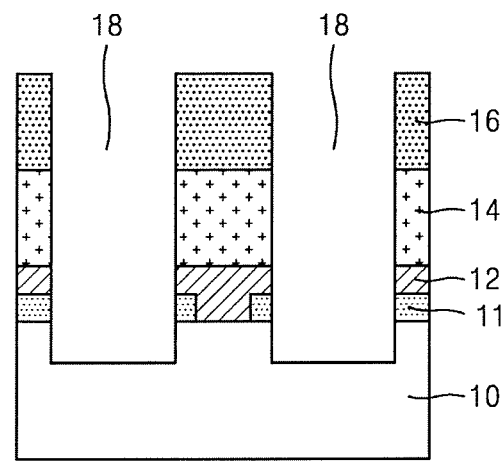
Figure 15D:
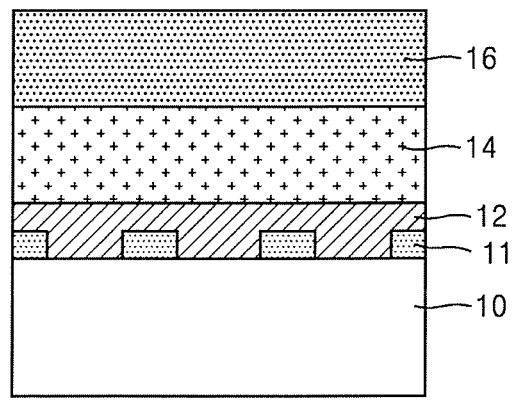
Figure 15E:
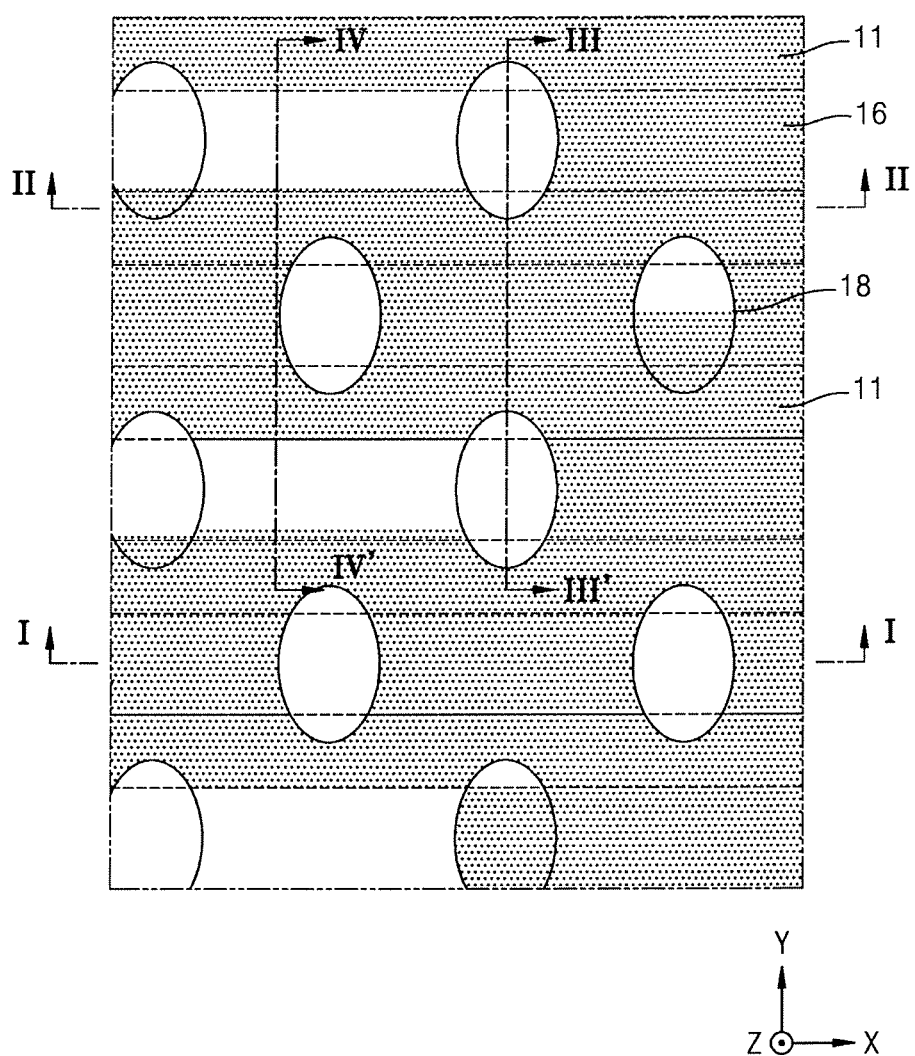

As shown in FIG. 15E, the contact holes 18 may be spaced apart from each other in the first direction (X-axis direction) and in the second direction (Y-axis direction). As shown in FIG. 15E, the contact holes 18 may be spaced apart from each other in the first direction (X-axis direction) and the second direction (Y-axis direction) and the contact holes 18 may be formed between the word lines 11.

Referring to FIGS. 16A to 16E, the mask pattern 16 is removed. Then, a second polysilicon layer 24 doped with impurities is formed over the word lines 11, and the second polysilicon layer 24 may fill the contact holes 18. In FIGS. 16A to 16E, the first and second polysilicon layers 14 and 24 may include a same element and collectively represented by the reference numeral 24. The second polysilicon layer 24 may fill the direct contact holes 18 and may be formed on an entire surface of the interlayer dielectric 12.

Figure 16A:
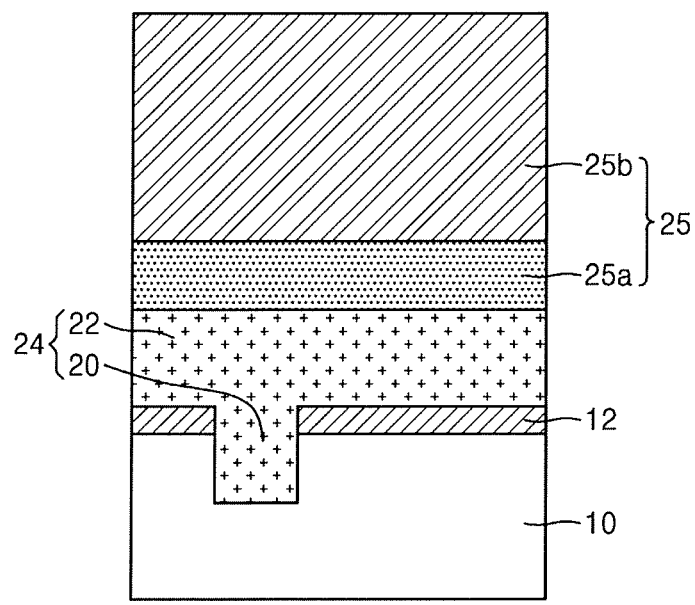
Figure 16B:
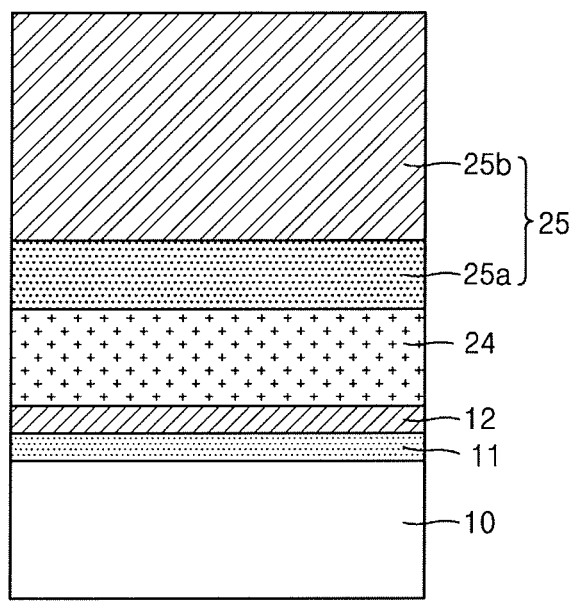
Figure 16C:
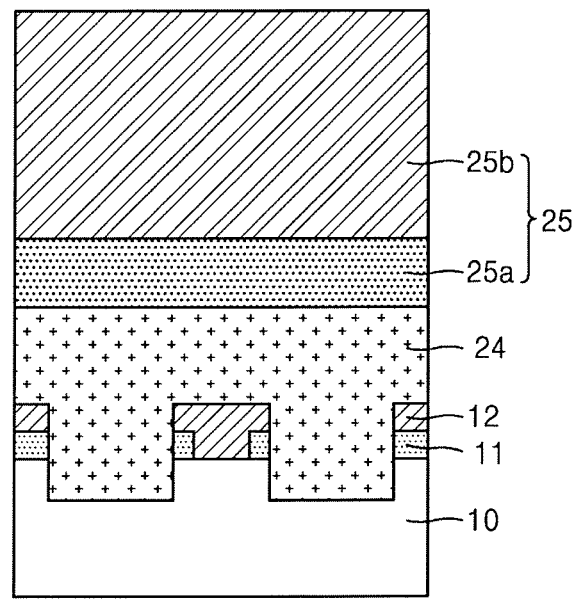
Figure 16D:
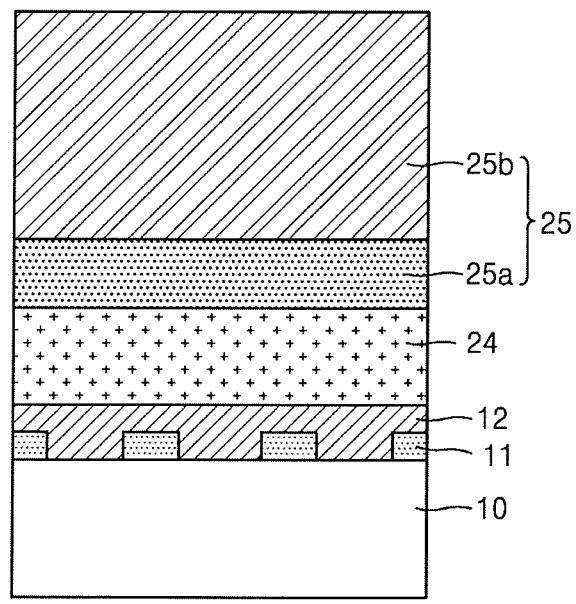
Figure 16E:
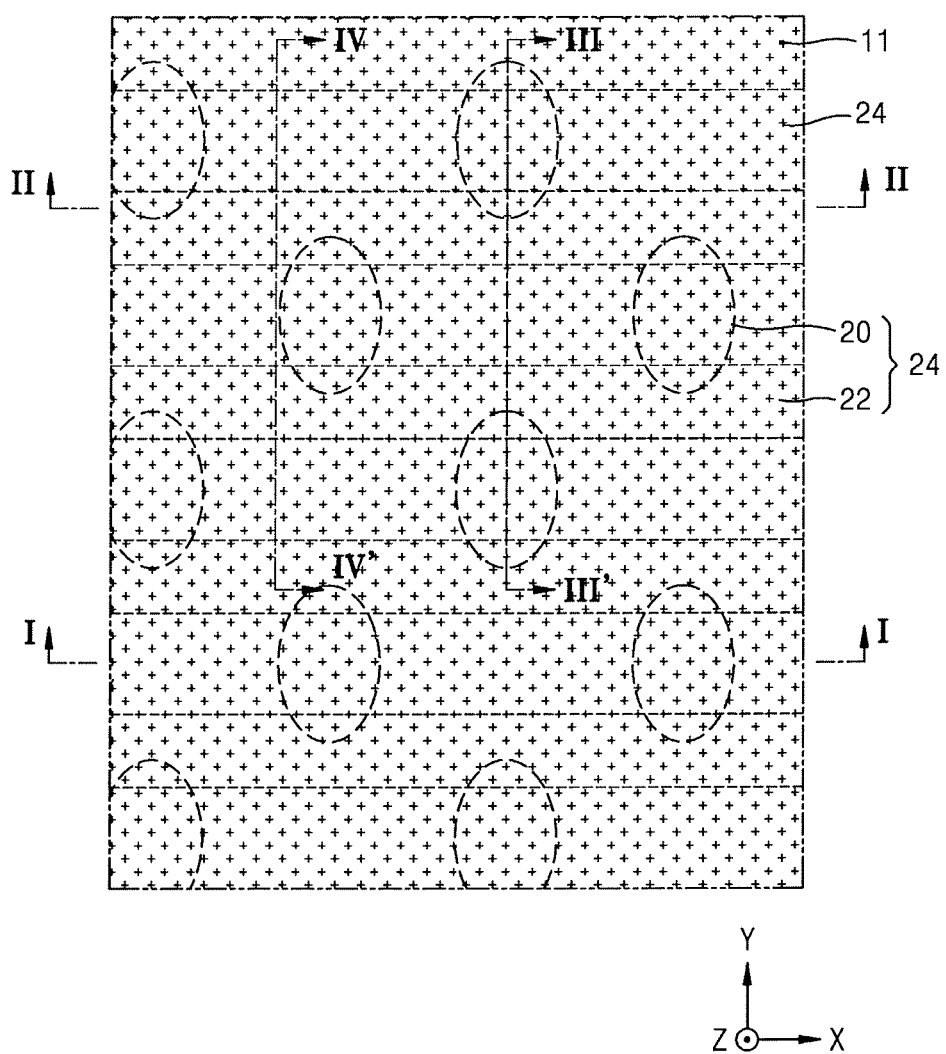

As shown in FIGS. 16A, 16C, and 16E, the second polysilicon layer 24 may include contact layers 20 on the substrate 10 and a surrounding layer 22 surrounding the contact layers 20. The contact layers 20 may be spaced apart from each other in the first and second directions. The contact layers 20 may refer to portions of the second polysilicon layer 24, which fill the contact holes 18. The surrounding layer 22 refers to a portion of the second polysilicon layer 24, which does not fill the contact holes 18.

Then, a wiring layer 25 including a metal layer 25a and a capping layer 25b is formed on the second polysilicon layer 24. The capping layer 25b, for example, might be omitted. The wiring layer 25 may be formed on the contact layers 20 and the surrounding layer 22. The metal layer 25a may include a tungsten layer. The capping layer 25b may include an insulating layer, for example, a nitride layer. The metal layer 25a and the capping layer 25b are not shown in FIG. 16E for convenience of illustration.

Referring to FIGS. 17A to 17E, the wiring layer 25 and the second polysilicon layer 24 are subjected to photolithography and etching processes to form a contact pattern 26 and a wiring pattern 30 on the substrate 10. The contact pattern 26 (e.g., a polysilicon pattern) may directly contact the contact holes 18, for example, the contact pattern 26 may directly contact the substrate 10 through the contact holes 18. The wiring pattern 30 may include a metal pattern 28 and a capping pattern 29. The contact pattern 26 and the wiring pattern 30 may include a bit line.

The contact pattern 26 and the wiring pattern 30 may be formed by the following processes. For example, a mask pattern 32 having a length in the first direction and a length in the second direction is formed on the capping layer 25b, the length in the first direction being less than the length in the second direction. The length of the mask pattern 32 in the first direction may be smaller than the length of the mask pattern 32 in the second direction. For example, the width of the first mask pattern 32 may correspond to the length of the first mask pattern 32 in the first direction.

The mask pattern 32 may be a photoresist pattern formed by a photolithography process. For example, the mask pattern 32 may be formed by forming a photoresist layer on the capping layer 25b, followed by exposing and developing the photoresist layer.

Figure 17A:
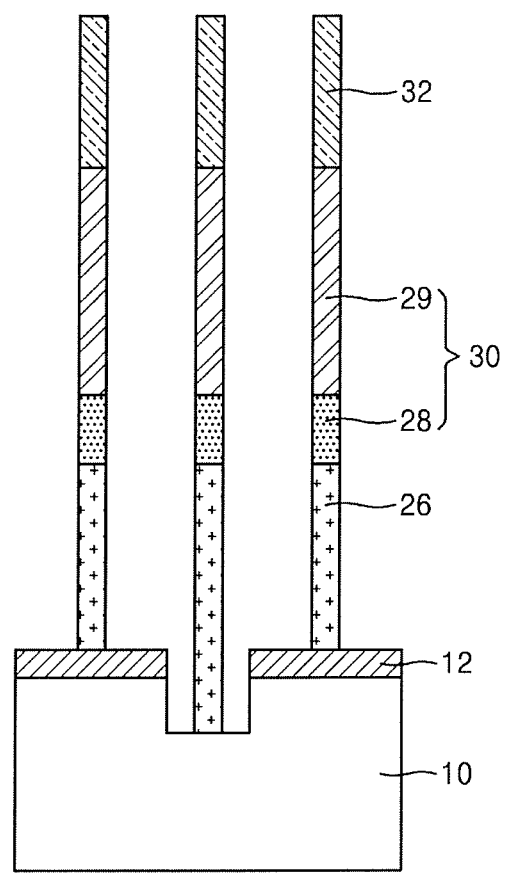
Figure 17B:
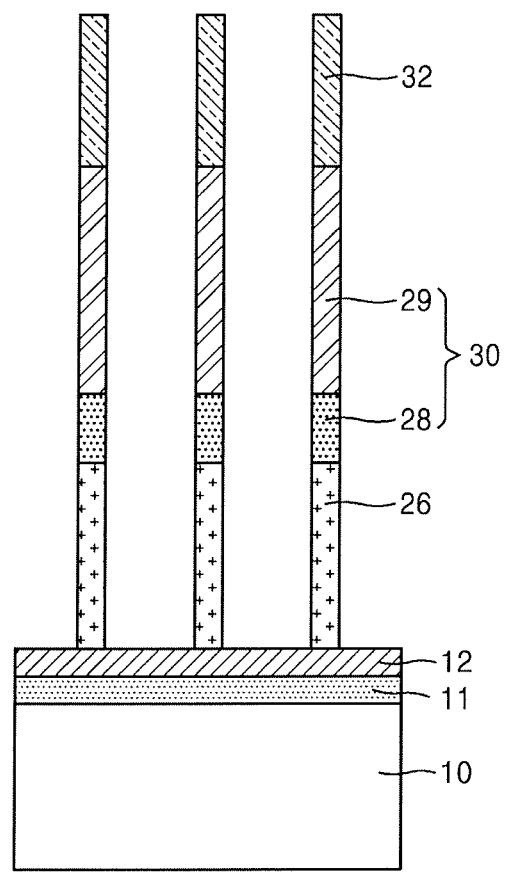
Figure 17C:
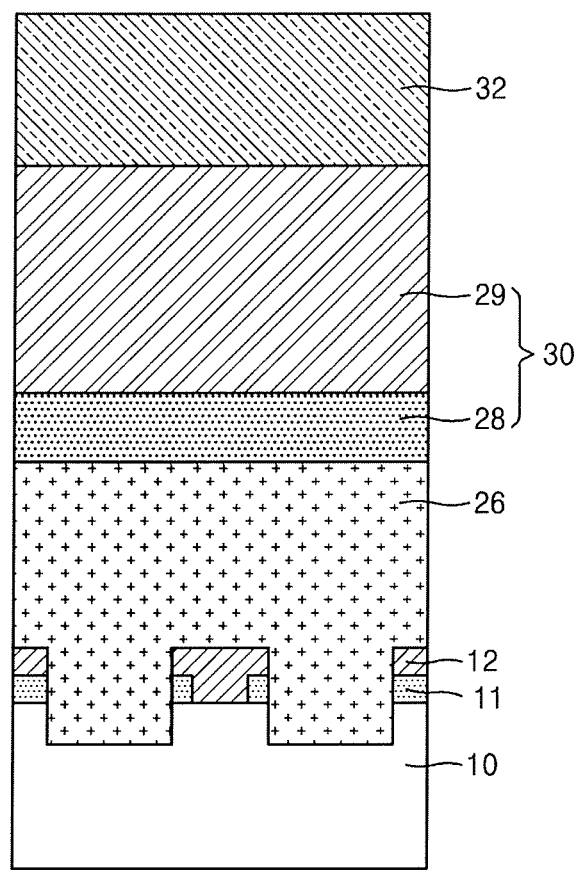
Figure 17D:
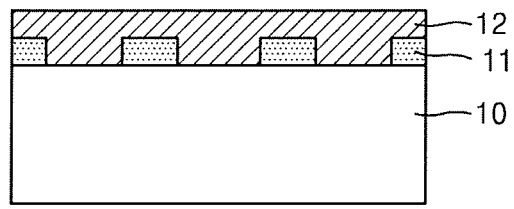
Figure 17E:
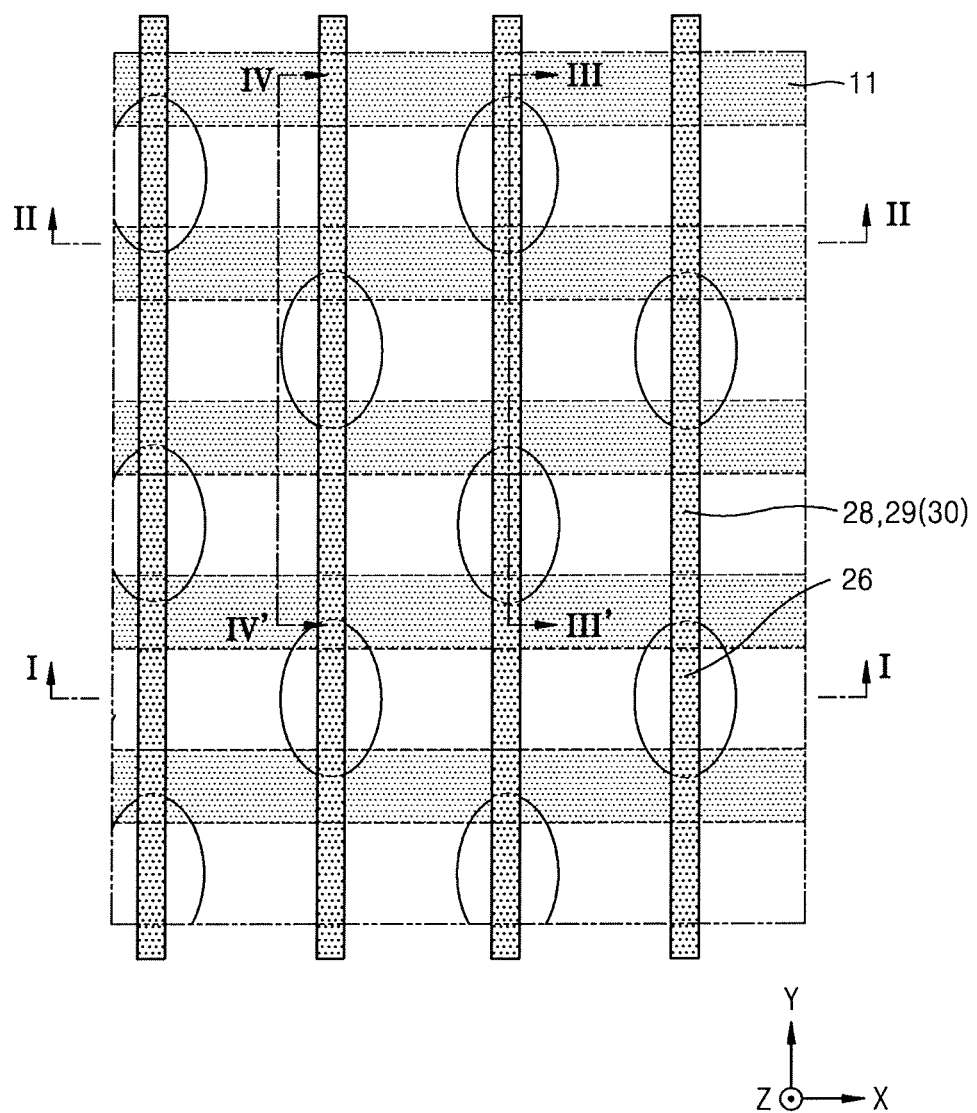

Then, the wiring layer 25 including the capping layer 25b and the metal layer 25a, and the second polysilicon layer 24 are dry-etched by using the mask pattern 32 as an etch mask to form the contact pattern 26 and the wiring pattern 30 over the substrate 10. The contact pattern 26 and the wiring pattern 30 are formed by using the etching apparatus as shown in FIG. 1. As shown in FIG. 17E, the contact pattern 26 and the wiring pattern 30 may have a length in the first direction and a length in the second direction, the length in the first direction being less than the length in the second direction. The length (e.g., width) of the contact pattern 26 and the wiring pattern 30 in the first direction may be smaller than the length of the contact pattern 26 and the wiring pattern 30 in the second direction.

As described above, the contact pattern 26 and the wiring pattern 30 may be formed to have a uniform width by adjusting the pressure of the etching chamber 510 of FIG. 1, the temperature of the electrostatic chuck 526 of FIG. 1, and/or the concentrations of the main etching gas and the auxiliary etching gas with respect to the inert gas injected into the etching chamber 510 of FIG. 1. For example, when the wiring layer 25 and the second polysilicon layer 24 are dry-etched, the pressure of the etching chamber 510 of FIG. 1 may be adjusted to be about 30 mTorr to about 100 mTorr, and the temperature of the electrostatic chuck 526 of FIG. 1 may be adjusted to be about 40° C. to about 90° C. Since the dry etching of the wiring layer 25 and the second polysilicon layer 24 has been described in detail in above, duplicate descriptions thereof will be omitted for brevity. The contact pattern 26 and the wiring pattern 30 may have a vertical sidewall profile and have a straight line shape in the second direction in a plan view.

Therefore, when a highly scaled semiconductor device is fabricated according to an exemplary embodiment of the inventive concept, a photolithography process margin between the contact patterns 26 and a photolithography process margin between the wiring patterns 30 can be increased. In addition, when a highly scaled semiconductor device is fabricated according to an exemplary embodiment of the inventive concept, short-circuiting between respective wiring patterns 30 can be avoided, and short-circuiting between contact patterns 26 can be avoided.

Hereinafter, a method of fabricating semiconductor devices that may be applied to a dynamic random-access memory (DRAM) device will be described.

Figure 18:
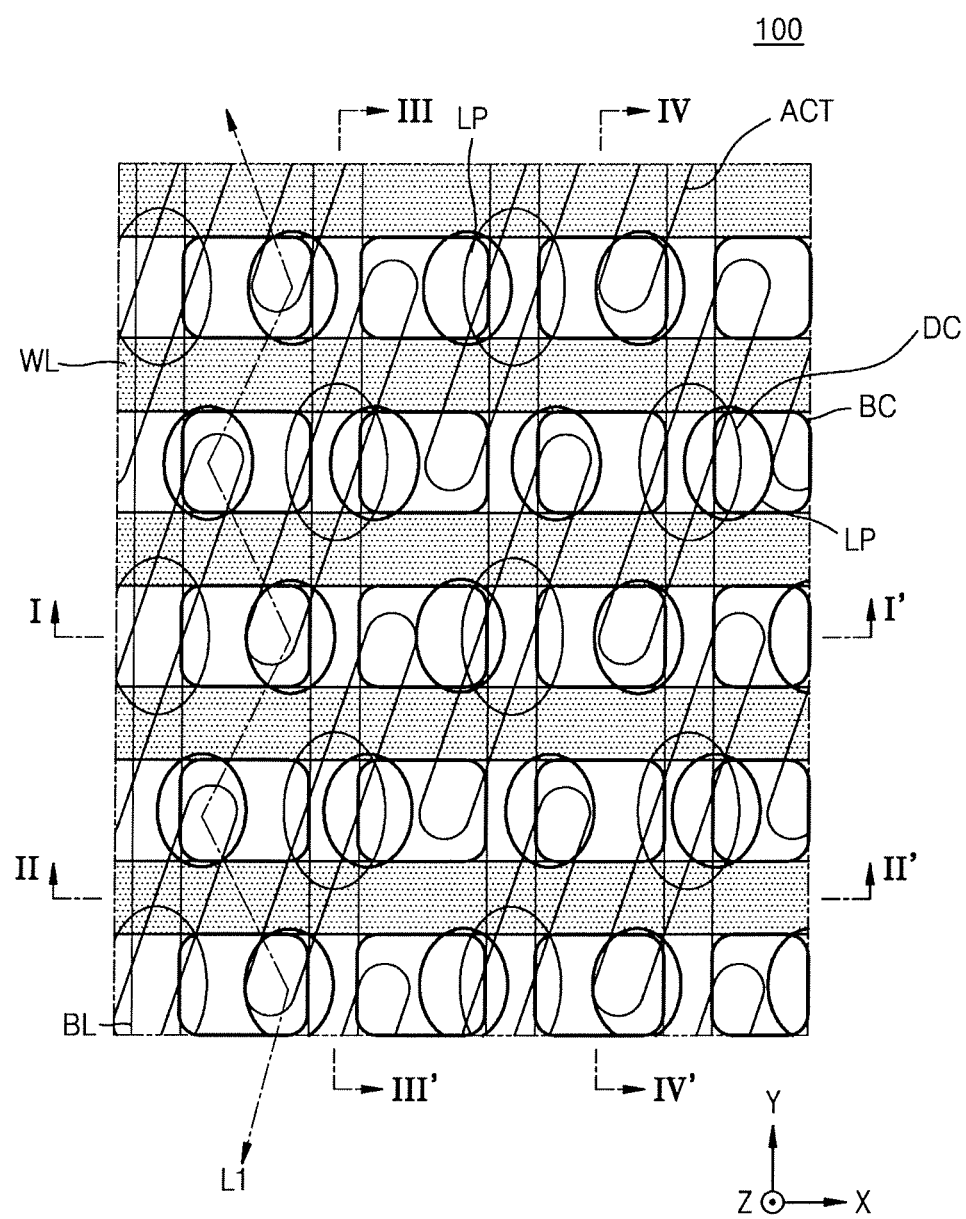
FIG. 18 is a layout diagram of a semiconductor device, illustrating a method of fabricating a semiconductor device, according to an exemplary embodiment of the inventive concept.

FIG. 18 is a layout diagram of a semiconductor device, illustrating a method of fabricating a semiconductor device, according to an exemplary embodiment of the inventive concept.

A semiconductor device 100 may include a plurality of active regions ACT. The active regions ACT may be defined by a device isolation layer 114 of FIG. 19A on a substrate 110 of FIG. 19A. For example, boundaries of the active regions ACT may be defined by the device isolation layer 114. Due to a reduction of design rules of semiconductor devices, each of the active regions ACT may be arranged in a diagonal or oblique bar shape, as shown in FIG. 18.

On the active regions ACT, a plurality of word lines or gate lines WL may be arranged across the active regions ACT, the word lines or gate lines WL extending parallel to each other in a first direction (X-axis direction) and being spaced apart from each other in a second direction. The word lines WL may be arranged at equal intervals. A width of each word line WL or an interval between the word lines WL may be determined according to a design rule. A plurality of bit lines BL may be arranged on the word lines WL, the bit lines BL being orthogonal to the word lines WL and extending parallel to each other in the second direction (Y-axis direction). The bit lines BL may also be arranged at equal intervals. A width of each bit line BL or an interval between the bit lines BL may be determined according to a design rule.

The bit lines BL may be arranged parallel to each other at a pitch of 3F. A pitch may be a center-to-center distance between two elements, for example, the bit lines BL or the word lines WL. In addition, the word lines WL may be arranged parallel to each other at a pitch of 2F. Here, F may refer to a minimum lithographic feature size. When the bit lines BL and the word lines WL are respectively arranged at the pitches set forth above, the semiconductor device may include a memory cell having a unit cell size of 6F2.

The semiconductor device 100 may include various contacts, for example, direct contacts DC or buried contacts BC, landing pads LP, and the like, on the active regions ACT. Here, the direct contacts DC may refer to contacts connecting the active regions ACT to the bit lines BL, and the buried contacts BC may refer to contacts connecting the active regions ACT to lower electrodes of capacitors.

A contact area of a buried contact BC and an active region ACT may be very small due to an arrangement structure thereof. Thus, to increase a contact area with the active region ACT and to increase a contact area with a lower electrode of a capacitor, a landing pad LP may be used. The landing pad LP may be disposed between the active region ACT and the buried contact BC, and may also be disposed between the buried contact BC and the lower electrode of the capacitor. As such, the contact area is increased by using the landing pad, and contact resistance between the active region ACT and the lower electrode of the capacitor may be decreased.

In the semiconductor device 100, the direct contacts DC may be arranged (e.g., disposed) in central portions of the active regions ACT, and the buried contacts BC may be arranged in both end portions of the active regions ACT. Since the buried contacts BC are arranged in both end portions of the active region ACT, the landing pads LP may be adjacent to both ends of the active regions ACT and may partially overlap the buried contacts BC.

The word lines WL are formed to be buried in the substrate of the semiconductor device 100, and may be arranged across the active regions ACT between the direct contacts DC or the buried contacts BC. As shown in FIG. 18, two word lines WL are arranged across one active region ACT, and each of the active regions ACT is obliquely arranged with respect to each of the word lines WL. Accordingly, each active region ACT may be arranged at an angle less than 90° with respect to each of the word lines WL.

The direct contacts DC and the buried contacts BC may be symmetrically arranged, and may be arranged in rows along the X-axis and Y-axis directions. The landing pads LP may be arranged in a zigzag shape L1 in the second direction (Y-axis direction), in which the bit lines BL extend. In addition, the landing pads LP may be arranged to overlap the same side portions of the respective bit lines BL. For example, each of the landing pads LP in a first line may overlap a left side of a corresponding bit line BL, and each of the landing pads LP in a second line may overlap a right side of a corresponding bit line BL.

FIGS. 19A to 26D are cross-sectional views illustrating a method of fabricating the semiconductor device of FIG. 18, according to an exemplary embodiment of the inventive concept.

FIGS. 19A, 20A, 21A, 22A, 23A, 24A, 25A and 26A are cross-sectional views taken along a line I-I' of FIG. 18. FIGS. 19B, 20B, 21B, 22B, 23B, 24B, 25B, and 26B are cross-sectional views taken along a line II-II' of FIG. 18. FIGS. 19C, 20C, 21C, 22C, 23C, 24C, 25C and 26C are cross-sectional views taken along a line III-III' of FIG. 18. FIGS. 19D, 20D, 21D, 22D, 23D, 24D, 25D and 26D are cross-sectional views taken along a line IV-IV' of FIG. 18. FIGS. 19E, 20E, 21E, 22E, and 23E are plan views. In addition, in each of the plan views, lines I-I', II-II', III-III', and IV-IV' correspond to the lines I-I', II-II', III-III', and IV-IV' in FIG. 18.

In the description below, elements described in FIG. 18 with reference to first identifiers may be referred to below using second identifiers. For example, the active regions are identified using the reference "ACT" in FIG. 18, while in FIGS. 19A to 19E, the active regions are identified using the reference "116". Referring to FIGS. 19A to 19E, a device isolation trench 112 may be formed in a substrate 110, and a device isolation layer 114 may be formed in the device isolation trench 112. An active region 116 may be defined in the substrate 110 by the device isolation layer 114. Referring to FIG. 18, the active region 116, which corresponds to the active region ACT of FIG. 18, may have a relatively long island shape having a minor axis and a major axis, and may be obliquely arranged to have an angle less than 90° with respect to a word line 124 (word line or gate line WL), which is formed on the active region 116 (active region ACT). The substrate 110 may be a silicon wafer, for example, a silicon (Si) substrate. The substrate 110 may include crystalline silicon, polycrystalline silicon, or amorphous silicon.

Figure 19A:
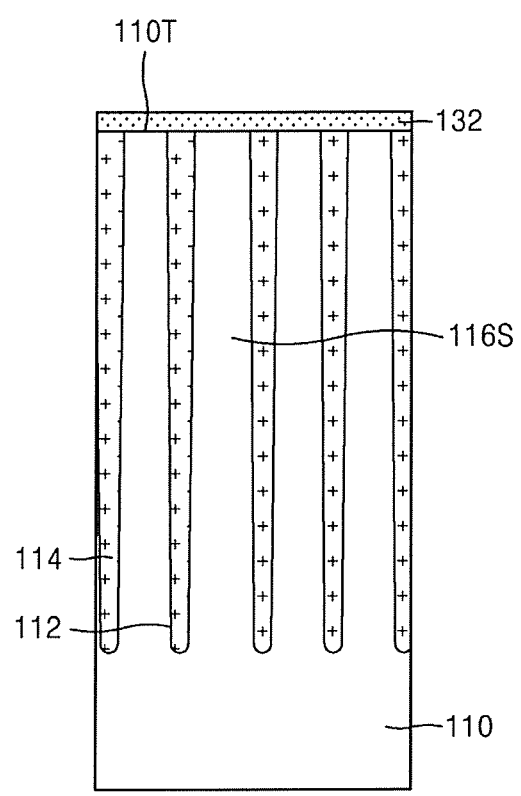
FIGS. 19A to 26D are cross-sectional views illustrating a method of fabricating the semiconductor device of FIG. 18, according to an exemplary embodiment of the inventive concept.
Figure 19B:
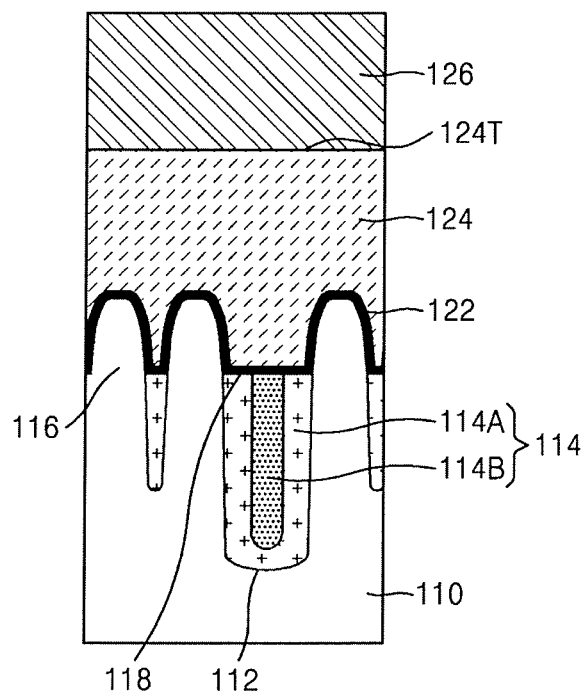
Figure 19C:
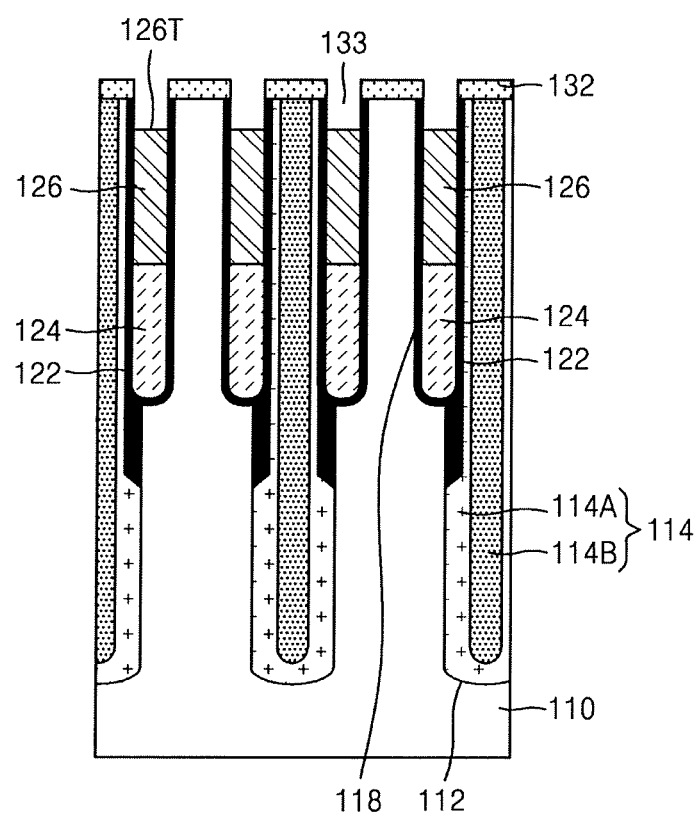
Figure 19D:
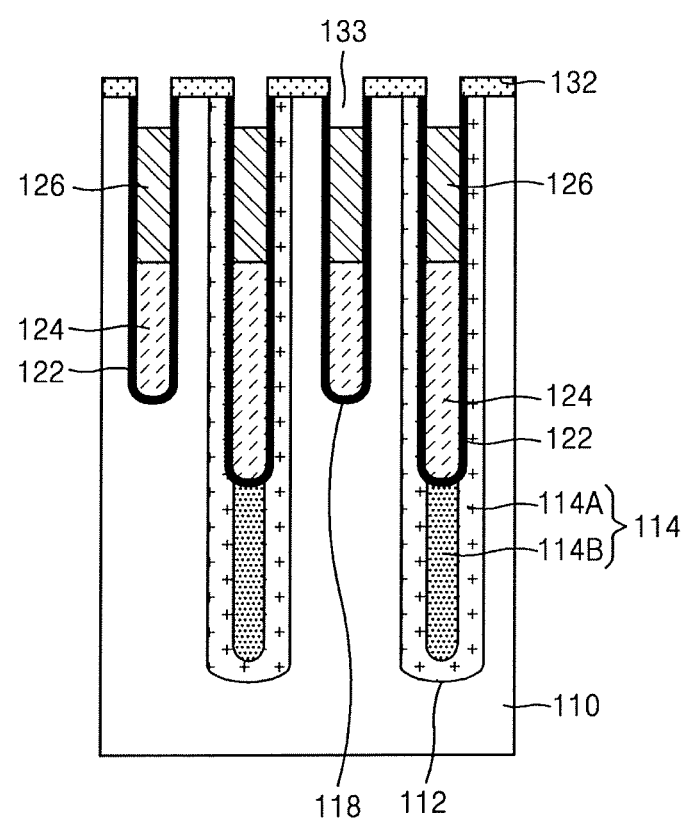
Figure 19E:
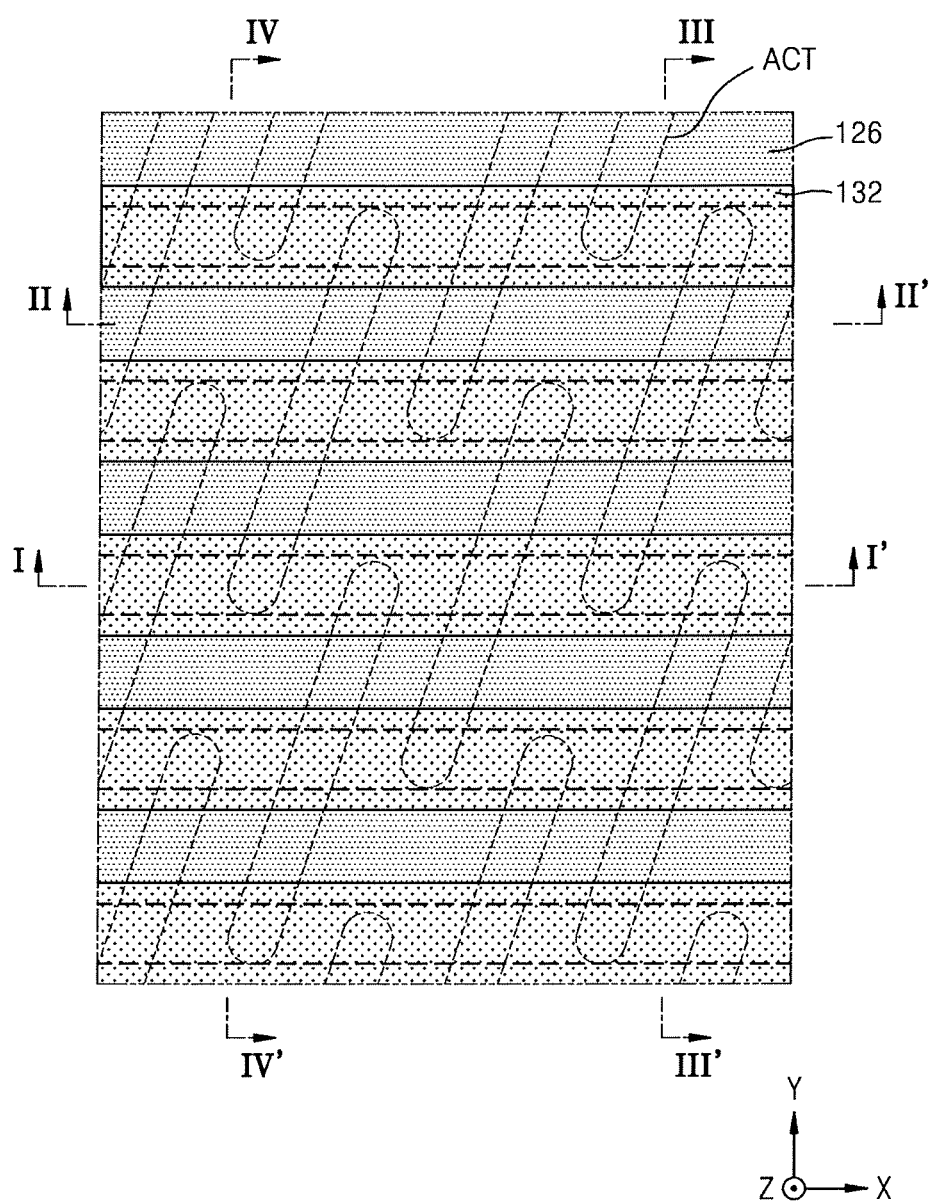
Figure 20A:
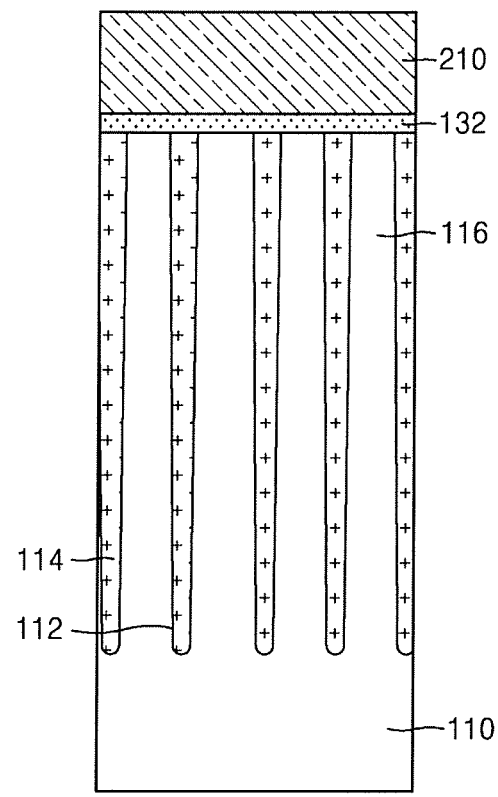
Figure 20B:
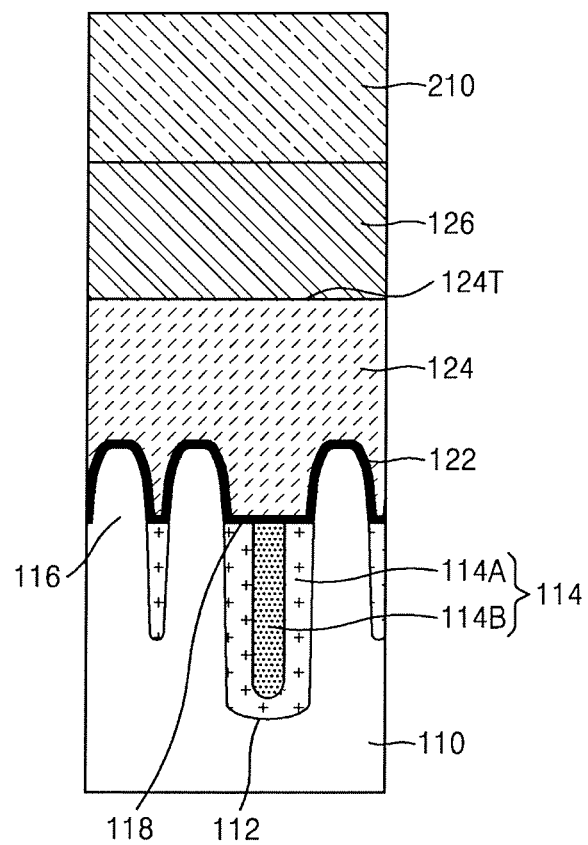
Figure 20C:
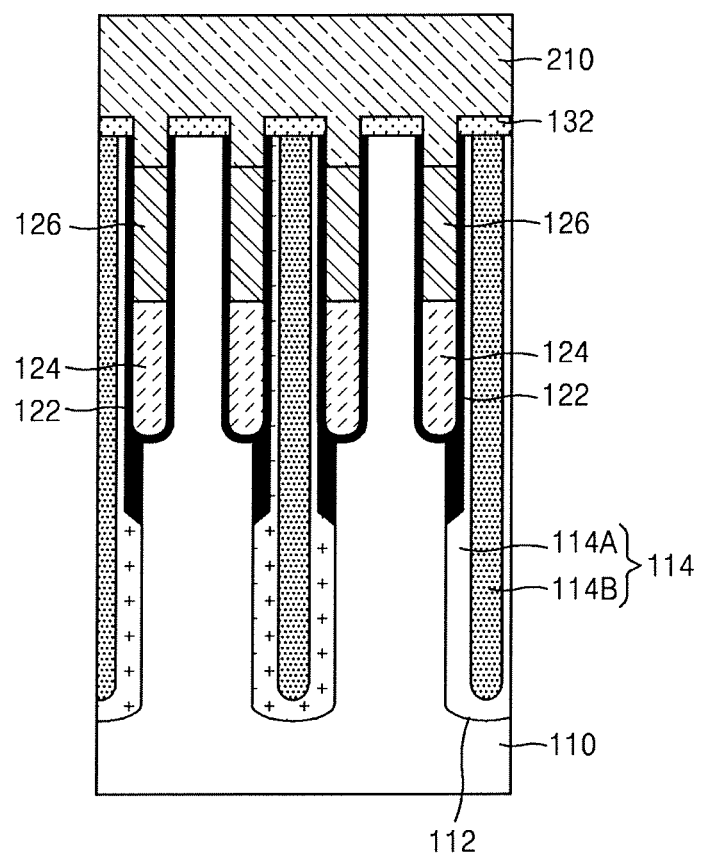
Figure 20D:
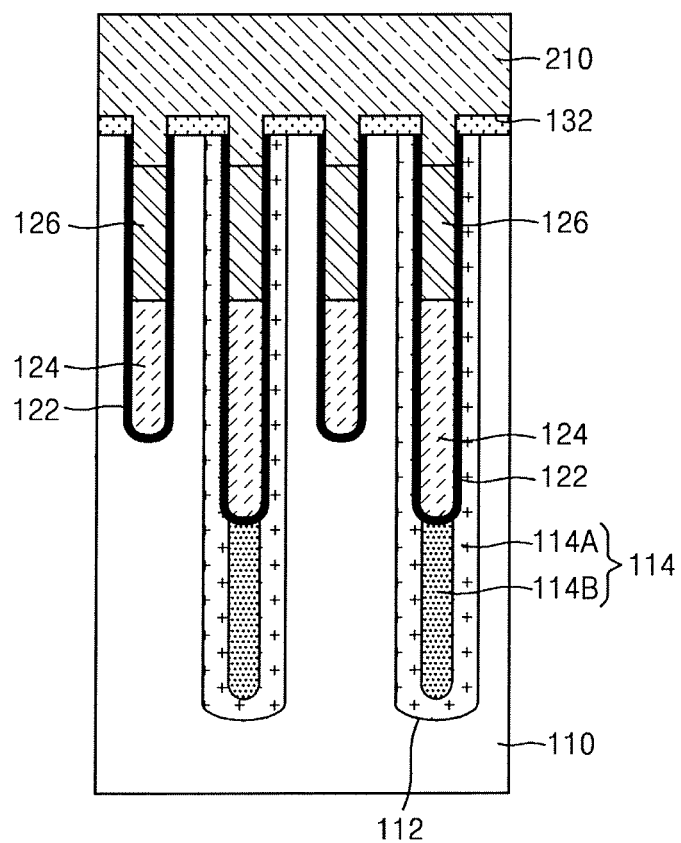
Figure 20E:
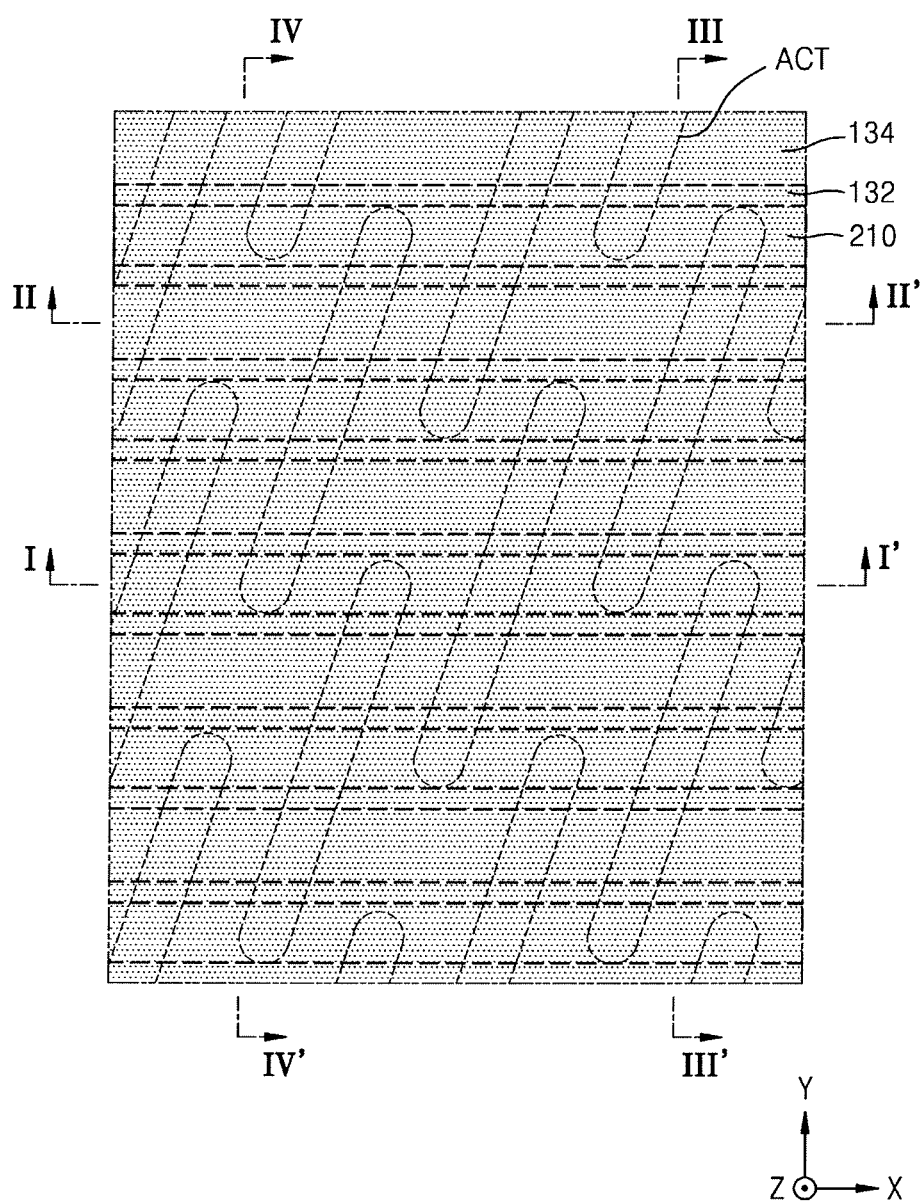

The device isolation layer 114 may include one insulating layer, or may include an outer insulating layer 114A and an inner insulating layer 114B, as shown in FIGS. 19B and 19D. The outer insulating layer 114A and the inner insulating layer 114B may include different materials. For example, the outer insulating layer 114A may include an oxide layer, and the inner insulating layer 114B may include a nitride layer.

A plurality of word line trenches 118 are formed in the substrate 110. The word line trenches 118 extend parallel to each other, and each of the word line trenches 118 may have a line shape across the active region 116. A gate dielectric layer 122, a word line 124, and a buried insulating layer 126 may be formed in each of the word line trenches 118 in this stated order.

In an exemplary embodiment of the inventive concept, after the word line 124 is formed, a source/drain region may be formed in an upper portion of the active region 116 by implanting impurity ions into the substrate 110 on both sides of the word line 124. A source region 116S is shown in FIG. 19A. A direct contact DC, as shown in FIG. 18, may be connected to the source region 116S. In an exemplary embodiment of the inventive concept, before the word line 124 is formed, an impurity ion implantation process for forming the source/drain region may be performed.

A top surface 124T of the word line 124 may be lower than a top surface 110T of the substrate 110. For example, the top surface 124T of the word line 124 may be disposed closer to an unetched surface of the substrate 110 than the top surface 110T of the substrate 110. A bottom surface of the word line 124 may have an uneven shape, as shown in FIG. 19B, and a saddle fin-structured transistor (saddle FINFET) may be formed in the active region 116. In an exemplary embodiment of the inventive concept, the word line 124 may include Ti, TiN, Ta, TaN, W, WN, TiSiN, and/or WSiN.

The gate dielectric layer 122 may include a silicon oxide film, a silicon nitride film, a silicon oxynitride film, oxide/nitride/oxide (ONO), and/or a high-K dielectric film having a higher dielectric constant than a silicon oxide film. The high-K dielectric film may have a dielectric constant of about 10 to about 25. The high-K dielectric film may include hafnium oxide (HfO), hafnium oxide nitride (HfON), lanthanum oxide (LaO), titanium oxide (TiO), aluminum oxide (AlO), or zirconium oxide (ZrO).

An interlayer dielectric 132 exposing the buried insulating layer 126, may be formed on the buried insulating layer 126, the substrate 110, and the device isolation layer 114. The interlayer dielectric 132 may be formed to expose the buried insulating layer 126. The interlayer dielectric 132 may include an oxide film. For example, the interlayer dielectric 132 may include tetraethyl orthosilicate (TEOS), high density plasma (HDP) oxide, or borophosphosilicate glass (BPSG). The interlayer dielectric 132 may have a thickness of about 200 Å to about 400 Å.

As shown in FIG. 19C, a recessed groove 133 may be formed by recessing the buried insulating layer 126. In this case, a top surface 126T of the buried insulating layer 126 may be lower than the top surface 110T of the substrate 110. For example, the top surface 126T of the buried insulating layer 126 may be disposed closer to an unetched surface of the substrate 110 than the top surface 110T of the substrate 110. When the buried insulating layer 126 is recessed, a channel length may be increased.

Referring to FIGS. 20A to 20E, a first polysilicon layer 210 doped with impurities is formed on the interlayer dielectric 132 and the buried insulating layer 126, as shown in FIGS. 20A to 20E. The first polysilicon layer 210 may be formed on entire surfaces of the interlayer dielectric 132 and the buried insulating layer 126. The first polysilicon layer 210 may fill the recessed groove 133.

Then, referring to FIGS. 21A to 21E, a mask pattern 212 is formed on the first polysilicon layer 210. The mask pattern 212 may be a photoresist pattern formed by a photolithography process. For example, the mask pattern 212 may be formed by forming a photoresist layer on the first polysilicon layer 210, followed by exposing and developing the photoresist layer.

The first polysilicon layer 210, the interlayer dielectric 132, and the substrate 110 are etched by using the mask pattern 212 as an etch mask to form a plurality of direct contact holes 130H. Each of the direct contact holes 130H may include a partial surface of the substrate 110 or the interlayer dielectric 132.

Figure 21A:
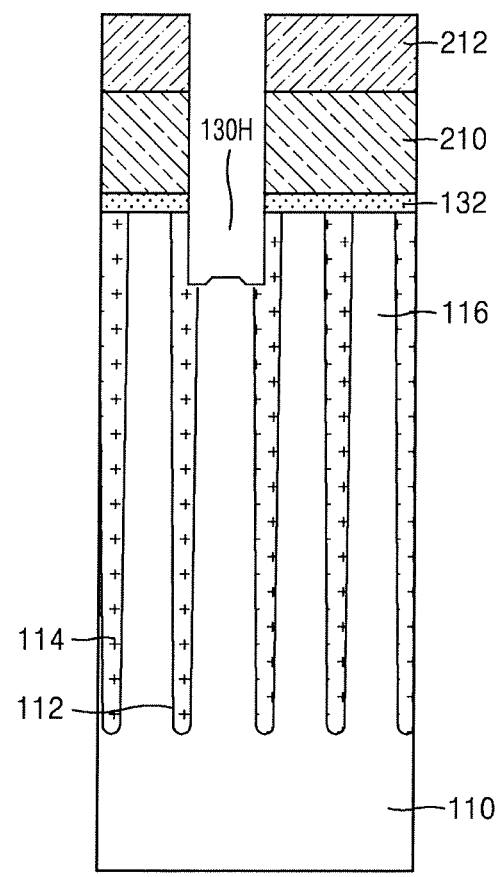
Figure 21B:
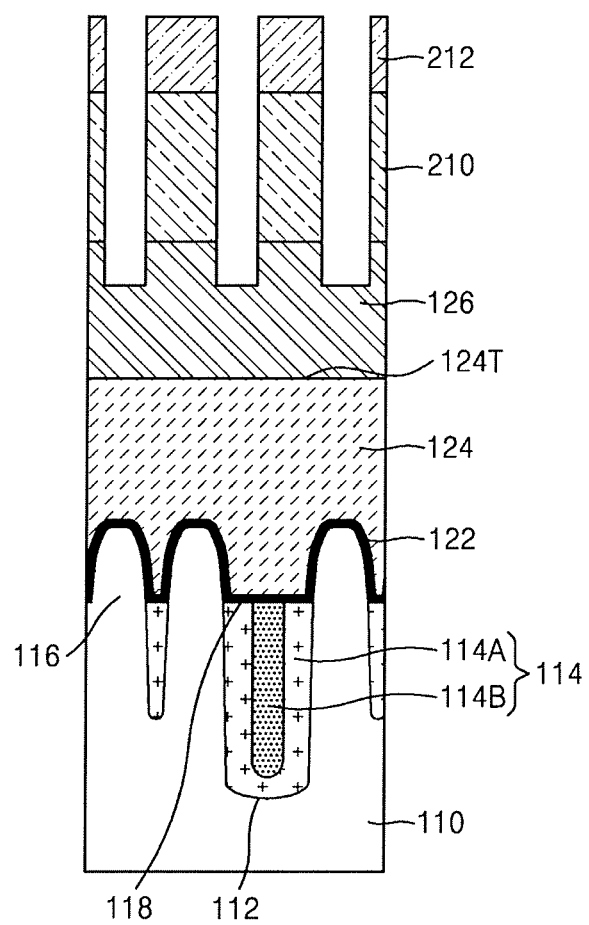
Figure 21C:
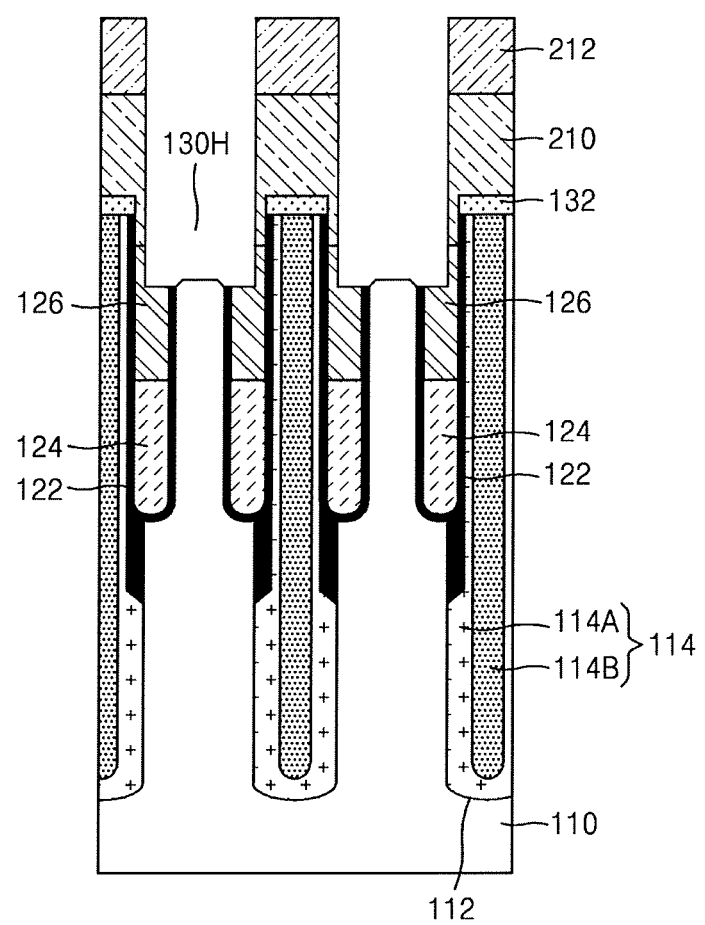
Figure 21D:
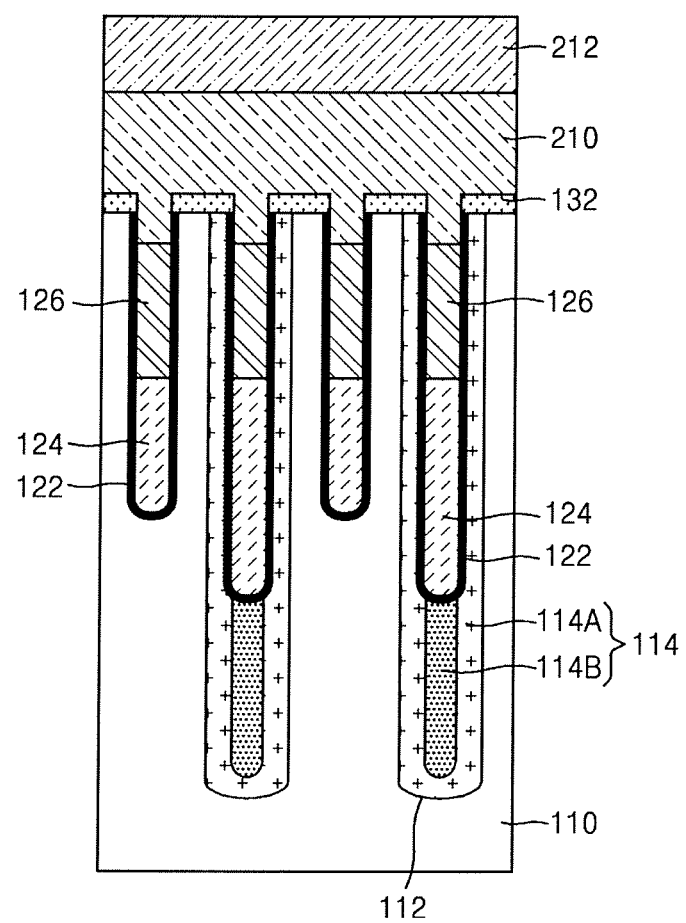
Figure 21E:
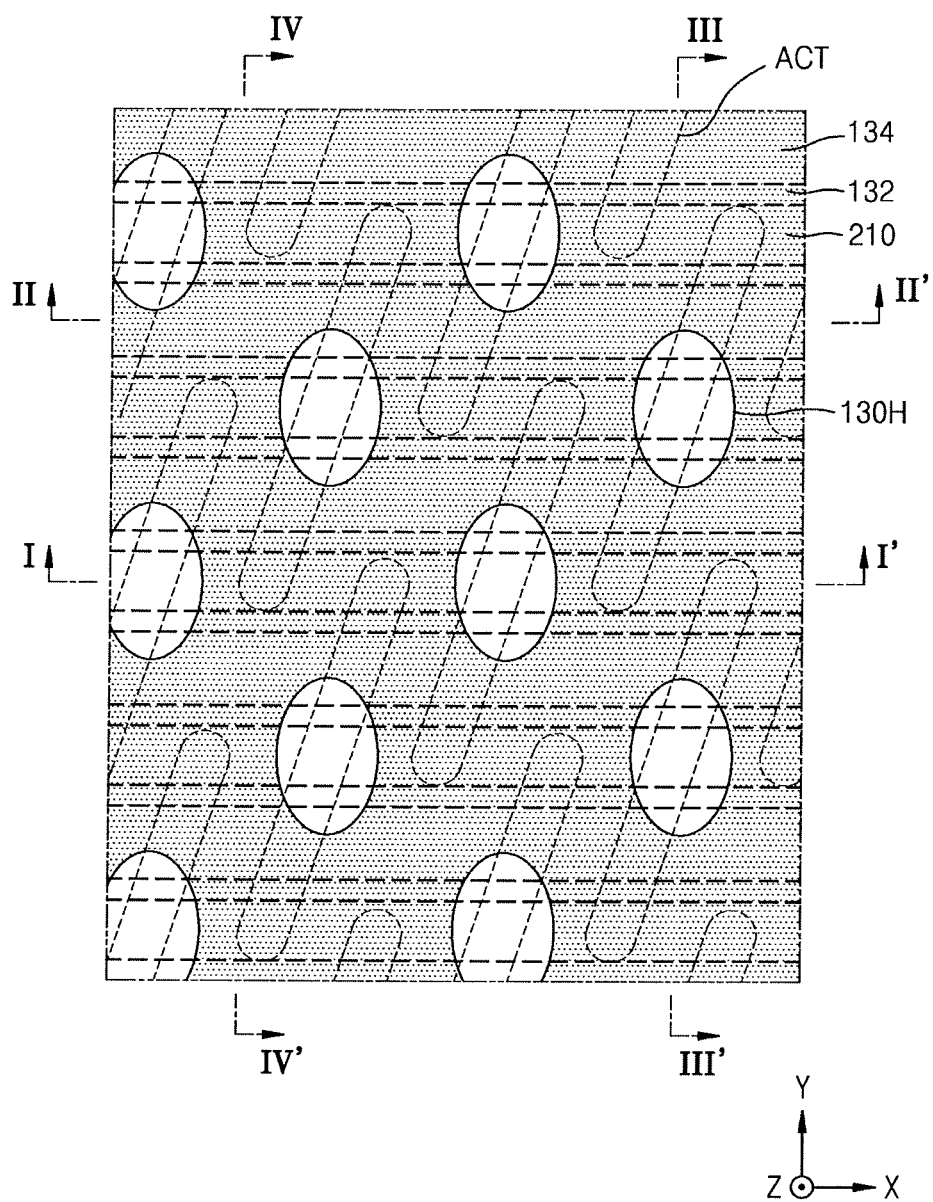

As shown in FIG. 21E, the direct contact holes 130H may be spaced apart from each other in the first direction (X-axis direction) and the second direction (Y-axis direction). As shown in FIG. 21E, the direct contact holes 130H may be spaced apart from each other in the first direction (X-axis direction) and the second direction (Y-axis direction), and the direct contact holes 130H may be formed between buried insulating films 134 (described below), which are formed on word lines WL. The direct contact holes 130H may expose the source region 160S of the active region 116. The direct contact holes 130H may be direct contact holes formed parallel to the bit line BL in the second direction.

Referring to FIGS. 22A to 22E, the mask pattern 212 is removed. Then, a second polysilicon layer 218 doped with impurities is formed on the first polysilicon layer 210, and the second polysilicon layer 218 fills the direct contact holes 130H. The second polysilicon 218 may be formed on the entire substrate 110. Then, the second polysilicon 218 may be etched back.

In FIGS. 22A to 22E, the first and second polysilicon layers 210 and 218 may be depicted as a same layer and may be collectively represented by the reference numeral 218. The second polysilicon layer 218 may fill the direct contact holes 13014 and may be formed on the interlayer dielectric 132 and the buried insulating layer 126.

Figure 22A:
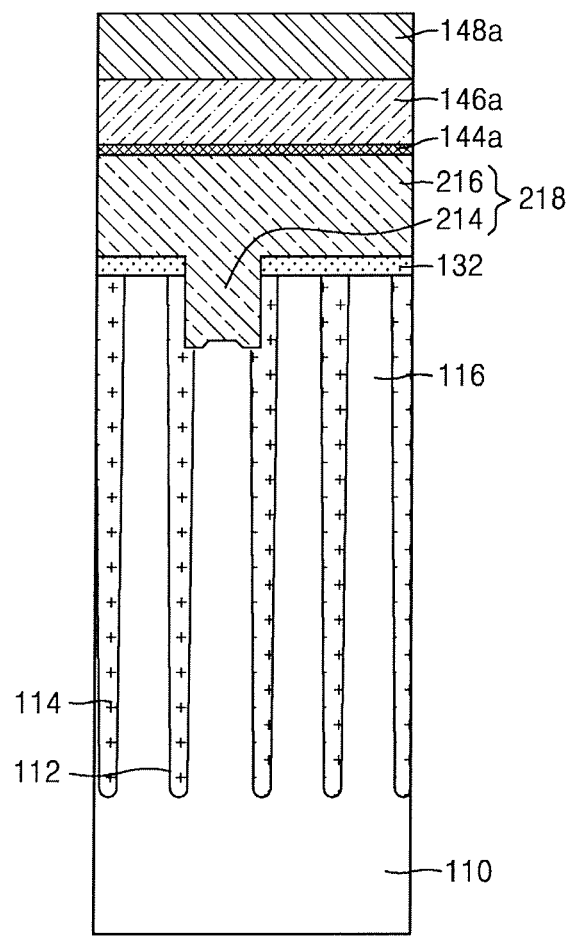
Figure 22B:
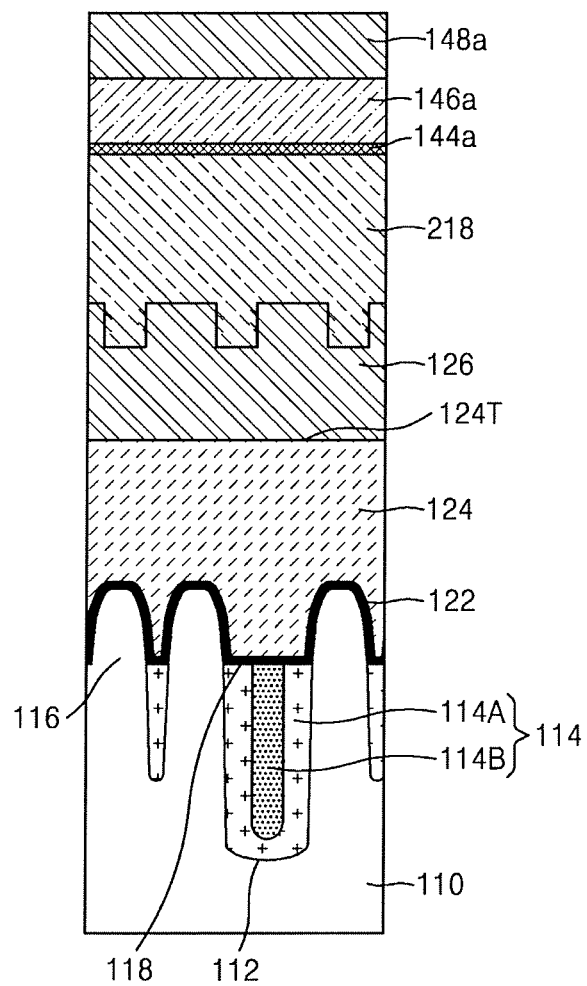
Figure 22C:
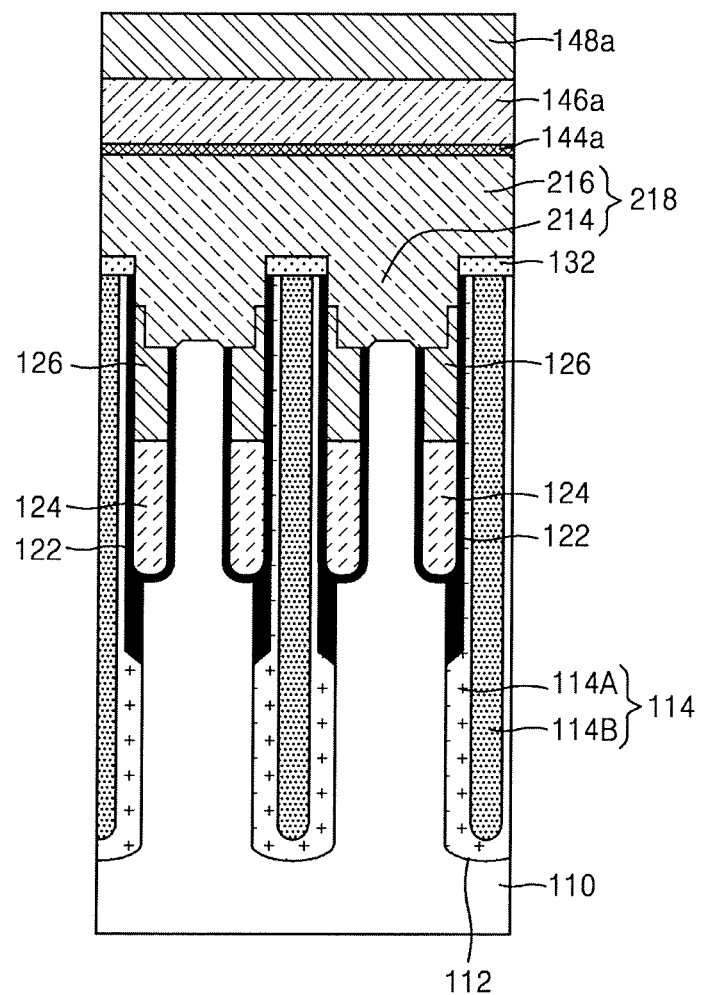
Figure 22D:
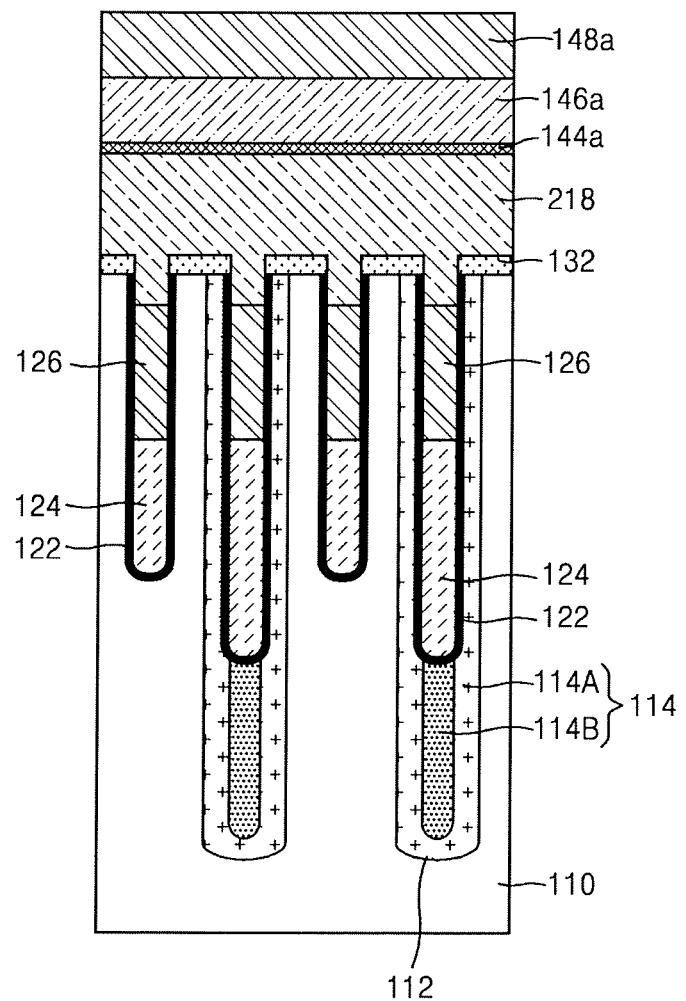
Figure 22E:
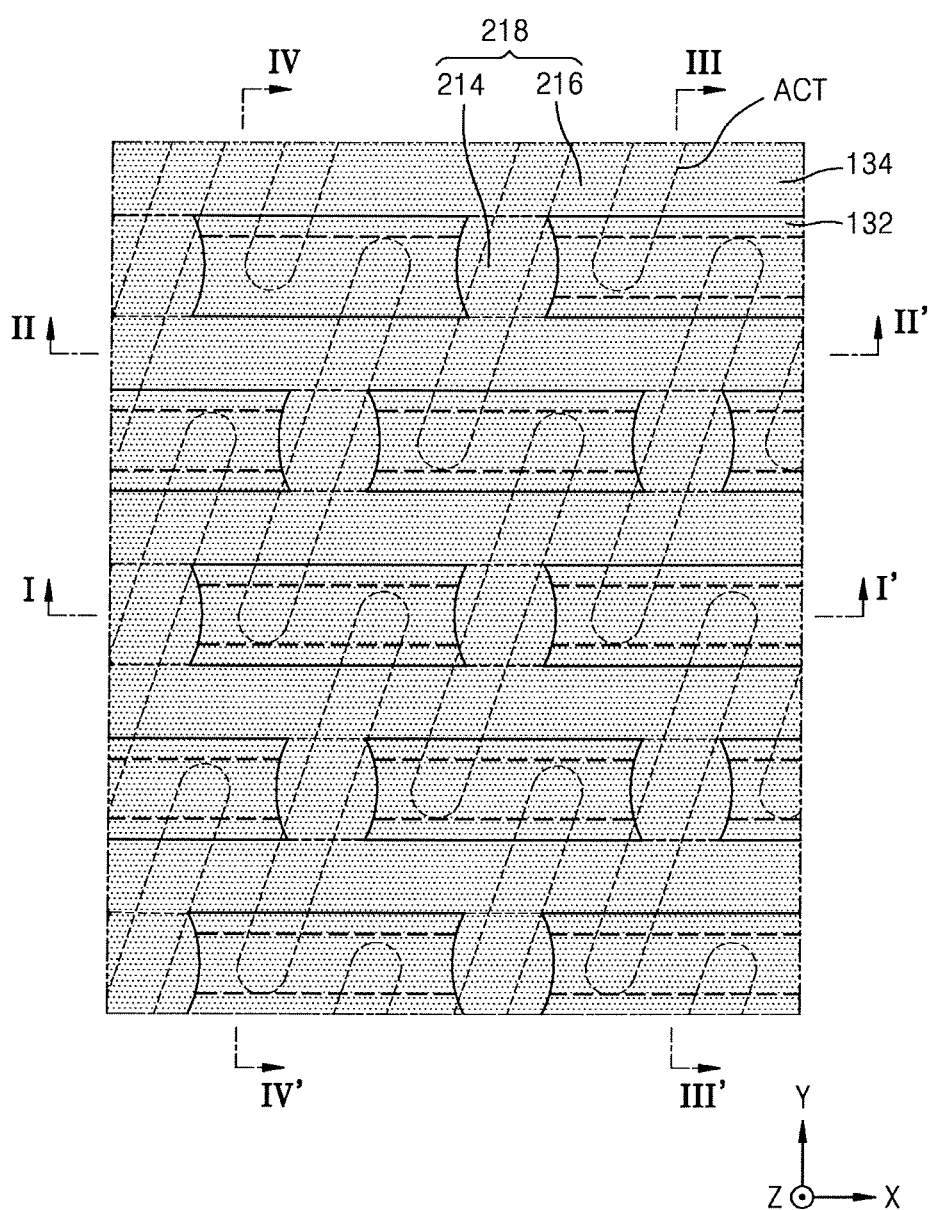
Figure 23A:
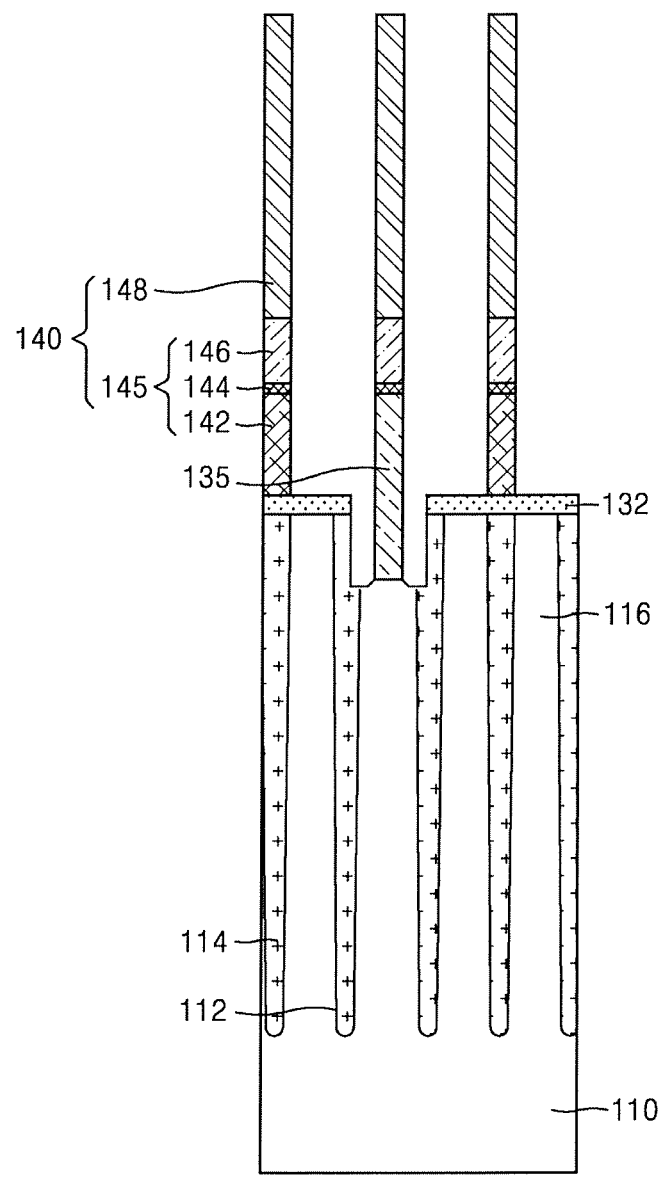
Figure 23B:
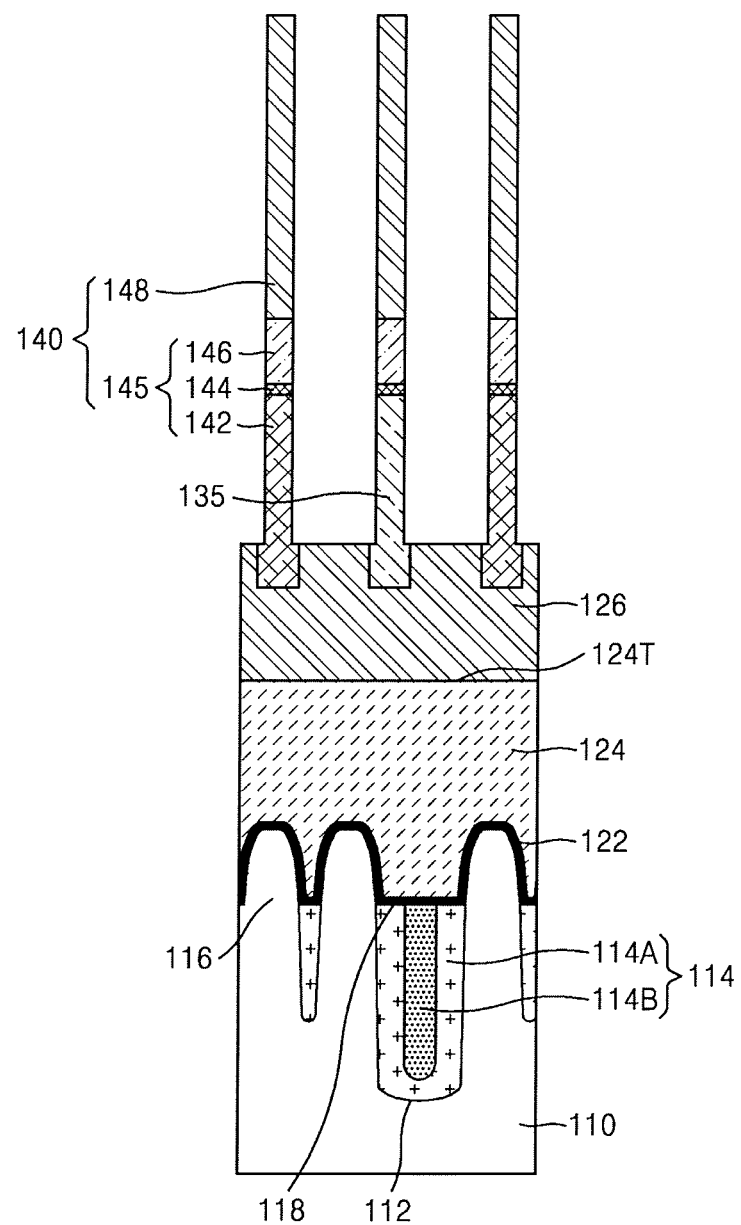
Figure 23C:
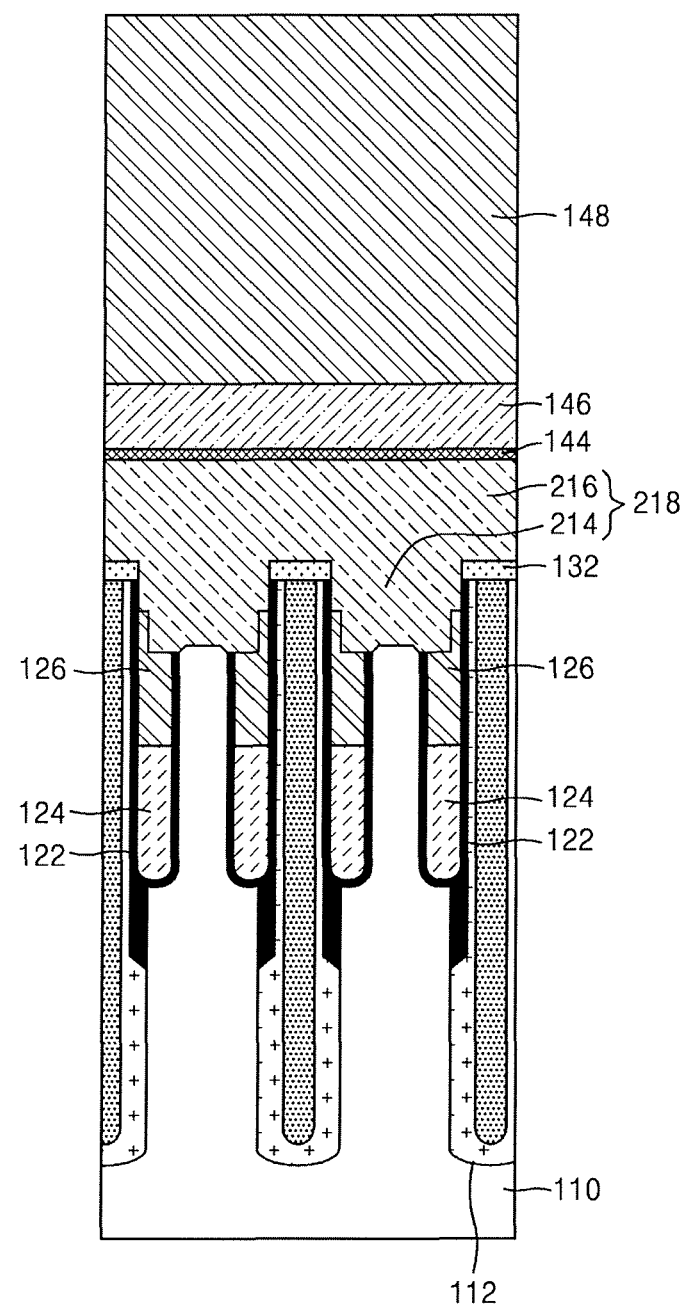
Figure 23D:
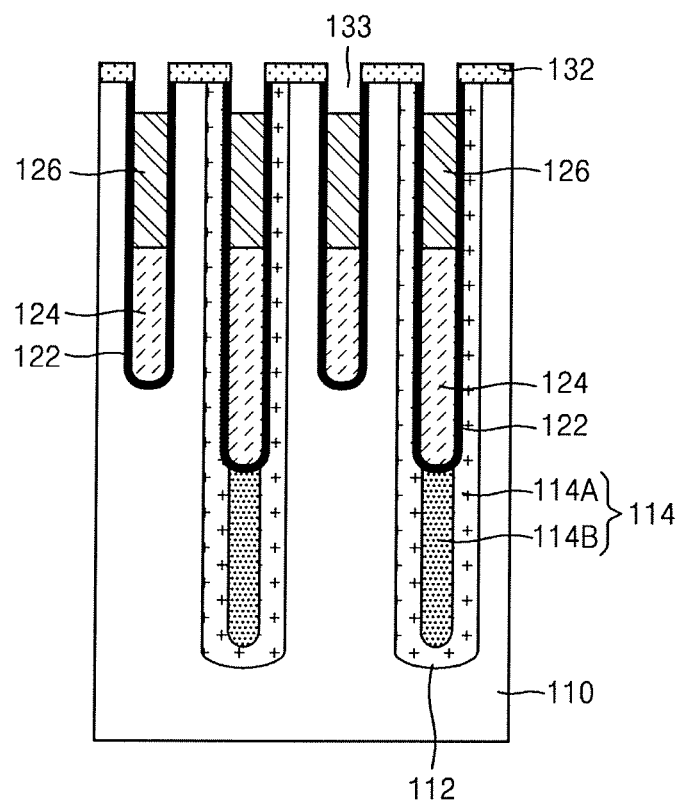
Figure 23E:
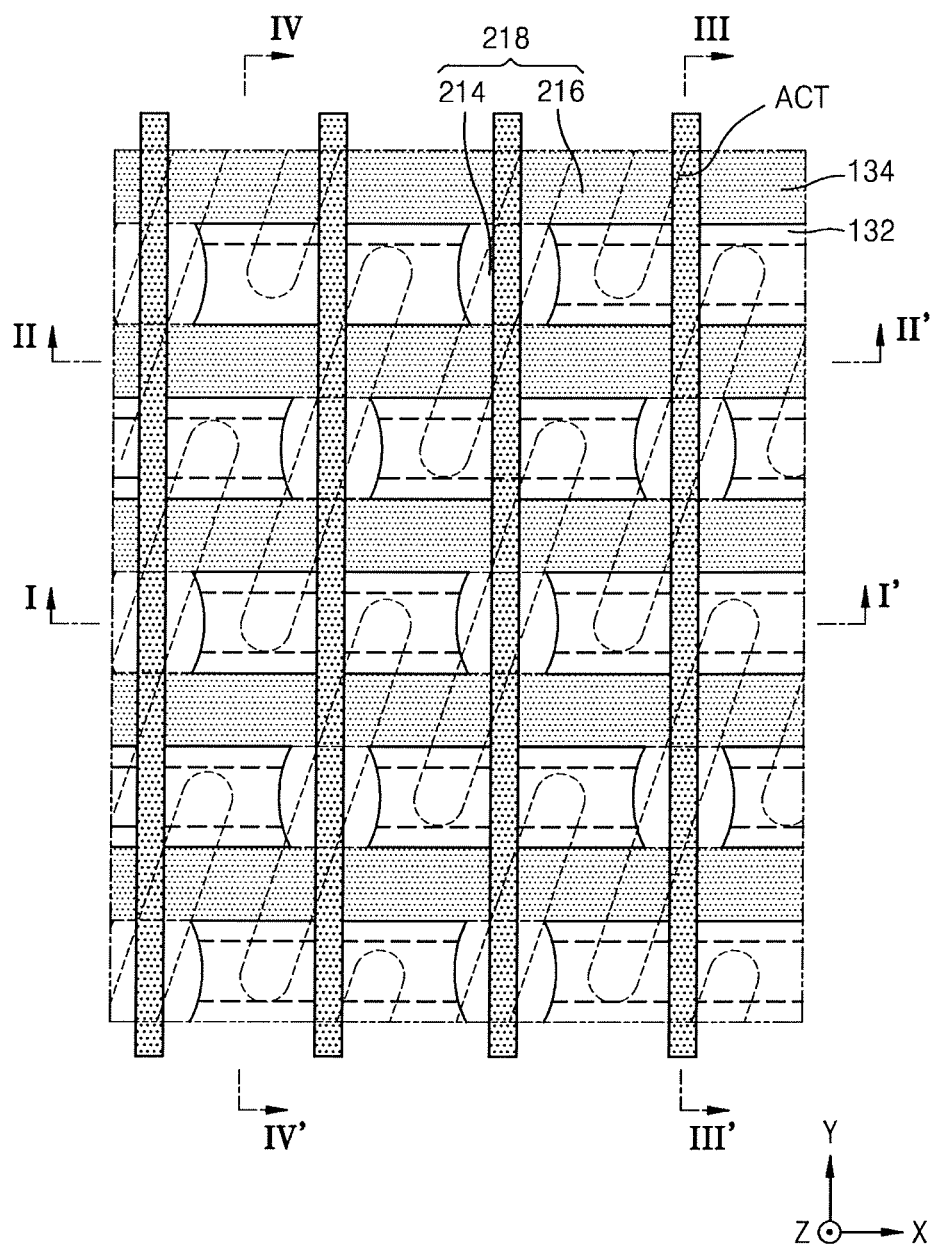
Figure 24A:
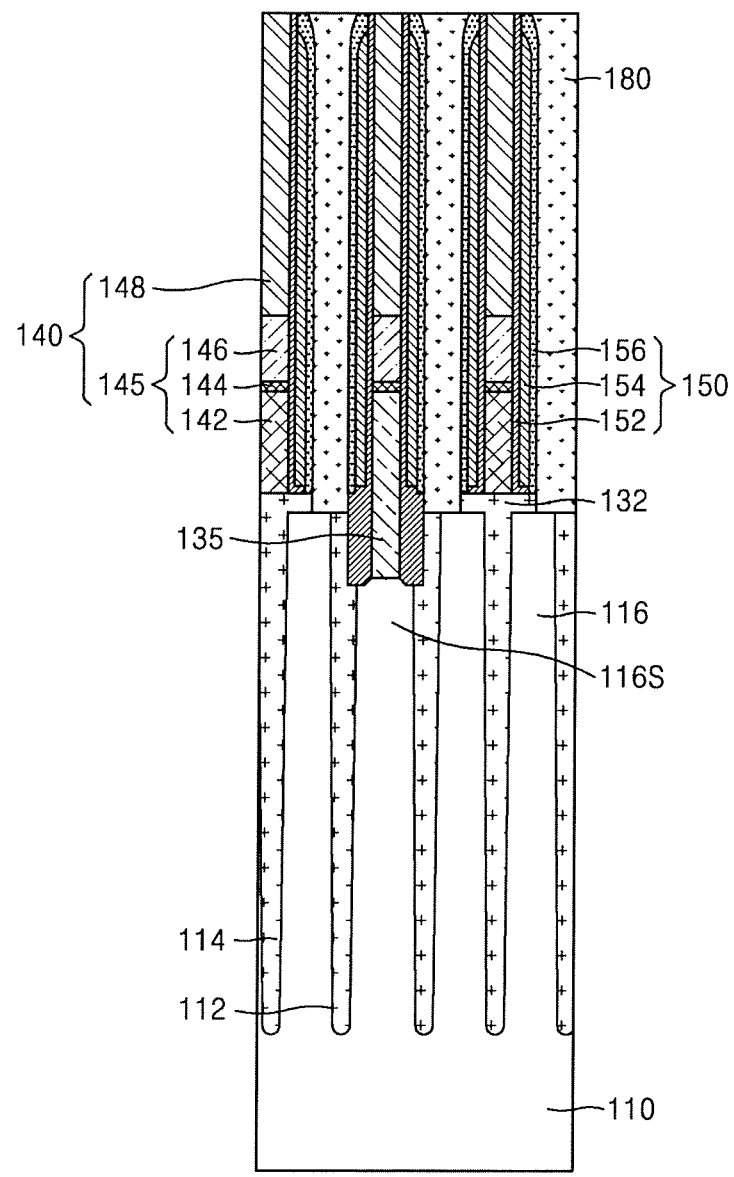
Figure 24B:
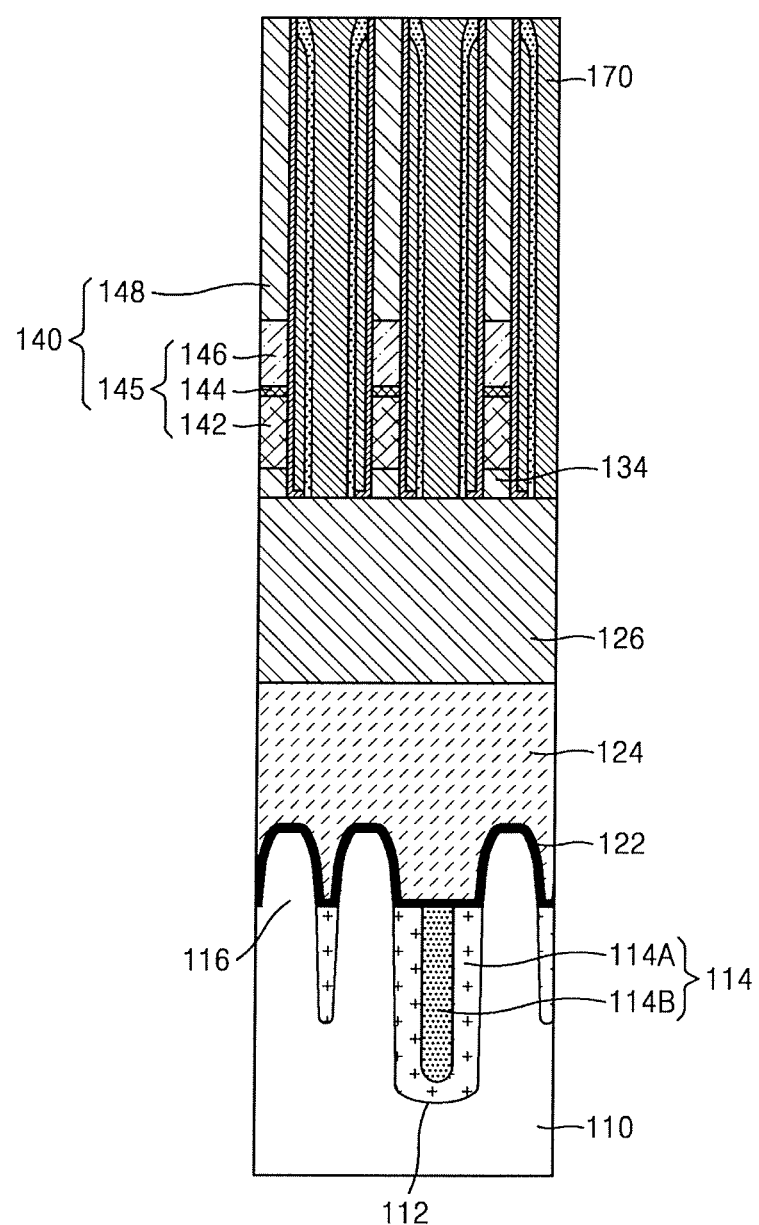
Figure 24C:
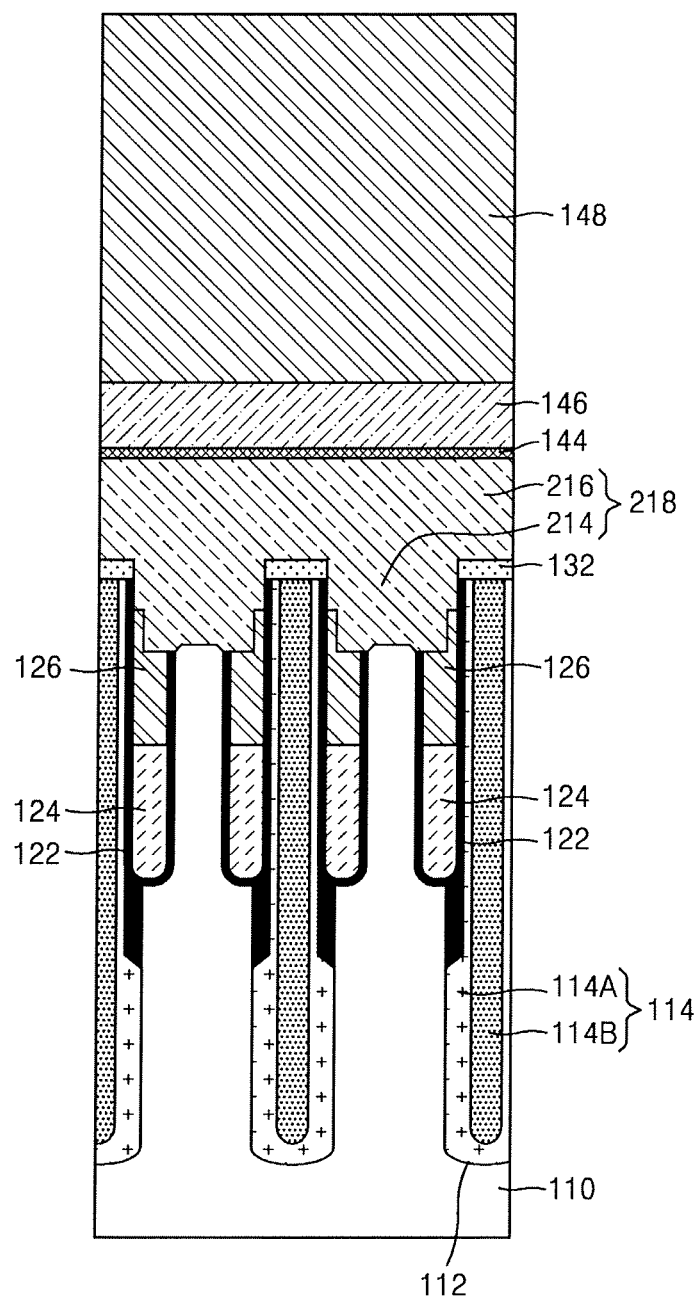
Figure 24D:
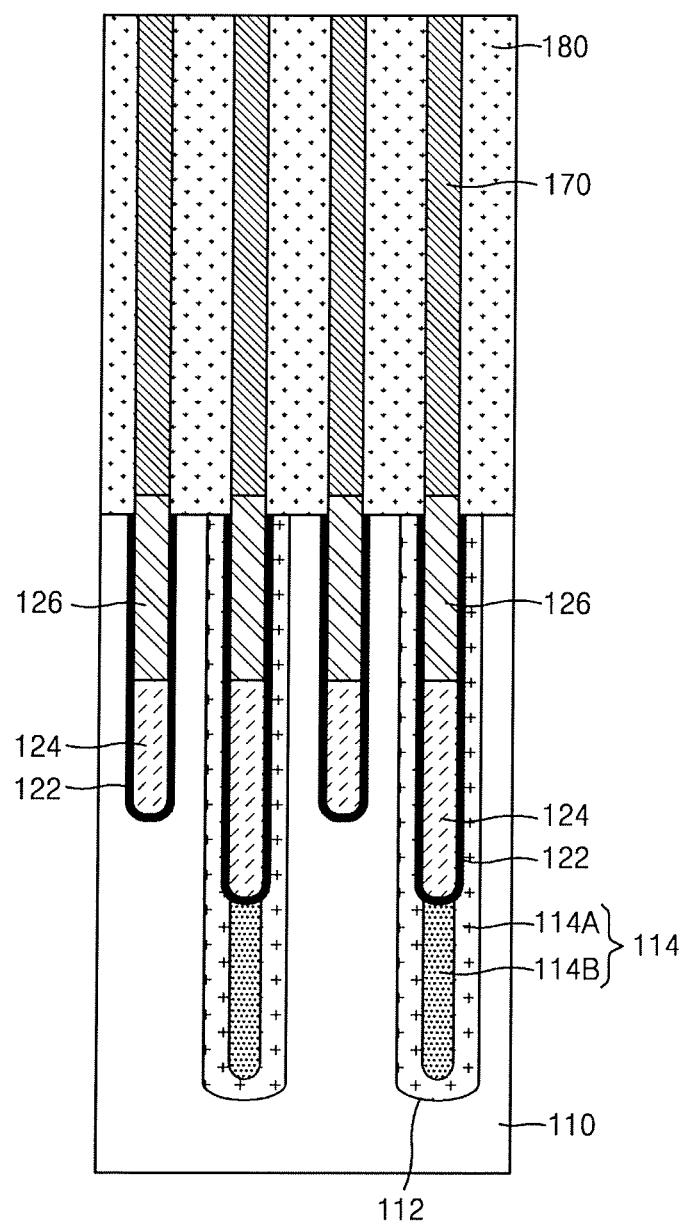
Figure 25A:
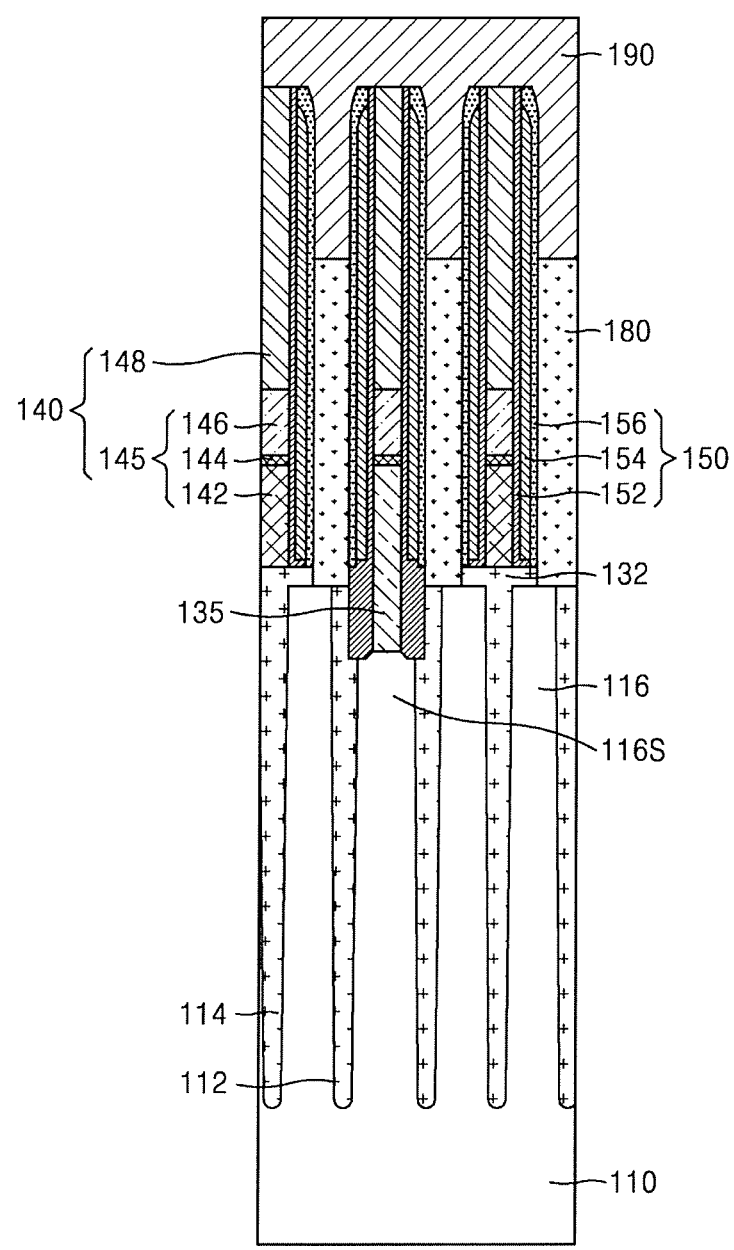
Figure 25B:
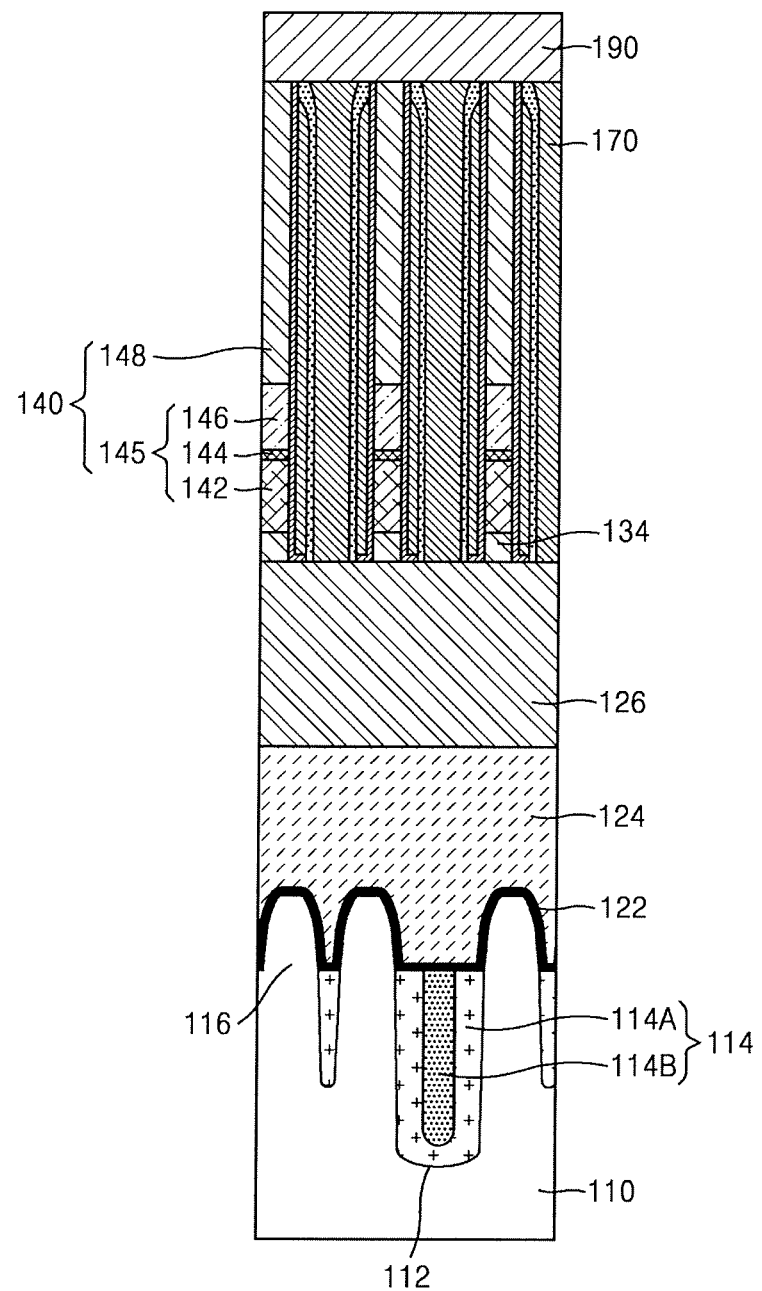
Figure 25C:
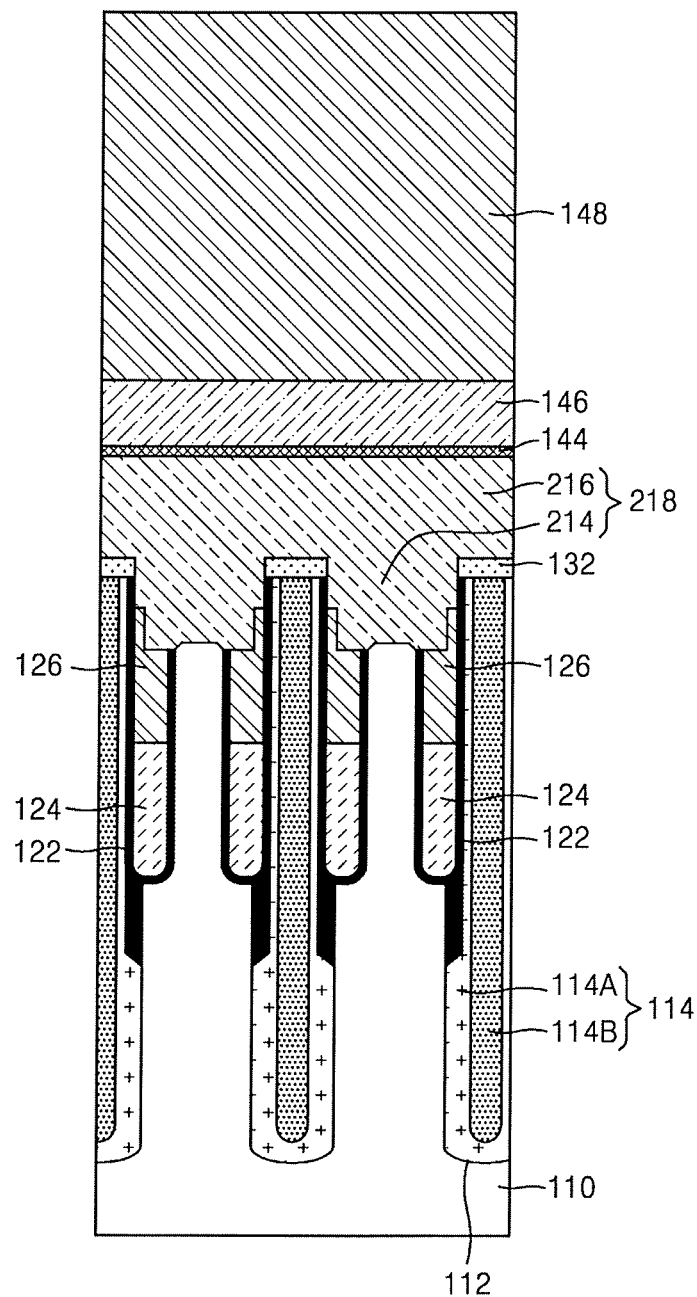
Figure 25D:
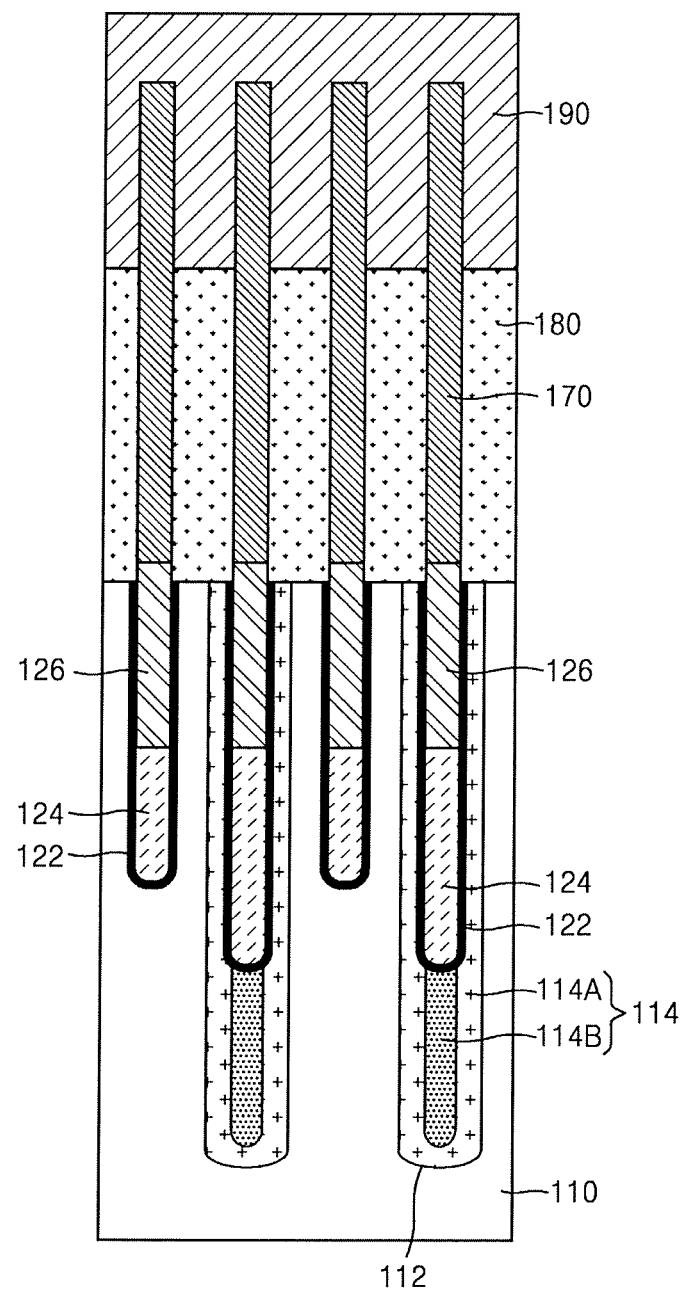
Figure 26A:
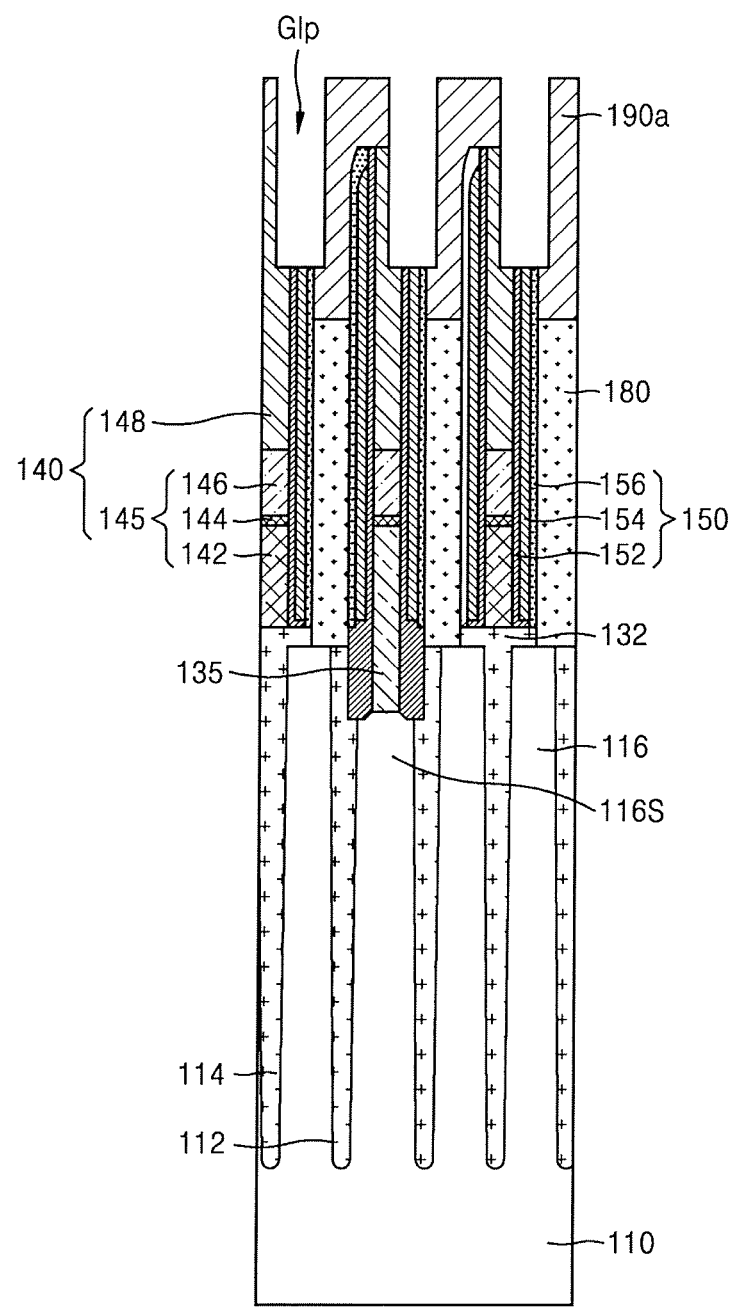
Figure 26B:
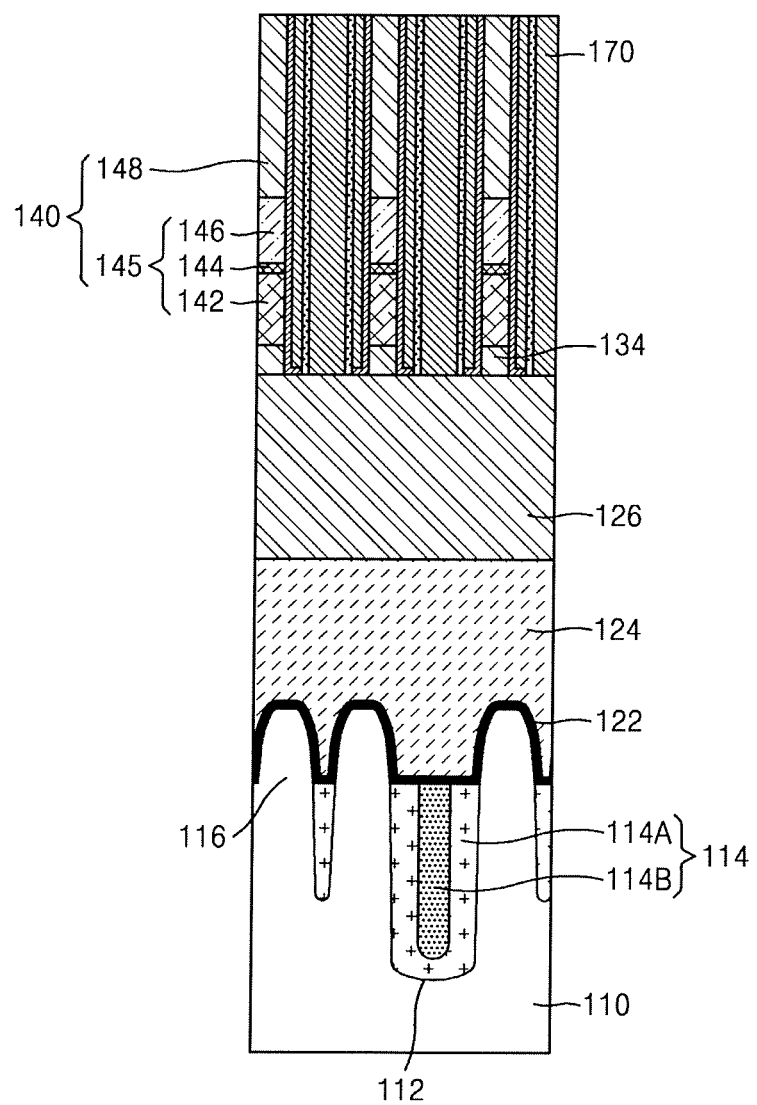
Figure 26C:
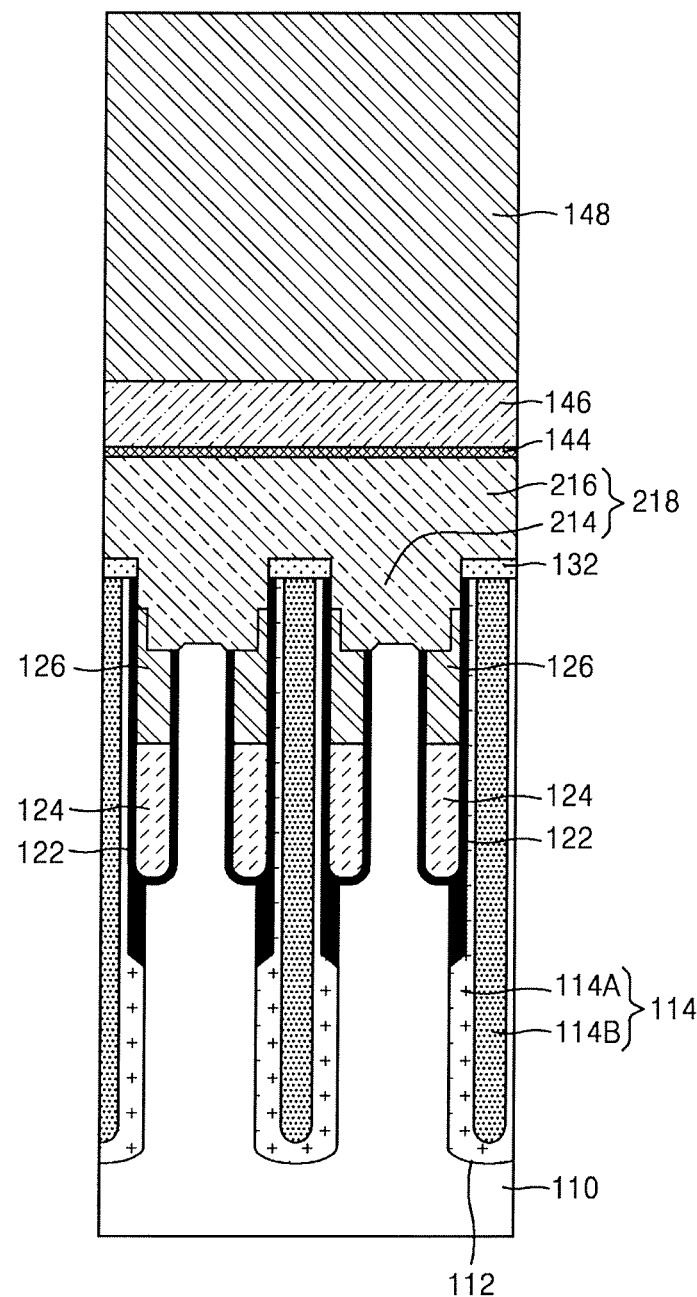
Figure 26D:
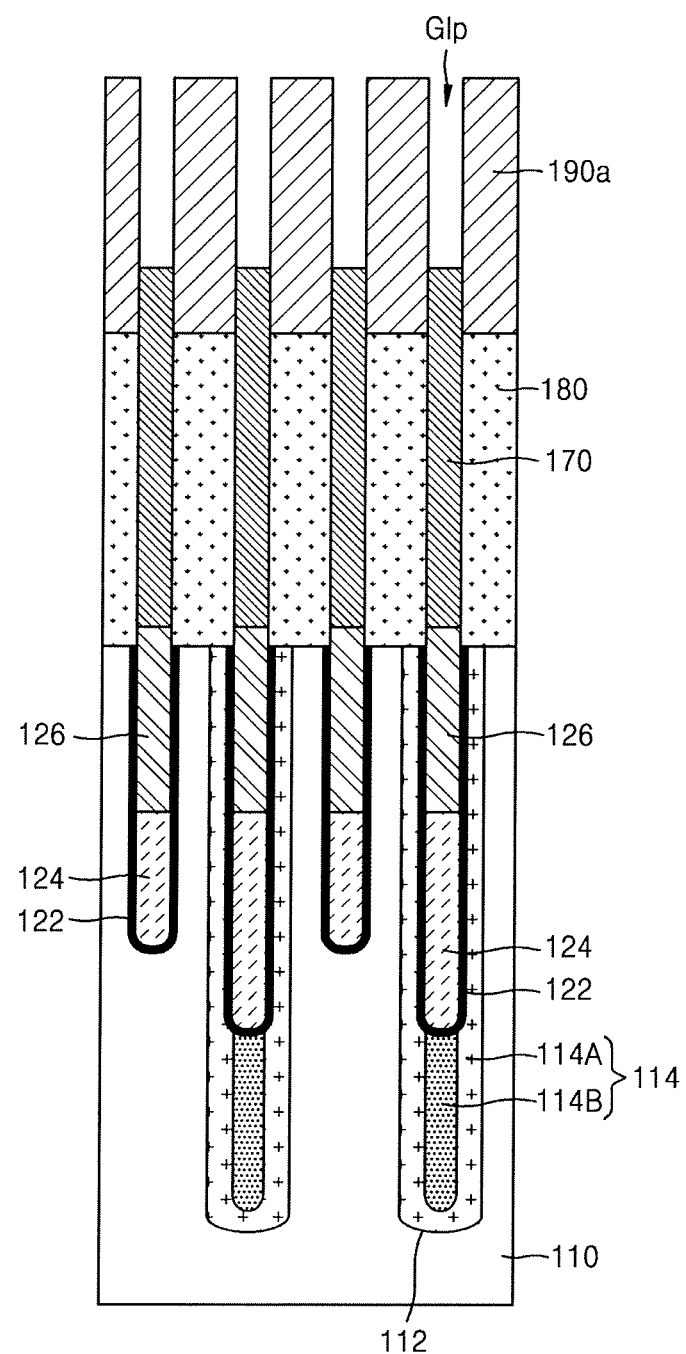

As shown in FIG. 22E, the second polysilicon layer 218 may include contact layers 214 disposed on the substrate 110 and a surrounding layer 216 surrounding the contact layers 214. The contact layers 214 may be spaced apart from each other in the first and second directions. The contact layers 214 may refer to portions of the second polysilicon layer 218, which fill the direct contact holes 130H. The surrounding layer 216 refers to a portion of the second polysilicon layer 218, which does not fill the direct contact holes 130H.

Then, metal layers 144a and 146a and a capping layer 148a are formed on the second polysilicon layer 24. The metal layers 144a and 146a and the capping layer 148a may be included in a wiring layer. The metal layers 144a and 146a may be formed on the contact layers 214 and the surrounding layer 216. The metal layers 144a and 146a may include a barrier metal layer 144a, for example, a tungsten nitride layer, and a main metal layer 146a, for example, a tungsten layer. The capping layer 148a may include an insulating layer, for example, a nitride layer. The metal layers 144a and 146a and the capping layer 148a are not shown in FIG. 22E for convenience.

Referring to FIGS. 23A to 23E, the capping layer 148a, the metal layers 144a and 146a, and the second polysilicon layer 218 are subjected to photolithography and etching processes to form a bit line 145, a direct contact 135, and a capping pattern 148 on the substrate 110. For example, the capping layer 148a, the metal layers 144a and 146a, the contact layers 214, and the surrounding layer 216 are subjected to photolithography and etching processes to form the bit line 145, the direct contact 135, and the capping pattern 148 over the substrate 110.

The bit line 145, the direct contact 135, and the capping pattern 148 may be formed by the following processes.

A mask pattern including a photoresist pattern formed by a photolithography process is formed on the capping layer 148a. For example, the mask pattern may be formed by forming a photoresist layer on the capping layer 148a, followed by exposing and developing the photoresist layer. The capping layer 148a, the metal layers 144a and 146a, the contact layers 214, and the surrounding layer 216 may be dry-etched by using the mask pattern as an etch mask to form the bit line 145, the direct contact 135, and the capping pattern 148.

The bit line 145 may be formed by patterning the metal layers 144a and 146a and the second polysilicon layer 218. The bit line 145 may include an impurity-doped polysilicon layer 142, a tungsten nitride layer 144, and a tungsten layer 146. As shown in FIG. 22E, the bit line 145 may have a length in the first direction and a length in the second direction, the length in the first direction being less than the length in the second direction. The length (width) of the bit line 145 in the first direction is smaller than the length of the bit line 145 in the second direction. The capping pattern 148 is not shown in FIG. 22E for convenience.

The bit line 145 may be included in a bit line structure 140. The bit line structure 140 may be referred to as a wiring pattern including the bit line 145 and the capping pattern 148. Bit line structures 140 may be arranged parallel to each other in the first direction (X-axis direction of FIG. 18) on the interlayer dielectric 132 and the direct contact 135. The bit line structure 140 may extend in the second direction. The bit line structure 140 may include the bit line 145 and the capping pattern 148 covering a top surface of the bit line 145. The bit line 145 may be electrically connected to the direct contact 135. A thickness of the capping pattern 148 may be greater than a thickness of the bit line 145.

The direct contact 135 may be formed by dry-etching each of the contact layers 214. The direct contact 135 may be electrically connected to the source region 116S of the active region 116. The bit line structure 140 including the bit line 145 and the capping pattern 148, and the direct contact 135 may be formed to uniform widths by adjusting the pressure of the etching chamber 510 of FIG. 1, the temperature of the electrostatic chuck 526 of FIG. 1, or the concentrations of the main etching gas and the auxiliary etching gas with respect to the inert gas injected into the etching chamber 510 of FIG. 1, as described above. For example, when the capping layer 148a, the metal layers 144a and 146a, and the second polysilicon layer 218 are dry-etched, the pressure of the etching chamber 510 of FIG. 1 may be adjusted to about 30 mTorr to about 100 mTorr, and the temperature of the electrostatic chuck 526 of FIG. 1 may be adjusted to about 40° C. to about 90° C.

Since the dry etching of the capping layer 148a, the metal layers 144a and 146a, and the second polysilicon layer 218 has been described in detail above, a repetitive description thereof will be omitted for brevity. The direct contact 135 and the bit line structure 140 may have a vertical sidewall and have a straight line shape in the second direction in a plan view.

Referring to FIGS. 24A to 24D, a multilayer spacer 150 is formed on both sidewalls of the bit line structure 140. An insulating liner 152 may be formed the exposed top surface and sidewall of the bit line structure 140 and an exposed surface of the interlayer dielectric 132, and to partially fill the direct contact hole 130H. The insulating liner 152 may be used as a protective film for protecting the bit line structure 140. The insulating liner 152 may include a silicon nitride film. For example, the insulating liner 152 may have a thickness of about 30 Å to about 80 Å.

Then, a first spacer 154 may be formed to cover the insulating liner 152 on both sidewalls of the bit line structure 140. The first spacer 154 may include silicon oxide (which may be collectively referred to as oxide), a silicon germanium (SiGe) compound, or a polymer. However, materials included in the first spacer 154 are not limited to the materials set forth above. The first spacer 154 may include a material having an etch selectivity with respect to the insulating liner 152. For example, the first spacer 154 may include an insulating material or a conductive material. The first spacer 154 may include silicon oxide.

A second spacer 156 may be formed to have a uniform thickness and to cover the insulating liner 152 and the first spacer 154. The second spacer 156 may include a material that is different from that of the first spacer 154. In one embodiment, the second spacer 156 may include a silicon oxide film, a silicon nitride film, or a silicon oxynitride film.

In an exemplary embodiment of the inventive concept, the second spacer 156 may include a silicon nitride film. The second spacer 156 may have a thickness of about 20 Å to about 100 Å. The insulating liner 152, the first spacer 154, and the second spacer 156 may be included in the multilayer spacer 150, the multilayer spacer 150 covering both sidewalls of the bit line structure 140.

Then, an insulating layer 170 may be formed on the buried insulating layer 126. The insulating layer 170 may be, for example, an insulating film of an oxide material. The insulating layer 170 may be a fence insulating film surrounding both side surfaces of a buried contact BC. Then, a buried contact 180 is formed on one side of the insulating layer 170 and the bit line structure 140.

The buried contact 180 may be impurity-doped polysilicon. The buried contact 180 may include, for example, a metal, a metal silicide, a metal nitride, or combinations thereof. The buried contact 180 may include a barrier film and a conductive film on the barrier film. In an exemplary embodiment of the inventive concept, the barrier film may be formed to have a Ti/TiN stacked structure.

When the buried contact 180 includes a metal material, a metal silicide film may be formed between the buried contact 180 and the active region 116. For example, the metal silicide film may be a cobalt (Co) silicide film. However, the metal silicide film is not limited to a cobalt silicide film. For example, the metal silicide film may include various metal silicides.

Referring to FIGS. 25A to 25D, an upper portion of the buried contact 180 is removed by an etch-back process to form a groove. A metal layer 190 is formed, fills the groove formed by the etch-back, and covers top surfaces of the bit line structure 140 and the multilayer spacer 150.

The metal layer 190 may include a metal silicide film in a contact portion with the buried contact 180. For example, the metal silicide film may be a cobalt silicide film. However, the metal silicide film is not limited to a cobalt silicide film, as described above.

In addition, the metal layer 190 may include a barrier film covering an inner wall of the groove and the top surfaces of the bit line structure 140 and the multilayer spacer 150, an inner metal film filling the groove when being disposed on the barrier film, and an upper metal film covering the bit line structure 140 and the multilayer spacer 150 when being disposed on the barrier film. In an exemplary embodiment of the inventive concept, the barrier film may have a Ti/TiN stacked structure. Further, in an exemplary embodiment of the inventive concept, the inner metal film or the upper metal film may include tungsten.

Referring to FIGS. 26A to 26D, a mask pattern is formed on the metal layer 190, followed by etching the metal layer 190 and a portion of each of the underlying bit line structures 140 by using the mask pattern as an etch mask to form a plurality of landing pads 190a respectively connected to buried contacts 180.

The mask pattern may have island shapes spaced apart from each other, similarly to the landing pads LP shown in FIG. 18. Thus, in the process of forming the landing pads 190a by using the mask pattern as an etch mask, grooves Glp for landing pads are formed, and the landing pads LP may be separated and electrically insulated from each other by the grooves Glp for landing pads. In addition, side surfaces of the bit line structures 140 may be respectively exposed by the grooves Glp for landing pads.

As shown in FIGS. 26A to 26D, in the process of forming the grooves Glp for landing pads, a portion on a right side (e.g., a portion of a first side) of the capping pattern 148 may be removed, and an upper portion of the multilayer spacer 150 disposed on a sidewall of the right side (e.g., the first side) of the capping pattern 148 may be removed. Thus, each of the landing pads 190a may cover a left portion (a portion of a second side opposite to the first side) of the capping pattern 148 and the multilayer spacer 150 on a left sidewall of the capping pattern 148. It may be understood that landing pads arranged in another line adjacent to the cutting line I-I' of FIG. 18 may have a reverse structure to the structure set forth above, for example, the landing pads may cover a right portion of the capping pattern 148 and the multilayer spacer 150 on a right sidewall of the capping pattern 148.

Finally, similarly to the landing pads LP of FIG. 18, the landing pads 190a are arranged in a zigzag structure (see the line L1 of FIG. 18) in which the landing pads 190a alternately cover the multilayer spacer 150 on a left sidewall of the bit line structure 140 and the multilayer spacer 150 on a right sidewall of the bit line structure 140 along the second direction (Y-axis direction). In addition, each landing pad 190a may cover the multilayer spacer 150 on the same-direction sidewall of each bit line structure 140 along the first direction (X-axis direction). After the landing pads 190a are formed, the mask pattern is removed.

After the mask pattern is removed, a capping insulating layer may be formed to fill the grooves Glp for landing pads and to cover top surfaces of the landing pads 190a. The capping insulating layer may include an oxide film or a nitride insulating material.

After the capping insulating layer is formed, a plurality of capacitors are formed, the capacitors penetrating the capping insulating layer and being respectively electrically connected to the landing pads 190a. In this case, the bit line 145 and the landing pad 190a may respectively correspond to the bit line BL and the landing pad LP, which are shown in FIG. 18, and the buried contact 180 and the direct contact 135 may respectively correspond to the buried contact BC and the direct contact DC, which are shown in FIG. 18.

Figure 27:
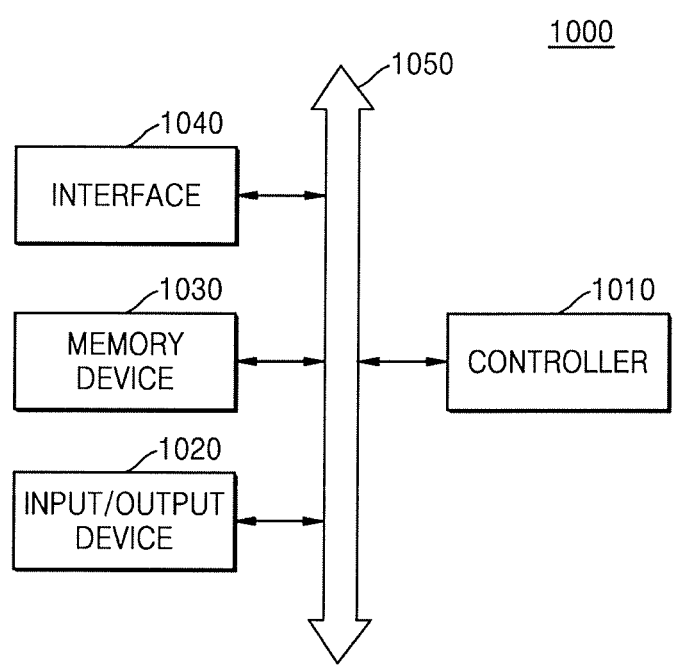
FIG. 27 is a block diagram of a system including a semiconductor device fabricated according to an exemplary embodiment of the inventive concept.

FIG. 27 is a block diagram of a system including a semiconductor device fabricated according to an exemplary embodiment of the inventive concept.

A system 1000, according to an exemplary embodiment of the inventive concept, may include a controller 1010, an input/output device 1020, a memory device 1030, and an interface 1040. The system 1000 may be a mobile system or a system transmitting or receiving information. In an exemplary embodiment of the inventive concept, the mobile system is a personal digital assistant, (PDA), a portable computer, a tablet computer, a wireless phone, a mobile phone, a digital music player, or a memory card.

The controller 1010 may control programs executed in the system 1000 and may include a microprocessor, a digital signal processor, a microcontroller, or a device similar thereto. The input/output device 1020 may be used for inputting or outputting data of the system 1000. The system 1000 may be connected to a device external to the system 1000, for example, to a personal computer or a network, by using the input/output device 1020, and may exchange data with the external device. The input/output device 1020 may be, for example, a keypad, a keyboard, or a display device.

The memory device 1030 may store codes and/or data for operations of the controller 1010 or may store data which has been processed by the controller 1010. The memory device 1030 may include the semiconductor device manufactured according to an exemplary embodiment of the inventive concept. For example, the memory device 1030 may include a semiconductor devices fabricated using the methods of manufacturing semiconductor devices described above.

The interface 1040 may be a data transmitting path between the system 1000 and other devices external to the system 1000. The controller 1010, the input/output device 1020, the memory device 1030, and the interface 1040 may communicate with each other through a bus 1050.

The system 1000 according to the present embodiment may be used for, for example, mobile phones, digital media players, navigation systems, portable multimedia players (PMPs), solid state disks (SSDs), or household appliances.

Figure 28:
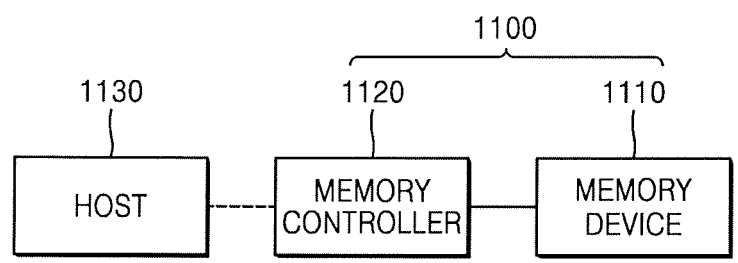
FIG. 28 is a block diagram of a memory card including a semiconductor device fabricated according to an exemplary embodiment of the inventive concept.

FIG. 28 is a block diagram of a memory card including a semiconductor device fabricated according to an exemplary embodiment of the inventive concept.

A memory card 1100, according to an exemplary embodiment of the inventive concept, may include a memory device 1110 and a memory controller 1120. The memory device 1110 may store data. In an exemplary embodiment of the inventive concept, the memory device 1110 may be a non-volatile memory to maintain data stored therein when the power supply of the memory device 1110 is interrupted. The memory device 1110 may include at least one semiconductor device fabricated using the methods described above.

The memory controller 1120 may read data stored in the memory device 1110 or may write data to the memory device 1110, in response to read/write requests of the host 1130. The memory controller 1120 may include at least one semiconductor device fabricated using the methods described above.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A method of fabricating a semiconductor device, comprising:
    forming a material layer and a mask pattern on a substrate;
    loading the substrate, including the material layer and the mask pattern, mounted onto an electrostatic chuck, into an etching chamber; and
    forming a material pattern by dry etching the material layer using the mask pattern as an etching mask,
    wherein the dry etching of the material layer comprises:
    adjusting a pressure of the etching chamber to adjust a lateral over-etch of the material pattern in a first direction, Wherein the first direction is parallel to a surface of the substrate facing the material pattern; and
    adjusting a temperature of the electrostatic chuck to adjust an etching of the material pattern in a second direction, wherein the second direction crosses the first direction,
    wherein an etching gas used for the dry etching of the material layer comprises a main etching gas, an auxiliary etching gas, and an inert gas, and
    the dry-etching of the material layer comprises adjusting a concentration of each of the main etching gas and the auxiliary etching gas with respect to the inert gas, wherein each of the main etching gas, the auxiliary etching gas and the inert gas, having the adjusted concentration, flows in the etching chamber
    wherein the material layer comprises a polysilicon layer; and
    wherein an etching gas used for the dry etching of the material layer comprising the polysilicon layer comprises:
    a main etching gas reacting with the polysilicon layer;
    an auxiliary etching gas for protecting a side surface of a polysilicon pattern formed by etching the polysilicon layer; and
    an inert gas for adjusting concentrations of the main etching gas and the auxiliary etching gas.

2. The method of claim 1, further comprising:
    forming a contact hole in the substrate; and filling the contact hole with the material layer,
    wherein, when the material layer is dry etched, the material pattern contacts a bottom of the contact hole and the material pattern is spaced apart from a sidewall of the contact hole.

3. The method of claim 1, further comprising:
    forming an isolation trench in the substrate;

forming an active pattern on the substrate by forming an isolation insulating layer in the isolation trench and on the substrate; and filling the isolation trench with the material layer, wherein, when the material layer is dry etched, the material pattern contacts a bottom of the isolation trench and the material pattern is spaced apart from a sidewall of the isolation trench.

4. The method of claim 1, further comprising: forming a plurality of patterns in the material layer, wherein the plurality of patterns are spaced apart from each other;

forming a pattern hole between two neighboring patterns of the plurality of patterns; and filling the pattern hole with the material layer, wherein, when the material layer is dry etched, the material pattern contacts a bottom of the pattern hole and the material pattern is spaced apart from a sidewall of the pattern hole.

5. The method of claim 1, wherein, when dry etching the material layer, the pressure of the etching chamber is adjusted to be in a range of about 30 mTorr to about 100 mTorr, and the temperature of the electrostatic chuck is adjusted to be in a range of about 40° C. to about 90° C.

6. The method of claim 1, wherein the main etching gas comprises hydrogen bromide (HBr), chlorine (Cl$_2$), or a combination thereof;

wherein the auxiliary etching gas comprises nitrogen (N$_2$), oxygen (O$_2$), or a combination thereof;

the inert gas comprises helium (He) or argon (Ar); and wherein a ratio of the main etching gas to the inert gas is adjusted to be in a range of about 0.5 to about 1.1.

7. The method of claim 1, wherein the material layer is a conductive layer used as a gate electrode or a bit line.

8. A method of fabricating a semiconductor device, comprising:

forming a mask pattern and material layer on a substrate, wherein the material layer is disposed between the mask pattern and the substrate;

loading the substrate onto an electrostatic Chuck in an etching chamber; and forming a first material pattern and a second material pattern by dry etching the material layer using the mask pattern as an etching mask, wherein the dry etching of the material layer comprises:

determining a critical dimension to be formed in upper and lower portions of the first material pattern;

inserting at least two different types of gasses in the etching chamber and adjusting a temperature of the electrostatic chuck to a first temperature; and adjusting a pressure of the etching chamber to a first pressure, the etching chamber including the at least two different types of gasses, wherein the first pressure and the first temperature are adjusted such that the first material pattern is formed to have a substantially constant width having the critical dimension along a first direction at the upper and lower portions of the first material pattern, the first direction being substantially parallel to a surface of the substrate facing the first material pattern, and wherein the first material pattern is separated from the second material pattern along the first direction, wherein the material layer comprises a polysilicon layer; and wherein an etching gas used for the dry etching of the material layer comprising the polysilicon layer comprises:

a main etching gas reacting with the polysilicon layer;

an auxiliary etching gas for protecting a side surface of a polysilicon pattern formed by etching the polysilicon layer; and an inert gas for adjusting concentrations of the main etching gas and the auxiliary etching gas.

9. The method of claim 8, wherein one of the least two different types of gasses includes hydrogen bromide (HBr) or chlorine (Cl$_2$), and a vacuum pump is used in setting the pressure of the etching chamber to the first pressure, the vacuum pump being connected to the etching chamber.

10. The method of claim 8, wherein, at the first temperature and at the first pressure, a reaction preventive layer is formed on sides of the first material pattern to protect the first material pattern from being etched in a second direction beyond a predetermined dimension.

11. The method of claim 8, wherein the predetermined dimension is about 10 nanometers.

* * * * *